US010786885B2

(12) United States Patent
Tolles et al.

(10) Patent No.: US 10,786,885 B2
(45) Date of Patent: Sep. 29, 2020

(54) THIN PLASTIC POLISHING ARTICLE FOR CMP APPLICATIONS

(71) Applicant: Applied Materials, Inc., Santa Clara, CA (US)

(72) Inventors: Robert D. Tolles, San Jose, CA (US); Gregory E. Menk, Pleasanton, CA (US); Eric Davey, Mountain View, CA (US); You Wang, Cupertino, CA (US); Huyen Karen Tran, San Jose, CA (US); Fred C. Redeker, Fremont, CA (US); Veera Raghava Reddy Kakireddy, Santa Clara, CA (US); Ekaterina Mikhaylichenko, San Jose, CA (US); Jay Gurusamy, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 246 days.

(21) Appl. No.: 15/875,867

(22) Filed: Jan. 19, 2018

(65) Prior Publication Data
US 2018/0207770 A1 Jul. 26, 2018

Related U.S. Application Data

(60) Provisional application No. 62/448,747, filed on Jan. 20, 2017, provisional application No. 62/555,605, filed on Sep. 7, 2017.

(51) Int. Cl.
*B24D 11/00* (2006.01)
*H01L 21/306* (2006.01)
(Continued)

(52) U.S. Cl.
CPC .......... *B24D 11/008* (2013.01); *B24B 37/205* (2013.01); *B24B 37/26* (2013.01);
(Continued)

(58) Field of Classification Search
CPC ...... B24D 11/008; B24D 3/22; B24D 11/005; B24B 37/205; B24B 37/26; C09K 3/1409; C09K 3/1463; H01L 21/30625
See application file for complete search history.

(56) References Cited

U.S. PATENT DOCUMENTS 5,081,051 A 1/1992 Mattingly et al.
5,489,233 A 2/1996 Cook et al.
(Continued)

FOREIGN PATENT DOCUMENTS

JP 2012-166326 A 9/2012
JP 2013-240844 A 12/2013
(Continued)

OTHER PUBLICATIONS

International Search Report and Written Opinion for International Application No. PCT/US2018/014344 dated Jun. 22, 2018.
(Continued)

Primary Examiner — Dung Van Nguyen
(74) Attorney, Agent, or Firm — Patterson + Sheridan LLP

(57) ABSTRACT

A method and apparatus for polishing a substrate that includes a polishing article comprising a polymeric sheet having a raised surface texture, which is formed on the surface of the polymeric sheet is provided. According to one or more implementations of the present disclosure, an advanced polishing article has been developed, which does not require abrasive pad conditioning. In some implementations of the present disclosure, the advanced polishing article comprises a polymeric sheet having a polishing surface with a raised surface texture or "micro-features" and/or a plurality of grooves or "macro-features" formed in the polishing surface. In some implementations, the raised surface texture is embossed, etched, machined or otherwise formed in the polishing surface prior to installing and using
(Continued)

the advanced polishing article in a polishing system. In one implementation, the raised features have a height within one order of magnitude of the features removed from the substrate during polishing.

20 Claims, 19 Drawing Sheets

(51) Int. Cl.
| | | |
|---|---|---|
| *C09K 3/14* | (2006.01) | |
| *B24D 3/22* | (2006.01) | |
| *B24B 37/26* | (2012.01) | |
| *B24B 37/20* | (2012.01) | |

(52) U.S. Cl.
CPC .............. *B24D 3/22* (2013.01); *B24D 11/005* (2013.01); *C09K 3/1409* (2013.01); *C09K 3/1463* (2013.01); *H01L 21/30625* (2013.01)

(56) References Cited

U.S. PATENT DOCUMENTS

| | | | |
|---|---|---|---|
| 5,569,062 A | 10/1996 | Karlsrud | |
| 5,938,884 A | 8/1999 | Hoshizaki et al. | |
| 5,990,010 A | 11/1999 | Berman | |
| 6,022,268 A | 2/2000 | Roberts et al. | |
| 6,110,025 A | 8/2000 | Williams et al. | |
| 6,113,479 A | 9/2000 | Sinclair et al. | |
| 6,116,990 A | 9/2000 | Sinclair et al. | |
| 6,135,859 A | 10/2000 | Tietz | |
| 6,179,709 B1 | 1/2001 | Redeker et al. | |
| 6,196,896 B1 | 3/2001 | Sommer | |
| 6,206,759 B1* | 3/2001 | Agarwal | B24B 37/22 |
| | | | 451/307 |
| 6,238,273 B1* | 5/2001 | Southwick | B24B 37/042 |
| | | | 451/296 |
| 6,241,583 B1 | 6/2001 | White | |
| 6,241,585 B1 | 6/2001 | White | |
| 6,244,935 B1 | 6/2001 | Birang et al. | |
| 6,261,959 B1 | 7/2001 | Travis et al. | |
| 6,276,998 B1 | 8/2001 | Sommer et al. | |
| 6,302,767 B1 | 10/2001 | Tietz | |
| 6,306,019 B1 | 10/2001 | Finkelman | |
| 6,312,319 B1 | 11/2001 | Donohue et al. | |
| 6,328,632 B1* | 12/2001 | Chopra | B24B 21/04 |
| | | | 451/296 |
| 6,354,930 B1 | 3/2002 | Moore | |
| 6,413,873 B1 | 7/2002 | Li et al. | |
| 6,419,559 B1 | 7/2002 | Gurusamy et al. | |
| 6,428,394 B1 | 8/2002 | Mooring et al. | |
| 6,447,374 B1 | 9/2002 | Sommer et al. | |
| 6,475,070 B1 | 11/2002 | White | |
| 6,491,570 B1 | 12/2002 | Sommer et al. | |
| 6,494,769 B1 | 12/2002 | Sinclair et al. | |
| 6,500,056 B1 | 12/2002 | Krusell et al. | |
| 6,514,863 B1 | 2/2003 | He | |
| 6,520,833 B1 | 2/2003 | Saldana et al. | |
| 6,561,871 B1 | 5/2003 | Sommer | |
| 6,592,439 B1 | 7/2003 | Li et al. | |
| 6,607,425 B1 | 8/2003 | Kistler et al. | |
| 6,616,801 B1 | 9/2003 | Boyd | |
| 6,626,744 B1 | 9/2003 | White et al. | |
| 6,641,471 B1 | 11/2003 | Pinheiro et al. | |
| 6,663,470 B2 | 12/2003 | Doan et al. | |
| 6,716,299 B1* | 4/2004 | Gotkis | B24B 21/04 |
| | | | 156/345.12 |
| 6,736,709 B1 | 5/2004 | James et al. | |
| 6,800,020 B1 | 10/2004 | Boyd et al. | |
| 6,837,964 B2 | 1/2005 | Franklin et al. | |
| 6,991,517 B2 | 1/2006 | Redeker et al. | |
| 7,014,538 B2 | 3/2006 | Tietz et al. | |
| 7,037,174 B2 | 5/2006 | Chen et al. | |
| 7,097,544 B1 | 8/2006 | Tolles et al. | |
| 7,192,336 B2* | 3/2007 | Kramer | B24B 37/22 |
| | | | 257/E21.23 |
| 7,611,400 B2 | 11/2009 | Yilmaz et al. | |
| 7,614,939 B2 | 11/2009 | Tolles et al. | |
| 9,776,361 B2* | 10/2017 | Krishnan | B24B 37/26 |
| 2002/0081945 A1 | 6/2002 | Kistler et al. | |
| 2003/0013384 A1 | 1/2003 | Donohue et al. | |
| 2003/0040182 A1 | 2/2003 | Hsu et al. | |
| 2003/0060143 A1 | 3/2003 | Birang et al. | |
| 2003/0139124 A1 | 7/2003 | Xu | |
| 2003/0224678 A1 | 12/2003 | Hsu et al. | |
| 2006/0172664 A1 | 8/2006 | Chen et al. | |
| 2006/0194525 A1 | 8/2006 | Tolles et al. | |
| 2007/0021043 A1 | 1/2007 | Birang et al. | |
| 2007/0197132 A1 | 8/2007 | Menk et al. | |
| 2007/0197133 A1 | 8/2007 | Menk et al. | |
| 2007/0197134 A1 | 8/2007 | Menk et al. | |
| 2007/0197141 A1 | 8/2007 | Zuniga et al. | |
| 2007/0197145 A1 | 8/2007 | Menk et al. | |
| 2007/0197147 A1 | 8/2007 | Rondum et al. | |
| 2008/0076330 A1 | 3/2008 | Birang et al. | |
| 2009/0253358 A1 | 10/2009 | Menk et al. | |
| 2010/0112919 A1 | 5/2010 | Bonner et al. | |
| 2013/0017764 A1 | 1/2013 | Allison et al. | |

FOREIGN PATENT DOCUMENTS

| | | |
|---|---|---|
| WO | 9845087 A1 | 10/1998 |
| WO | 9933615 A1 | 7/1999 |

OTHER PUBLICATIONS

Standard Test Method for Static & Kinetic Coefficients of Friction of Plastic Film & Sheeting, Instron Test Method Brief ASTM D 1894-11e1. Nov. 4, 2008. 5 pages.
Static and Kinetic Coefficients of Friction of Plastic Film and Sheeting. Designation: D1894 14. Nov. 14, 2017. 7 pages.
How to Evaluate and Test Pressure Sensitive Adhesive Tape Performance. MBK Tape Solutions. 2008.
Rogers Corporation. BISCO Silicones. BISCO Silicones Adhesive Application. 2006.
BISCO Silicones. Rogers BISCO Silicones—Performance to the Extreme. 2003. Silicone Material Selection Guide.
Peel Adhesion of Pressure Sensitive Tape. Harmonized International Standard. 10 pages.
BISCO® HT-6240 Liquid Silicone Rubber Sheeting (40 Durometer). 2003. Publication #180-076.

* cited by examiner

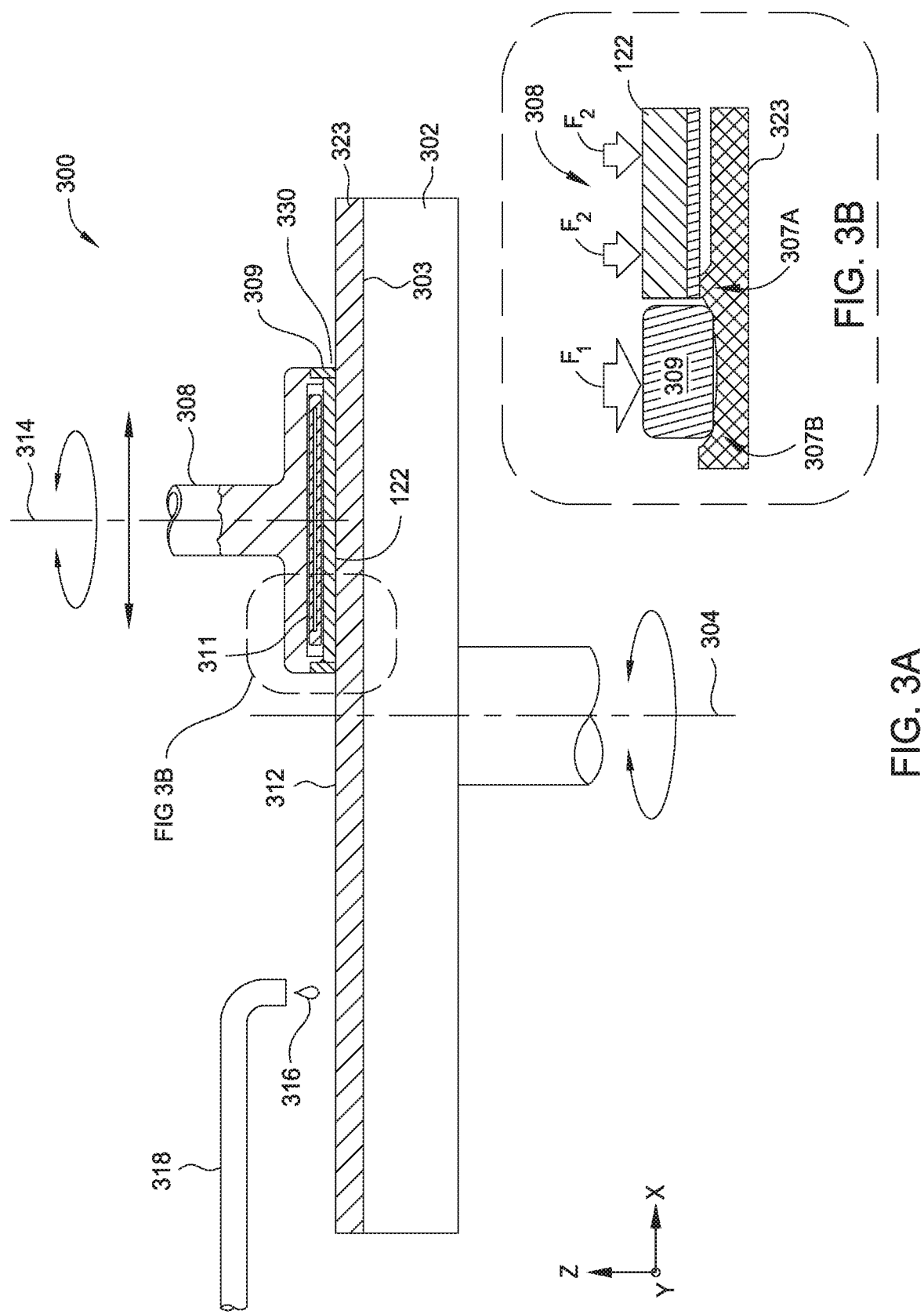

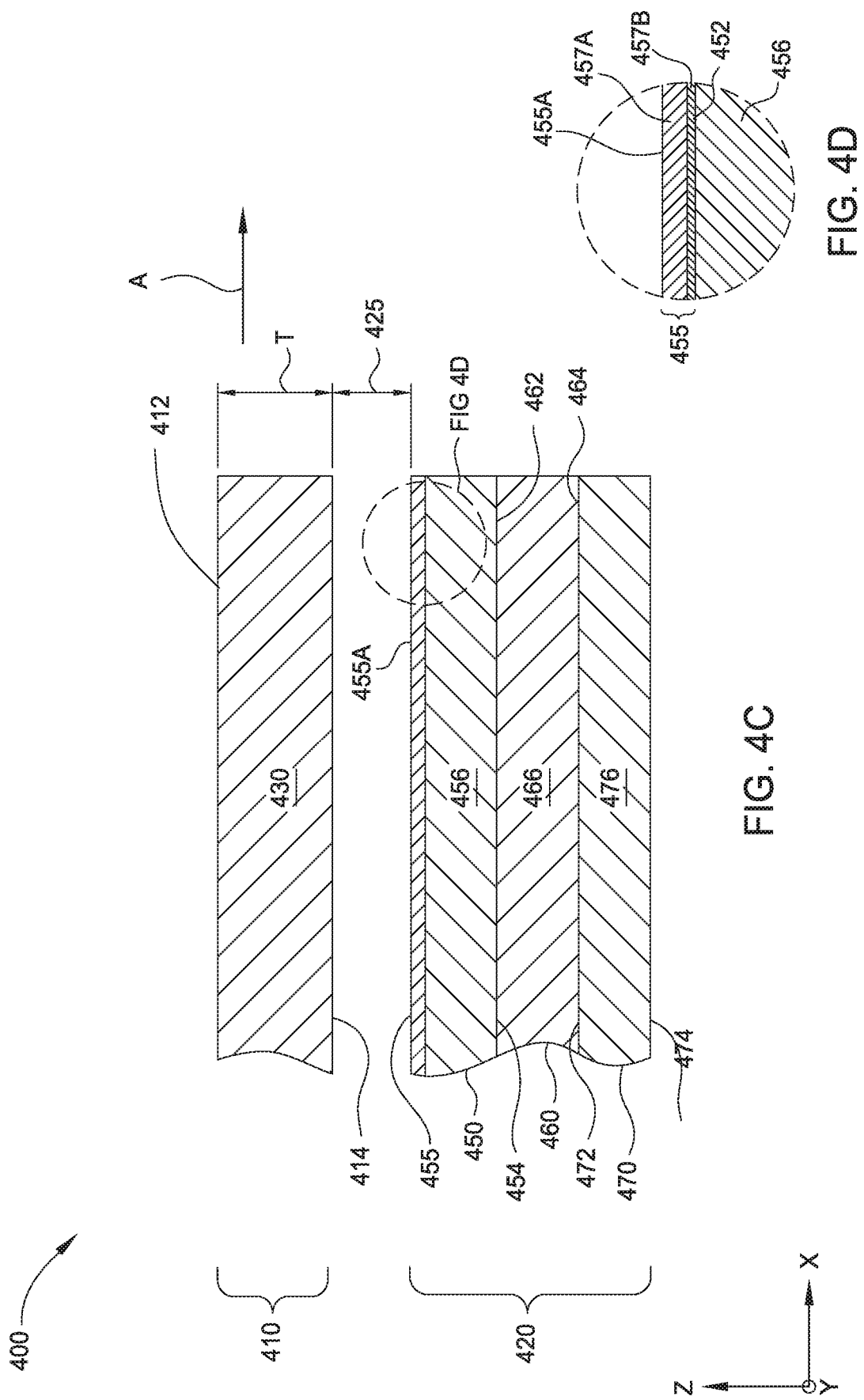

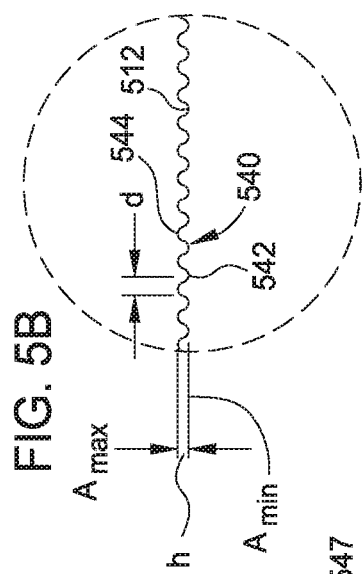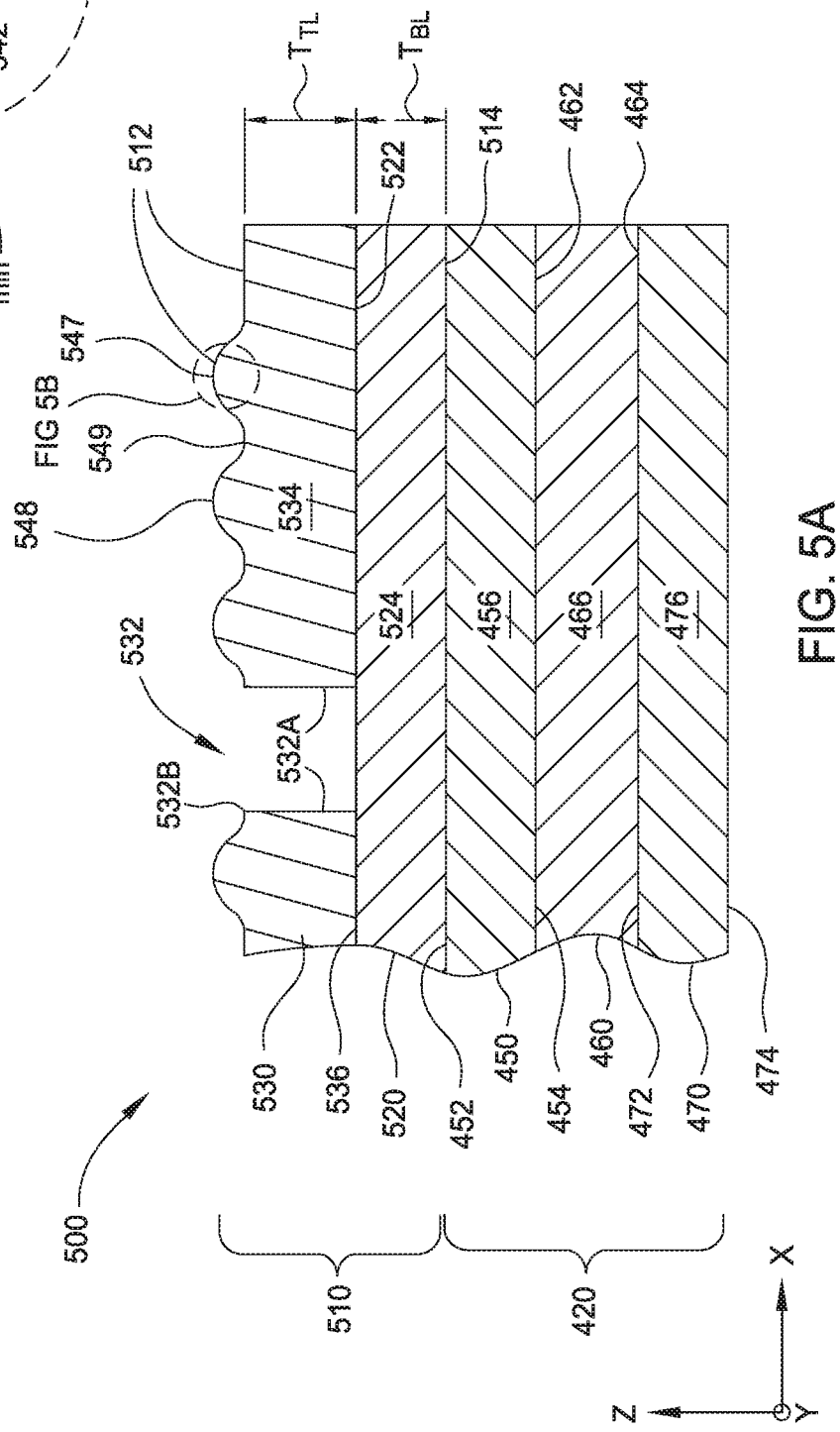

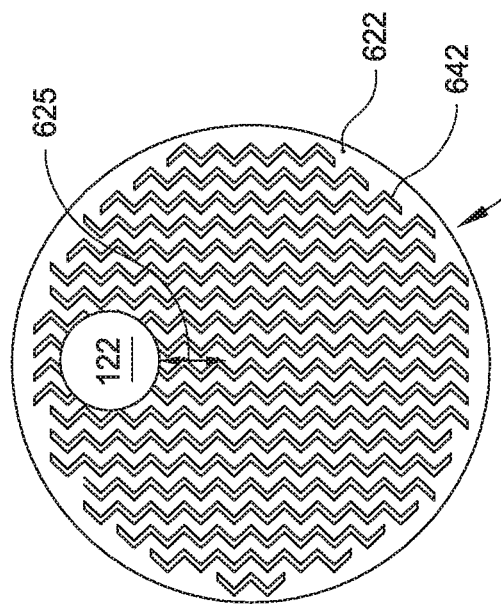
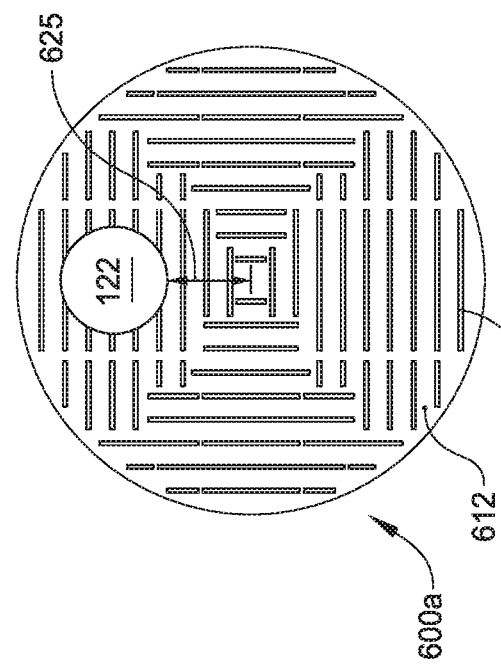
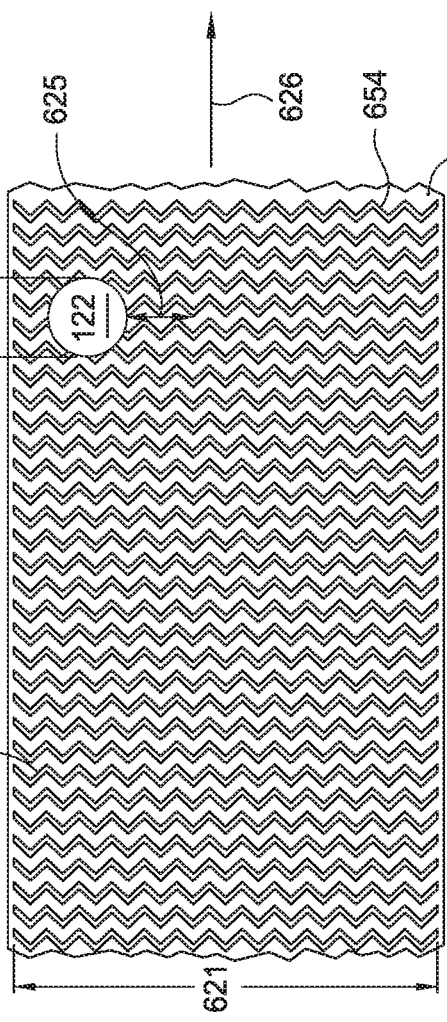
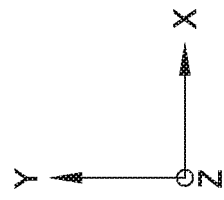

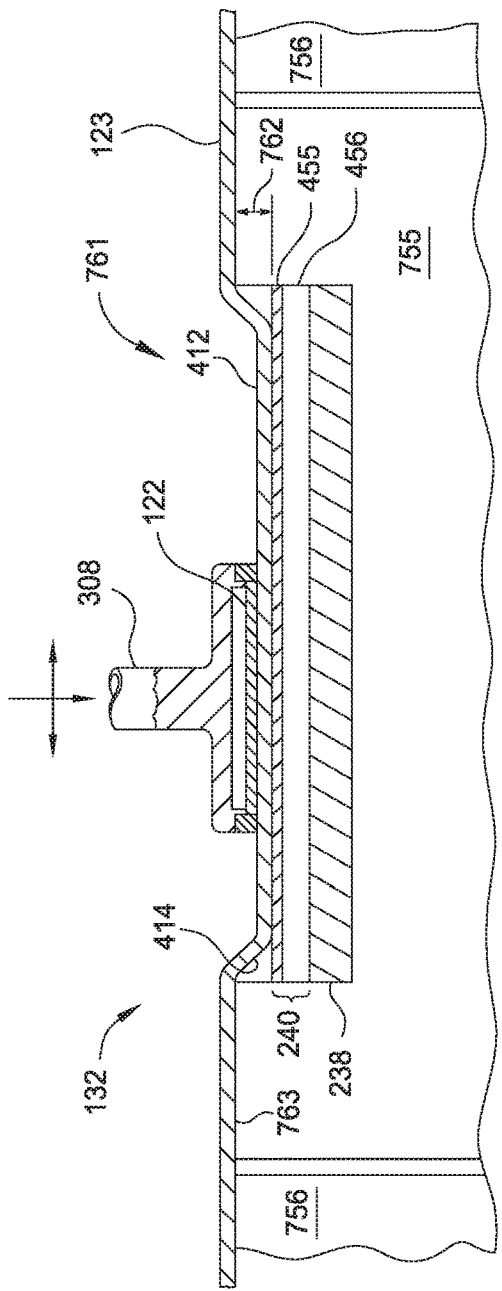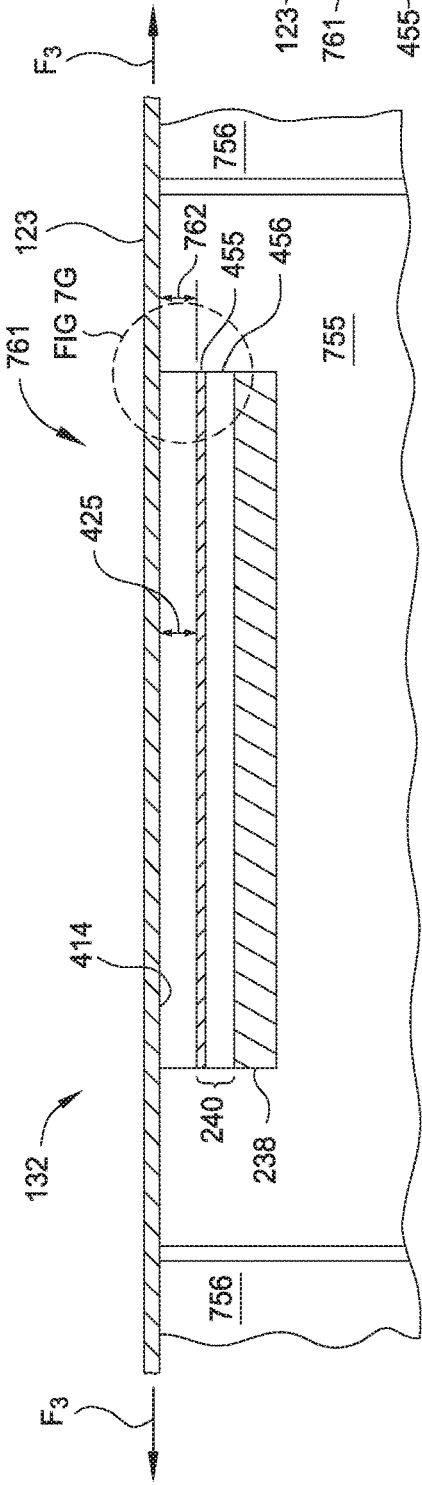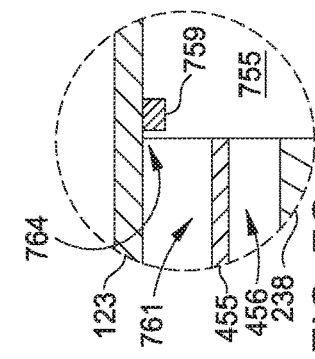

THIN PLASTIC POLISHING ARTICLE FOR CMP APPLICATIONS

CROSS-REFERENCE TO RELATED APPLICATIONS

This application claims benefit of U.S. provisional patent application Ser. No. 62/555,605, filed Sep. 7, 2017, and U.S. provisional patent application Ser. No. 62/448,747, filed Jan. 20, 2017, which are both herein incorporated by reference.

BACKGROUND

Field

Implementations described herein generally relate to apparatus and methods for polishing of substrates or wafers, more particularly, to a polishing article and a method of manufacturing and using a polishing article.

Description of the Related Art

Chemical mechanical polishing (CMP) is a conventional process used in many different industries to planarize surfaces of substrates. In the semiconductor industry, uniformity of polishing and planarization has become increasingly important as device feature sizes continue to decrease. During a CMP process, a substrate, such as a silicon wafer, is mounted on a carrier head with the device surface placed against a moving polishing pad. The carrier head provides a controllable load on the substrate to push the device surface of the substrate against the polishing pad. A polishing liquid, such as a slurry containing fine abrasive particles in a chemical agent designed to react with the substrate to be polished, is supplied to the surface of the moving polishing pad and carrier head. The polishing slurry is typically supplied to the polishing pad to provide an abrasive chemical solution at the interface between the polishing pad and the substrate. The polishing slurry typically forms a thin boundary layer between the substrate and the polishing pad. Despite the presence of the thin boundary layer formed by the polishing slurry, the polishing pad and substrate make intimate sliding contact. The polishing pad and carrier head apply mechanical energy to the substrate, while the pad also helps to control the transport of slurry, which interacts with the substrate during the polishing process. An effective CMP process not only provides a high polishing rate, but also provides a substrate surface which lacks small-scale roughness, contains minimal defects and is flat, i.e., lacks large scale topography.

CMP processes performed in a polishing system will typically include multiple polishing pads that perform different parts of the full polishing process. The polishing system typically includes a first polishing pad that is disposed on a first platen, which produces a first material removal rate and a first surface finish and a first flatness on the surface of the substrate. The first polishing process is typically known as a rough polish step, and is generally performed at a high polishing rate. The system will also typically include at least one additional polishing pad that is disposed on at least an additional platen, which produces a second material removal rate and a second surface finish and flatness on the surface of the substrate. The second polishing step is typically known as a fine polish step, which is generally performed at a slower rate than the rough polishing step. In some configurations, the system may also include a third polishing pad that is disposed on a third platen, which produces a third removal rate and a third surface finish and flatness on the surface of the substrate. The third polishing step is typically known as a material clearing or buffing step. In some configurations, the buffing step is performed on a separate tool. The multiple-pad polishing process can be used in a multi-step process in which the pads have different polishing characteristics and the substrates are subjected to progressively finer polishing or the polishing characteristics are adjusted to compensate for different layers that are encountered during polishing, for example, metal lines underlying an oxide surface.

CMP polishing pads have historically been made of polyurethane with various fillers and porosity to provide the desired surface and mechanical structure required for polishing semiconductor wafers. These polishing pads typically comprise a hard top pad that is positioned over and permanently joined to a softer underlying pad to form a "stacked pad." The polishing pad typically has surface grooving, which plays a role in slurry transport as well as collecting pad debris during pad conditioning. The function of the stacked polishing pad in a CMP process is at least twofold. First, the polishing pad imparts and distributes the mechanical load applied to the substrate during polishing. Second, the polishing pad transports and distributes chemistry and slurry particles at the substrate and polishing pad interface.

A recurring problem in CMP is non-uniformity of the polishing rate across the surface of the substrate. Additionally, conventional polishing pads generally deteriorate naturally during polishing due to wear and/or accumulation of polishing by-products on the pad surface. During repeated or continuous polishing a conventional polishing pad becomes worn or "glazed" after polishing a certain number of substrates, and then needs to be replaced or reconditioned. Glazing occurs when the conventional polishing pad is heated and compressed in regions where the substrate is pressed against the pad. Due to the generated heat and applied forces, the high-points on the conventional polishing pad are compressed and are spread-out such that the points between the high-points are filled up, thus making the conventional polishing pad surface become smoother and less abrasive. In addition to becoming smoother and less abrasive, as the conventional polishing pad becomes glazed the conventional polishing pad may also increase in hydrophobicity, which decreases the ability of slurry to stick to the polishing pad. As a result, the polishing time increases. Therefore, the polishing surface of the conventional polishing pad is periodically returned to an abrasive condition, or "conditioned", to return the conventional polishing pad to its hydrophilic state and maintain a high polishing rate. Conventionally, an abrasive conditioning disk is used to essentially "scratch" or "abrade" the top layer of the polishing surface of the conventional polishing pad into a state so that desirable polishing results can once again be achieved on the substrate.

Abrasive pad conditioning is a multi-variable complex process. The application of conditioning, typically through diamond disks, removes material from the polishing surface of the conventional polishing pad thereby exposing new pad material over time. Abrasive pad conditioning generates surface asperities that play a strong role in polishing performance. The act of abrasive pad conditioning changes the polishing properties of the conventional polishing pad dramatically, and thus the polishing process results for substrates run just prior to pad conditioning have different polishing results versus the substrates run after pad conditioning. In addition, polishing results for substrates run on a new pad versus substrates run on the same pad that has been exposed to abrasive conditioning will differ due to the difference in pad thickness and damage created to the surface of the conventional pad by the pad conditioning process. Thus, abrasive pad conditioning contributes to non-uniformity of polishing rates between substrates and the generation of particles that can scratch the surface of the substrate during polishing.

Therefore, there is a need for an improved CMP polishing pad and methods of using the improved CMP polishing pad that address some of the aforementioned concerns.

SUMMARY

Implementations described herein generally relate to apparatus and methods for polishing of substrates and/or wafers. More particularly, implementations described herein generally relate to a polishing article and a method of manufacturing and using a polishing article. In one implementation, a polishing article that is used to polish a surface of a substrate is provided. The polishing article generally comprises a polymeric sheet having a polishing surface and an opposing bottom surface. In one implementation, the polishing article is formed from a solid material that is pore free and thus has no significant amount of porosity or pore volume at the surface and/or within the thickness of the material. The polishing surface of the polishing article includes a plurality of discrete elements formed on the polishing surface and extending upward from the polishing surface.

In another implementation, a polishing module is provided. The polishing module comprises a platen assembly, a polishing article, and a carrier head for retaining and urging a substrate toward the polishing article. The polishing article comprises a polymeric sheet having a polishing surface and an opposing bottom surface. The polishing surface includes a plurality of discrete elements formed on the polishing surface and extending upward from the polishing surface.

In yet another implementation, a method of removing material from a substrate is provided. The method comprises urging a substrate toward a polymeric sheet disposed on a platen. The polymeric sheet is disposed between a supply roll and a take-up roll. The polymeric sheet has a polishing surface including a plurality of uniform discrete elements formed on and extending upward from the polishing surface. The method further comprises rotating the platen and the supply roll and the take-up roll, relative to the substrate. The method further comprises removing material from a surface of the substrate and advancing the polymeric sheet relative to the platen after removing material from the substrate.

Embodiments of the disclosure may provide a polishing article that includes a polymeric sheet that includes a thickness that is defined between a polishing surface and an opposing bottom surface, a length that extends in a first direction that is substantially parallel to the polishing surface, a width that extends in a second direction, which is substantially parallel to the polishing surface and is perpendicular to the first direction, wherein the width is at least two times smaller than the length, a solid polymeric material that is substantially pore free, a plurality of discrete elements that are formed on the polishing surface, and an array of grooves that are formed in the polishing surface, wherein the array of grooves are aligned relative to the first direction or the second direction. The grooves in the array of grooves may extend from the polishing surface to a depth below the polishing surface, and the thickness may be less than or equal to about 0.48 mm. The opposing bottom surface may also include a surface roughness that has an arithmetical mean height (Sa) from 0.05 micrometers to 5.08 micrometers.

Embodiments of the disclosure may further provide a polishing article that includes a polymeric sheet having a pad body that comprises a solid polymeric material that is substantially pore free, a thickness that is defined between a polishing surface and an opposing bottom surface, and the thickness is less that about 0.46 mm, and a plurality of discrete elements that are formed in the polishing surface, wherein the discrete elements formed in the polishing surface have a feature span of less than 40 µm, and an arithmetical mean height (Sa) from 2 to 7 µm. The opposing bottom surface may include a surface roughness that has an arithmetical mean height (Sa) from 2 micro-inches (0.05 micrometers) to 200 micro-inches (5.08 micrometers). The discrete elements formed in the polishing surface may further comprise an interfacial area ratio of 45% to 65%, an average peak density of 30 to 35 per one millimeter, a maximum peak height (Sp) of 30 to 50 µm, and a maximum pit height (Sv) of 30 to 80 µm.

Embodiments of the disclosure may further provide a supporting element that is configured to support a polishing article disposed over a platen during a polishing process, comprising a platen interface body comprising a polymeric material that has a thickness that is defined between a first surface and an opposing second surface, wherein the opposing second surface of the platen interface body is positioned over and is facing a surface of the platen, and a releasable bonding layer that is disposed on the first surface, wherein the releasable bonding layer has an interface surface that is on a side of the releasable bonding layer that is opposite to the first surface and is configured to support the polishing article during the polishing processing. The interface surface may have a static friction coefficient of greater than 1.51, and wherein the static friction coefficient is measured by urging a surface of the polishing article that has an arithmetical mean height (Sa) of 5.08 micrometers against the interface surface. The interface surface may have an adhesive bond strength that is less than about 25 ounces per lateral inch. The releasable bonding layer may include a material selected from a group consisting of styrene butadiene (SBR), polyacrylics, polyvinyl acetate (PVA) and silicone. The fibrous mat may have a basis weight of between about 2 and about 8 ounces per square yard (OSY) and a thickness of about 0.13 mm to about 1.3 mm.

Embodiments of the disclosure may further provide a method of removing material from a substrate using a polishing article that includes positioning a back surface of a polishing article on a surface of a releasable bonding layer of a platen interface body, wherein the back surface of the polishing article is on a side of the polishing article that is opposite to a polishing surface of the polishing article. Then polishing a surface of a first substrate by urging the first substrate against the polishing surface of the polishing article. Separating the back surface of the polishing article from the surface of the releasable bonding layer, and then repositioning the polishing article relative to the surface of the releasable bonding layer, wherein repositioning the polishing article comprises translating the polishing article a first distance in a first direction. Then positioning the back surface of the polishing article on the surface of the releasable bonding layer after repositioning the polishing article, and then polishing a surface of a second substrate by urging the second substrate against the polishing surface of the repositioned polishing article. The first distance is between about 0.1 mm and about 20 mm. The surface of the releasable bonding layer may have a static friction coefficient of greater than 1.51, and wherein the static friction coefficient is measured by urging a surface of an object that has an arithmetical mean height (Sa) of 5.08 micrometers against the interface surface. The surface of the releasable bonding layer may have an adhesive bond strength that is less than about 25 ounces per lateral inch.

Embodiments of the disclosure may further provide a method of removing material from a substrate using a polishing article, comprising positioning a polishing article comprising a polymeric sheet over a platen, wherein the polymeric sheet is positioned between a supply roll and a take-up roll and comprises a solid polymeric material that is substantially pore free, a thickness that is defined between a polishing surface and an opposing bottom surface, and the thickness is less that about 0.025 inches; and a plurality of discrete elements that are formed in the polishing surface, wherein the discrete elements formed in the polishing surface have a feature span of less than 40 μm, and an arithmetical mean height (Sa) from 2 to 7 μm. Then rotating the polishing article, platen, supply roll and take-up roll after the polishing article is positioned over a platen about a central axis.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 3A is a schematic sectional view of another exemplary processing station which may be use with the module of FIG. 1, according to one or more implementations disclosed herein;

FIG. 3B is a schematic sectional view of a portion of a polishing head and polishing article configuration that are positioned in the polishing station illustrated in FIG. 3A, according to one or more implementations described herein;

FIG. 4C is an enlarged schematic side view of the advanced polishing article that has been separated from the platen interface material(s) to allow the advanced polishing article to be advanced, according to one or more implementations described herein;

FIG. 4D is an enlarged schematic side view of a region of the advanced polishing article illustrated in FIG. 4C, according to one or more implementations described herein;

FIG. 5A is an enlarged schematic side view of another implementation of an advanced polishing article, according to one or more implementations described herein;

FIG. 5B is an enlarged schematic side view of a region of the advanced polishing article illustrated in FIG. 5A, according to one or more implementations described herein;

FIGS. 6A and 6B are schematic top views of polishing article designs having textured surfaces with grooves formed therein according to one or more implementations described herein;

FIG. 6C is schematic top view of a polishing article design having textured surfaces that has grooves formed therein which are aligned relative to a desired direction according to one or more implementations described herein;

FIG. 7E is a schematic side cross-sectional view of the processing station illustrated in FIG. 7D in a first configurational position, according to one or more implementations disclosed herein;

FIG. 7F is a schematic side cross-sectional view of the processing station illustrated in FIG. 7D in a second configurational position, according to one or more implementations disclosed herein;

FIG. 7G is a close-up side cross-sectional view of a portion of the processing station illustrated in FIG. 7F, according to one or more implementations disclosed herein;

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Figure 1:
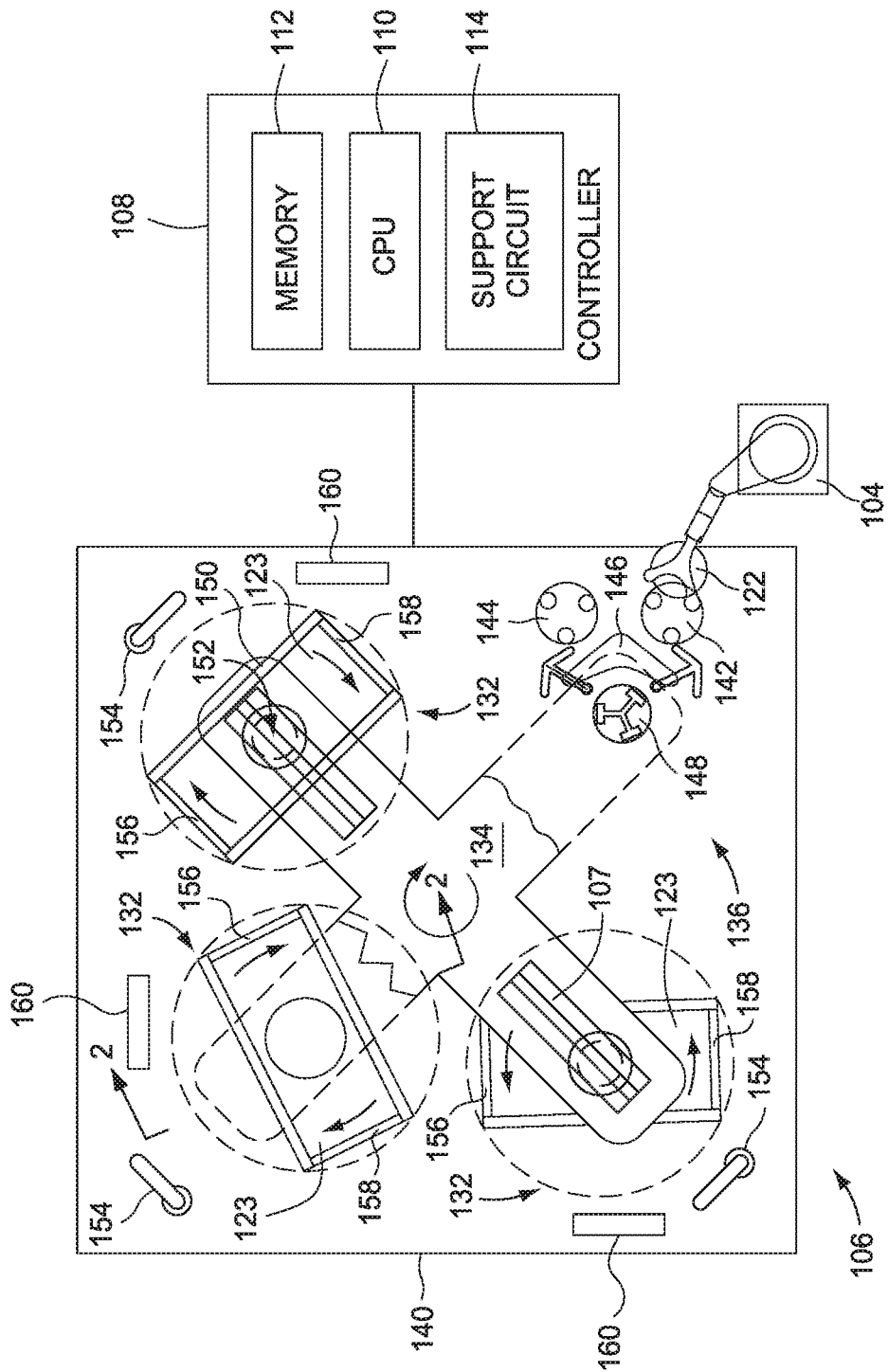
FIG. 1 is a plan view of an exemplary chemical mechanical polishing module having an advanced polishing article, according to one or more implementations disclosed herein.

Implementations described herein generally relate to apparatus and methods for polishing of substrates or wafers. More particularly, implementations described herein generally relate to a polishing article and a method of manufacturing and using a polishing article. Implementations of the disclosure may generally include advanced polishing articles for chemical mechanical polishing (CMP) that include a polymeric sheet, wherein the advanced polishing article includes a textured polishing surface. In some implementations, the advanced polishing article is formed from a thin solid material that is pore free and thus has no significant amount of porosity or pore volume at the surface and/or within the thickness of the material. Implementations of the disclosure may also provide methods and systems for using these advanced polishing articles.

Certain details are set forth in the following description and in FIGS. 1-9 to provide a thorough understanding of various implementations of the disclosure. Other details describing well-known structures and systems often associated with polishing processes and polishing article manufacturing are not set forth in the following disclosure to avoid unnecessarily obscuring the description of the various implementations. Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

It should be understood that although the polishing articles described herein are often referred to as polishing pads, the implementations describe herein are also applicable to other polishing articles including, for example, buffing pads. Further, although the polishing articles described herein are discussed in relation to a chemical mechanical polishing process, the polishing articles and methods of using the polishing articles described herein are also applicable to other polishing processes including polishing lenses and other processes including both abrasive and non-abrasive slurry systems. In addition, the polishing articles described herein may be used in at least the following industries: aerospace, ceramics, hard disk drive (HDD), MEMS and Nano-Tech, metalworking, optics and electro-optics, and semiconductor, among others.

According to one or more implementations of the present disclosure, an advanced polishing article has been developed, which does not require abrasive pad conditioning. In some implementations described herein, the advanced polishing article exhibits extended pad lifetime relative to conventional polishing articles due in part to minimal wear resulting from the polishing process and the lack of destructive erosion typically caused by abrasive pad conditioning. In some implementations of the present disclosure, the advanced polishing article comprises a polymeric sheet having a polishing surface with a raised surface texture or "micro-features" and/or a plurality of grooves or "macro-features" formed in the polishing surface. In some implementations, the raised surface texture is embossed, etched, machined or otherwise formed in the polishing surface prior to installing and using the advanced polishing article in a polishing system. In one implementation, the raised features have a height within one order of magnitude of the features removed from the substrate during polishing. For example, a raised feature of approximately 5 micrometers (μm) in height above the surface of the polishing article can be used to remove or planarize features on a substrate that are approximately 0.5 μm in height. Not to be bound by theory, but it is believed that the optimal size of the formed raised surface texture is related to maximizing the contact area and polishing slurry transfer between the polishing article and the wafer. For example, the smaller the lateral dimension of the raised surface texture the larger the contact area between the polishing article and the wafer that is being polished. The raised surface texture serves to "hold" the slurry to a degree on the surface of the polymeric sheet allowing the slurry to be dragged under the substrate during polishing. Not to be bound by theory but it is believed that a fine topography on the polishing article allows the slurry to cling to these formed raised surface texture features and remain in the valleys between the features after the retaining ring traverses across the polishing article surface.

Further, in some implementations, a raised surface texture pattern, such as an embossed pattern, that is formed on the surface of the polymeric sheet provides a surface texture (See FIGS. 4E and 5B) where substantially all of the tips of the raised features have a relatively uniform lateral spacing (e.g., feature span) and uniform peak height across the polishing article. The uniform nature of the lateral spacing and the relative peak height variation of the formed texture can result in relatively uniform mechanical loading of the tips of these formed features on the surface of the polishing article during polishing. Not to be bound by theory, but it is believed that the uniform loading provided by the uniform surface texture contributes to the slow rate of degradation/mechanical wearing of the non-porous polishing article surface and an improvement in the ability of the polishing article to maintain a consistent polishing rate over time. The formed surface texture or features described herein are unlike the random sized load bearing surface topography formed by conventional pad conditioning techniques that are required in conventional polishing processes.

In some implementations, the surface topography of the advanced polishing article described herein captures and delivers slurry to the interface between the advanced polishing article and substrate based primarily on the pattern of the formed raised surface texture (e.g., embossed texture). In some implementations, the raised surface texture includes a repeating series of features to enhance the slurry transport of the polishing article. In some implementations, the features are formed in a linear pattern across the length and width of the polishing article to create a consistent pattern. This contrasts with conventional polishing articles, which typically do not intentionally provide a raised surface texture and separately use radial patterns of grooves to provide variation in the polishing surface of a polishing article. In some implementations, the features are formed in a random pattern on a microscopic scale (e.g., regions of the polishing article smaller than the substrate size) but repeats on a larger macroscopic scale across the length and/or width of the formed polishing article.

In some implementations, the advanced polishing article includes a plurality of grooves formed in the polishing surface that allow for the transport and retention of slurry by the polishing article. In this configuration, the grooves formed in the polishing surface become local reservoirs for the polishing slurry, since the slurry is retained in the formed grooves. Not to be bound by theory, but it is believed that by controlling the pattern, shape and/or spacing of shallow grooves within the advanced polishing article will allow the boundary layer of polishing slurry to be equalized by allowing "excess slurry" to be routed into the grooves thereby allowing a more uniform boundary layer across the pad/substrate interface. While the advanced polishing article is under the substrate, the shallow groove depth allows the grooves to be substantially full of slurry during polishing. Thus, the shallow grooves of the advanced polishing article function as a reservoir that both distributes the slurry and accepts excess slurry. In some implementations, the shallow grooves of the advanced polishing article are designed to pass under the substrate thereby acting as a "free path" for slurry rather than trapping the slurry in small micro-reservoirs like the deeper grooves of conventional polishing pad. In contrast, the deep grooves in conventional polishing pads, which typically contain an array of deep concentric ring grooves, capture polishing slurry but due to their size and shape do not consistently supply slurry to the pad/wafer interface during polishing. Slurry captured in a deep groove will not interact with the pad or wafer at the interface between the two surfaces in the same way and/or the slurry is not supplied to the pad/wafer interface in the same way that a shallow groove provides slurry to the pad/wafer interface. Also, texture formed on a conventional polishing pad by destructive pad conditioning is not desirable because these texturized regions are formed in a non-uniform manner across the wafer, which leads to non-uniform and/or uncontrolled slurry transport. In addition, the act of pad conditioning would quickly erode the shallow groove away in the thin advanced polishing article described herein. For these reasons, where uniform slurry transport is desired, the combination of a micro-feature surface texture with shallow grooves without destructive pad conditioning as found in the advanced polishing article disclosed herein is desirable.

In addition, if a polishing pad has a pre-texture defined during the manufacturing process, and is then exposed to destructive pad conditioning, the texture created by destructive pad conditioning becomes the de facto texture during the polishing process. Thus, only by eliminating destructive pad conditioning can the pre-texture engineered into the polishing article during manufacturing become the texture that defines the long-term polishing condition during processing.

CMP Hardware Implementation Examples

FIG. 1 depicts a plan view of a polishing module 106 having an advanced polishing article 123 according to one or more implementations disclosed herein. The polishing module 106 may be a portion of a REFLEXION® Chemical Mechanical Polisher, such as the REFLEXION® WEBB™ system, the REFLEXION® LK CMP system, the REFLEXION® LK PRIME™ CMP system, all of which are manufactured by Applied Materials, Inc., located in Santa Clara, Calif. One or more of the implementations described herein may be used on these polishing systems. However, one skilled in the art may advantageously adapt implementations as taught and described herein to be employed on other types of polishing devices produced by other manufacturers that utilize polishing articles, and particularly polishing articles in a roll-to-roll or round polishing article format. The apparatus description described herein is illustrative and should not be construed or interpreted as limiting the scope of the implementations described herein.

The polishing module 106 generally comprises a loading robot 104, a controller 108, a transfer station 136, a plurality of processing or polishing stations, such as platen assemblies 132, a base 140 and a carousel 134 that supports a plurality of polishing or carrier heads 152 (only one is shown in FIG. 1). Generally, the loading robot 104 is disposed proximate the polishing module 106 and a factory interface (not shown) to facilitate the transfer of substrates 122 therebetween.

The transfer station 136 generally includes a transfer robot 146, an input buffer station 142, an output buffer 144 and a load cup assembly 148. The input buffer station 142 receives a substrate 122 from the loading robot 104. The transfer robot 146 moves the substrate 122 from the input buffer station 142 to the load cup assembly 148 where the substrate 122 may be transferred to the carrier head 152.

To facilitate control of the polishing module 106 as described above, the controller 108 comprises a central processing unit (CPU) 110, support circuits 114 and memory 112. The CPU 110, or processor 110, may be one of any form of computer processor that can be used in an industrial setting for controlling various polishers, drives, robots and sub-processors. The non-volatile memory 112 is coupled to the CPU 110. The memory 112, or computer-readable medium, may be one or more of readily available memory such as random access memory (RAM), read only memory (ROM), floppy disk, hard disk, or any other form of digital storage, local or remote. The support circuits 114 are coupled to the CPU 110 for supporting the processor in a conventional manner. These circuits include cache, power supplies, clock circuits, input/output circuitry, subsystems, and the like. The controller 108 may include the central processing unit (CPU) 110 that is coupled to input/output (I/O) devices found in the support circuits 114 and the non-volatile memory 112. The non-volatile memory 112 may include one or more software applications, such as a controlling software program. The memory 112 may also include stored media data that is used by the CPU 110 to perform one or more of the methods described herein. The CPU 110 may be a hardware unit or combination of hardware units capable of executing software applications and processing data. In some configurations, the CPU 110 includes a central processing unit (CPU), a digital signal processor (DSP), an application-specific integrated circuit (ASIC), and/or a combination of such units. The CPU 110 is generally configured to execute the one or more software applications and process the stored media data, which may be each included within the memory 112.

Generally, the carousel 134 has a plurality of arms 150 that each support one of the carrier heads 152. The carrier heads 152 are movable along the arm 150 via a track 107. Two of the arms 150 depicted in FIG. 1 are shown in phantom such that the transfer station and the advanced polishing article 123 disposed on or over one of the platen assemblies 132 may be seen. The carousel 134 is indexable such that the carrier heads 152 may be moved between the platen assemblies 132 and the transfer station 136. In another implementation, the carousel 134 is replaced by a circular track and the carrier heads 152 and movable along the circular track. Typically, a chemical mechanical polishing process is performed at each platen assembly 132 by moving the substrate 122 retained in the carrier head 152 relative to the advanced polishing article 123 supported on the platen assembly 132.

In some implementations, the advanced polishing article 123 may be positioned across the platen assembly 132, and between a supply assembly 156 and a take-up assembly 158 so that a polishing process can be performed on surface of the advanced polishing article 123 on the platen assembly 132. The supply assembly 156 and the take-up assembly 158 may provide an opposing bias to the advanced polishing article 123 in order to tighten and/or stretch an exposed portion of the advanced polishing article 123 disposed therebetween. In some implementations, the advanced polishing article 123 may generally have a flat or planar surface topology when stretched between the supply assembly 156 and the take-up assembly 158. Additionally, the advanced polishing article 123 may be advanced across and/or be releasably fixed to the platen assembly 132 such that a new or unused area of the advanced polishing article 123 may be released from the supply assembly 156. The advanced polishing article 123 may be releasably fixed by a vacuum pressure applied to a lower surface of the advanced polishing article 123, mechanical clamps, or by other holding methods to the platen assembly 132.

Figure 4E:
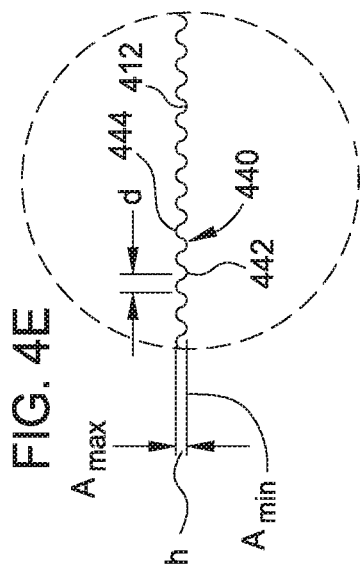
FIG. 4E is an enlarged schematic side view of a region of the advanced polishing article illustrated in FIG. 4A, according to one or more implementations described herein.

As will be discussed above and further below, a polishing article, such as the advanced polishing article 123 will include raised surface texture (e.g., embossed texture) formed on the polishing surface, such as the discrete extended elements, as, for example, illustrated in FIGS. 4E and 5B. In some embodiments, the advanced polishing article 123 will additionally include macro-features (e.g., items 447 and 547 illustrated in FIGS. 4A and 5A) formed on the polishing surface of the advanced polishing article, which are discussed further below. As noted above and discussed further below, in one configuration, the body of the advanced polishing article 123, such as pad body 430 (FIG. 4), is formed from a solid non-porous polymeric material that includes a surface texture that is formed on at least one surface of the pad body.

The polishing process may utilize a slurry containing abrasive particles delivered to the polishing article's surface by fluid nozzles 154 to aid in polishing the substrate 122. Alternatively, the fluid nozzles 154 may deliver de-ionized water (DIW) alone, or in combination with polishing chemicals. The fluid nozzles 154 may rotate in the direction shown to a position clear of the platen assemblies 132 as shown, to a position over each of the platen assemblies 132. In one implementation, the fluid nozzles 154 track with the sweeping motion of the carrier head 152 so the slurry is deposited adjacent to the carrier head 152.

In some implementations, the polishing module 106 further includes a corona discharge treatment module 160 for treating a surface of the advanced polishing article 123 to adjust its surface energy. In one implementation, the corona discharge treatment module treats the surface of the advanced polishing article 123 with ozone. In one implementation, the corona discharge treatment module uses atmospheric plasma that splits diatomic oxygen into negatively charged oxygen atoms, which bond with another oxygen molecule to produce ozone. Other suitable corona discharge techniques may be used to treat the surface of the advanced polishing article 123. Not to be bound by theory but it is believed that the corona discharge treatment enhances the wettability of the surface of the advanced polishing article 123.

Figure 2:
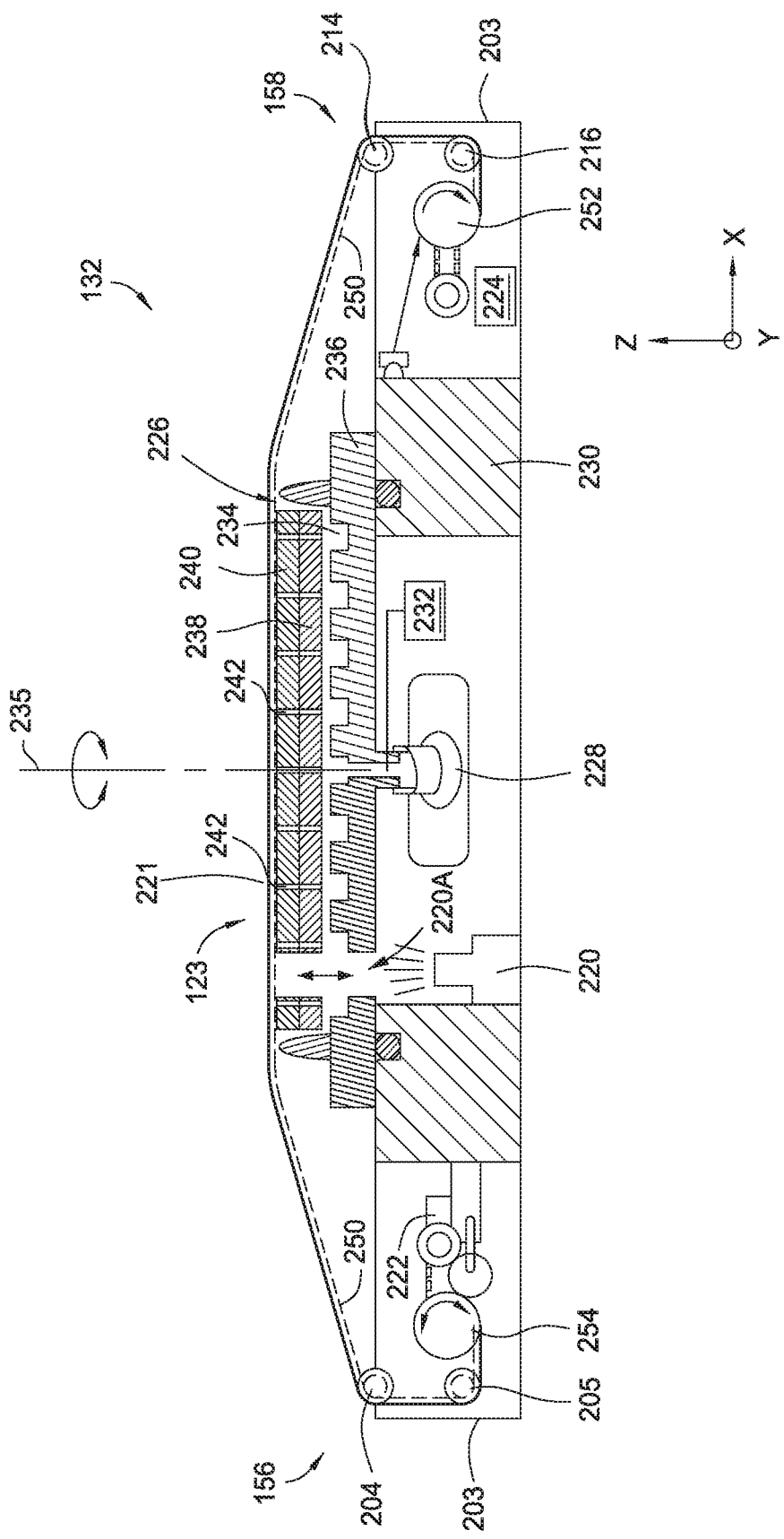
FIG. 2 is a schematic sectional view of an exemplary processing station of the module of FIG. 1, according to one or more implementations disclosed herein.

FIG. 2 depicts a side view of the platen assembly 132 and an exemplary supply assembly 156 and a take-up assembly 158, illustrating the position of the advanced polishing article 123 across a platen 230. Generally, the supply assembly 156 includes the supply roll 254, an upper guide member 204 and a lower guide member 205 that are disposed between a sidewall 203 of the platen assembly 132. Generally, the take-up assembly 158 includes the take-up roll 252, an upper guide member 214 and a lower guide member 216 that are all disposed between the sidewalls 203. The take-up roll 252 generally contains a used portion of the advanced polishing article 123 and is configured to be easily replaced during a maintenance activity with an empty take-up roll once take-up roll 252 is filled with the used advanced polishing article 123. The upper guide member 214 is positioned to lead the advanced polishing article 123 from the platen 230 to the lower guide member 216. The lower guide member 216 leads the advanced polishing article 123 onto the take-up roll 252.

The platen assembly 132 may also include an optical sensing device 220, such as a laser, that is adapted to transmit and receive optical signals for detecting an endpoint to the polishing process performed on a substrate that is urged against the top surface of the advanced polishing article 123. In some implementations, the optical sensing device 220 is configured to optically inspect a surface of a substrate through the thickness of the advanced polishing article 123. In one configuration, an opening 220A formed through the various advanced polishing article 123 supporting components (e.g., plate 236 and/or platen interface element 240) allows the optical sensing device 220 to optically inspect a substrate that is positioned on the top surface of the of the advanced polishing article 123. In this configuration, the optical sensing device 220 projects radiation through the advanced polishing article 123 and receives at a detector (not shown) any radiation reflected from the surface of the substrate that passes back through the advanced polishing article 123. In some implementations of the present disclosure, since the polymeric material of the advanced polishing article 123 is optically transparent within the desired wavelength range, optical monitoring of the surface of the substrate during polishing using the optical sensing device 220 is possible.

The supply roll 254 generally contains an unused portion of polishing article 123 and is configured so that it may easily be replaced with another supply roll 254 containing a new advanced polishing article 123 once the advanced polishing article 123 disposed on the supply roll 254 has been consumed by the polishing or planarizing process. In general, the total length of the advanced polishing article 123 includes an amount of material disposed on the supply roll 254, an amount disposed on the take-up roll 252, and an amount that extends between the supply roll 254 and the take-up roll 252. The total length is typically larger than the size of the polished surface of multiple substrates 122 (FIG. 1), and may be for example several meters to several tens of meters long. In general, the length of the advanced polishing article 123 is measured in a direction that is parallel to the polishing surface and the width of the advanced polishing article 123 is measured in a direction that is parallel to the polishing surface and is perpendicular to the length direction. In some embodiments, the width of the advanced polishing article 123 is between about 6 inches (150 millimeters (mm)) and about 50 inches (1,016 mm), such as between about 12 inches and about 40 inches. In one embodiment, the length of the advanced polishing article 123 is about 6.5 feet (1,981 mm) to about 100 feet (30,480 mm), such as between about 7 feet and about 100 feet. In another embodiment, the length of the advanced polishing article 123 is at least two times the width of the advanced polishing article 123, or is at least 5 times the width, at least 10 times the width.

The advanced polishing article 123 is generally configured to controllably advance the advanced polishing article 123 in the X-direction across a platen interface assembly 226. The advanced polishing article 123 is generally moved in relation to the platen 230 by balancing the forces between a motor 222 coupled to the supply assembly 156 and a motor 224 coupled to the take-up assembly 158. Ratchet mechanisms and/or braking systems (not shown) may be coupled to one or both of the supply assembly 156 and the take-up assembly 158 to fix the lateral position of the advanced polishing article 123 relative to the platen interface assembly 226. The platen 230 may be operably coupled to a rotary actuator 228 that rotates the platen assembly 132 about a central rotational axis 235 generally orthogonal to the lateral directions (X and/or Y directions). In some implementations, all of the elements shown in FIG. 2 rotate about the rotational axis 235.

A fluid management system 232 may be coupled between the rotary actuator 228 and the platen interface assembly 226. The fluid management system 232 may be used to fix the position of the advanced polishing article 123 onto the platen 230. The fluid management system 232 may include channels 234 formed in a plate 236 disposed below the platen interface assembly 226. In one implementation, the platen interface assembly 226 may include a platen interface element 240 and a subplate 238, each having openings 242 formed therethrough that are in fluid communication with the channels 234 and a fluid management system 232. The fluid management system 232 is able to provide a gas to the channels 234 by use of a compressed gas or apply a vacuum to the channels 234 by use of a vacuum pump.

In some implementations, the subplate 238 may be positioned below the platen interface element 240, as shown. The subplate 238 can include a material (e.g., metal, polymer, ceramic) that is more structurally and/or physically rigid than the platen interface element 240 so that the subplate 238 provides support for the platen interface element 240 and advanced polishing article 123 when a load is applied to a substrate disposed on the upper surface 221 of the advanced polishing article 123 during processing. The subplate 238 is configured to support and couple a surface of the platen interface element 240 to the platen 230.

Generally, the hardness, thickness and durometer of the platen interface element 240 has desirable mechanical and material properties to produce a desirable polishing result on a substrate that is urged against the advanced polishing article 123, platen interface element 240 and subplate 238 during processing. The platen interface element 240 generally maintains the upper surface 221 of the advanced polishing article 123 in a plane that is parallel to a plane (e.g. parallel to the X-Y plane) of a substrate (not shown) in order to promote global planarization of the substrate. As will be discussed further below, the platen interface element 240 includes one or more layers of material that are selected to promote desirable polishing results on the polished substrate. In one configuration, the platen interface element 240 is made of a polymeric material having a thickness from 1 mm to 2 mm, and hardness of about 50-65 Shore D. In some implementations, the platen interface element 240 is formed from a polymeric, elastomeric, woven fiber and/or plastic material. For example, the platen interface element 240 can be formed from one or more layers of material that may include, but is not limited to, polyethylene (PE), polyethylene terephthalate (PET), polypropylene (PP), polyamides (e.g., Nylon-66), polyurethane, or combinations thereof. In one implementation, the platen interface element 240 is formed from a woven fiber that includes polypropylene. In another implementation, the platen interface element 240 is formed from a material that has a desired porosity or pore volume throughout the thickness of the material, as measured in the Z-direction in FIG. 2.

In some alternate embodiments of the platen assembly 132 and advanced polishing article 123, an integral interface layer 250 (shown in dashed lines) is formed on or bonded to a lower surface of the advanced polishing article 123. The hardness, thickness and durometer of the integral interface layer 250 is selected so that it has desirable mechanical and material properties to produce a desirable polishing result on a substrate when used in combination with advanced polishing article 123. In this configuration, the platen interface element 240 and subplate 238 need not be present or installed during processing, and thus the integral interface layer 250 is disposed on a rigid supporting plate (not shown) during processing. In some implementations, the integral interface layer 250 is made of a polymeric material having a thickness from 1 mm to 2 mm, and hardness of about 50-65 Shore D, and can be used in place of the platen interface element 240. Exemplary polymeric materials for forming the integral interface layer 250 include but are not limited to polyethylene (PE), polyethylene terephthalate (PET), polypropylene (PP), polyamides (e.g., Nylon-66), polyurethane, or combinations thereof.

Alternately, in another configuration of the platen 230 and advanced polishing article 123, the platen interface element 240 and the integral interface layer 250 of the advanced polishing article 123 can be used in combination during a polishing process. In one implementation, the platen interface element 240 and/or the integral interface layer 250 are each formed from woven fiber that includes polypropylene. In another implementation, the platen interface element 240 and/or the integral interface layer 250 are formed from a material that has desired porosity or pore volume throughout the thickness of the material, as measured in the Z-direction in FIG. 2.

The platen interface element 240 and/or the integral interface layer 250 may be hydrophilic or hydrophobic. Since most liquids do not compress well, it is typically preferable that the platen interface element 240 and/or the integral interface layer 250 be hydrophobic. However, if the platen interface element 240 and/or the integral interface layer 250 are hydrophilic, the platen interface element 240 and/or the integral interface layer 250 should be configured to absorb liquid in a uniform manner.

According to some implementations described herein, the advanced polishing article 123 is relatively thin and stiff, and the platen interface element 240 is utilized to provide the necessary mechanical compliance to improve and/or adjust the polishing performance of the advanced polishing article 123, as will be discussed further below. In some implementations, the hardness (e.g., durometer) of the advanced polishing article 123 is greater than the platen interface element 240. In some implementations, the platen interface element 240 increases the mechanical integrity of the advanced polishing article 123. Additionally or alternatively, the hydrophobic or hydrophilic nature of the platen interface element 240 may retain and/or disperse slurry more uniformly.

In some implementations, the platen interface element 240 can have a variety of grooving formed across the surface that contacts the advanced polishing article 123, including concentric grooves or an array of pillars having diameters of 30 micrometers to 200 micrometers with a varying pitch. In some configurations, the grooves are in communication with a vacuum source within the fluid management system 232 via the openings 242, and thus may be used to help distribute the vacuum pressure applied to a lower surface of the advanced polishing article 123 during processing. In some configurations, the grooves are in communication with a positive pressure gas source disposed within the fluid management system 232 via the openings 242, and thus may be used to help distribute the positive pressure gas to a lower surface of the advanced polishing article 123 before, during or after performing a polishing process. Delivering a positive pressure gas during a polishing process that is performed on a substrate can be used to help control polishing process results.

In another implementation, the platen interface element 240 includes a combination of two types of platen interface elements are used where a first platen interface is made of a polymeric material and has a thickness of 1-2 mm, a hardness less than 50 Shore D, and no grooving pattern. The polymeric material of the first platen interface element is different than the polymeric material of a second platen interface element. In some implementations, a single platen interface element may be used, or a combination of the first and second platen interface elements described above. The second platen interface may include a hardness of about 60 Shore A to about 30 Shore D and a thickness of 1-2 mm. This second platen interface element may be placed directly over the first platen interface element. As will discussed further below, in some embodiments, the advanced polishing article 123 can be subsequently disposed over and/or releasably adhered to the platen interface element.

Typically, conventional CMP polishing pads are made by molding, casting, extrusion, web coating, or sintering these materials. Conventional polishing pads maybe made one at a time or as a cake, which is subsequently sliced into individual pad substrates. These substrates may then be machined to a final thickness and grooves are further machined onto them. Typical polymer or polymer/fiber circular top pads have a thickness of about 0.050 inches to about 0.125 inches thick. Typical polymer or polymer/fiber circular pad stacks (e.g., combined top pad and bottom pad) have a thickness of about 0.1 inches to about 0.2 inches thick.

The conventional polymer based CMP polishing pads are typically adhered to a flat rotating circular table within a CMP machine using a PSA (pressure sensitive adhesive). Each of the layers found in a polishing pad, such as the polishing layer, intermediate adhesive bonding layer, subpad and pad-to-platen bonding adhesive layer typically found in a conventional pad, will have an effect on the polishing characteristics of a polishing pad used to polish a desired material disposed on a surface of a substrate. During processing a substrate is placed in contact with a conventional pad using a down-force of about 1 psi to about 6 psi in the presence of a chemically and mechanically active slurry, which results in removal of the film from the substrate. Conventional polishing pads are typically used in conjunction with pad conditioning to stabilize the film removal rate. When the pad surface has been abraded or loaded with polishing byproducts to an extent that can no longer sustain desirable and/or stable polishing performance, the pad must be removed and replaced with another new pad and the machine must be re-qualified for production. The pad material and the type of pad conditioning required to achieve a desired polishing performance are key to the availability of the polisher for use in the device fabrication factory. A short pad lifetime and frequent pad replacement reduces the availability of the polishing tool and also increases the cost of ownership of the polishing tool. As mentioned above, conventional CMP polishing pads need periodic conditioning to maintain acceptable removal rates, and conditioning may produce undesirable debris and/or shorten the lifetime of the pad. The debris is known to contribute to higher defect levels including microscratches. Additionally, in order to achieve the desired strength and improve other polishing related properties, conventional pads are relatively mechanically stiff (e.g., bending stiffness) and have a thick cross-section. This stiffness and thickness of conventional polishing pads does not make conventional polishing pads suitable for roll-to-roll applications. One or more of these drawbacks increases downtime and/or yield, which increases cost of ownership.

However, the advanced polishing article 123 as described herein is generally thinner than conventional CMP polishing pads while maintaining desirable polishing characteristics and material properties (e.g., wettability, strength) and does not require pad conditioning. In contrast to conventional polishing pad materials, the advanced polishing article 123 may not need conditioning beyond water rinsing with a water jet or water flow, and/or use of a soft brush in order to remove polishing byproducts. Thus, no destructive pad conditioning, as seen with diamond disks that are used with conventional polishing pads, is needed.

The polishing article 123 as described herein includes a thickness that is generally less than a conventional CMP polishing pad, which allows a longer length of the polishing article material to be disposed on the same sized supply roll. The polishing article's thickness is generally measured in a direction that is parallel to the direction that the force is applied to the polishing article 123 by the substrate when it is being polished. In some implementations, the polishing article 123 has a thickness (e.g., 0.001 to 0.025 inches (0.0254 mm to 0.635 mm), or 0.010 to 0.020 inches (0.254 mm to 0.508 mm), or 0.010 to 0.018 inches (0.254 mm to 0.460 mm)) that is less than the thickness (e.g., 0.050 to 0.125 inches) of just the polishing layer (e.g., upper pad) of a conventional polishing pad (e.g., Dow® IC1010™ pad). In some implementations, the polishing article 123 has a thickness that is five to ten times thinner than the thickness of the polishing layer (e.g., upper pad) of a conventional polishing pad (e.g., Dow® IC1010™ pad). In some configurations, the polishing article 123 is formed from a non-porous polymeric material, as will be discussed further below. A supply roll that has a longer useable length disposed thereon will extend the number of substrates that can be polished within a polishing tool over an extended period of time, since the overhead time required to replace and qualify a new length of a supply roll material each time the supply roll runs out of useable material is minimized. Additionally, the polishing article 123 as described herein includes sufficient mechanical integrity, is chemically resistive to the polishing chemicals (i.e., able to survive the aggressive slurry chemistries used in CMP polishing without degrading, delaminating, blistering or warping), and may be sufficiently hydrophilic such that aqueous-based abrasive containing slurry adequately wets the surface of the polishing article. In some implementations, the polishing article 123 may display a water on polishing article surface dynamic contact angle of about 10 degrees, such as between about 10 degrees to about 90 degrees, or between about 10 degrees to about 30 degrees, or between about 30 degrees to about 70 degrees, or between about 70 degrees to about 90 degrees. The polishing article 123 as described herein possesses a high strength to resist tearing during polishing, acceptable levels of hardness and modulus (depending on material being polished) for planarity, good abrasion resistance to prevent excessive polishing article wear during polishing, and retain mechanical properties when wet.

The advanced polishing article 123 as described herein may alleviate the need to condition the polishing article and thus maximize polisher availability and polisher performance. For example, the advanced polishing article 123 may be incrementally advanced a distance smaller than the size (e.g., diameter) of the substrate to present a portion of fresh polishing material in lieu of the need to perform abrasive conditioning. The incremental advancement of the advanced polishing article 123 may be performed before, during or after a substrate is polished thereon by use of one or more actuators coupled to the take-up roll 252 or supply roll 254 (FIG. 2). In one implementation, the advanced polishing article is incrementally advanced from about 0.1 millimeters per wafer to about 10 millimeters per wafer (e.g., 1 millimeter per wafer to about 5 millimeters per wafer).

FIG. 3A is a schematic sectional view of another exemplary polishing station 300, which may be used with the module 106 of FIG. 1, having an advanced polishing article 323 formed according to the implementations described herein. The polishing station 300 may be positioned within a larger chemical mechanical polishing (CMP) system that contains multiple polishing stations, such as module 106. The polishing station 300 includes a platen 302. The platen 302 may rotate about a central axis 304. The advanced polishing article 323 may be placed on the platen 302. While not intending to limit the disclosure provided herein, typically, the advanced polishing article 323 covers an upper surface 303 of the platen 302 which is at least one to two times larger than the size of the substrate 122 (e.g., substrate diameter) that is to be processed in the polishing station 300. In one example, the advanced polishing article 323 and platen 302 are between about 6 inches (150 millimeters) and about 50 inches (1,016 millimeters) in diameter, such as between about 12 inches and about 40 inches. In another example, the advanced polishing article 323 and platen 302 are between about 20 inches (508 millimeters) and about 30 inches (762 millimeters) in diameter. In yet another example, the advanced polishing article 323 and platen 302 are between about 23 inches (584 millimeters) and about 26 inches (660 millimeters) in diameter. The advanced polishing article 323 includes a polishing surface 312 configured to contact and process one or more substrates 122. In one implementation, the polishing surface 312 has a raised surface texture, grooves formed in the surface, or both a raised surface texture and grooves as described herein, for example, in FIG. 4A-4C and FIG. 5A.

The platen 302 supports the advanced polishing article 323 and rotates the advanced polishing article 323 during polishing. A carrier head 308 may hold the substrate 122 being processed against the polishing surface 312 of the advanced polishing article 323. A polishing interface 330 is formed between the polishing surface 312 and the substrate 122. The carrier head 308 typically includes a flexible diaphragm 311 that is used to urge the substrate 122 against the advanced polishing article 323 and a retaining ring 309. The flexible diaphragm 311 may be used to correct for any inherently non-uniform pressure distribution found across the substrate's surface during the polishing process. During processing, a substrate is placed in contact with an advanced polishing article 323 using a down-force of between about 0.5 psi to about 8 psi in the presence of a slurry, such as a down-force of between about 2 psi to about 6 psi. The carrier head 308 may rotate about a central axis 314 and/or move in a sweeping motion to generate relative motions between the substrate 122 and the advanced polishing article 323.

During polishing, a polishing fluid 316, such as an abrasive slurry or non-abrasive slurry, may be supplied to the polishing surface 312 by a delivery arm 318. The polishing fluid 316 may contain abrasive particles, a pH adjuster and/or chemically active components to enable chemical mechanical polishing of the substrate. The slurry chemistry of 316 is designed to polish substrate surfaces and/or features that may include metals, metal oxides, and semimetal oxides. One will note that the surface topography of the advanced polishing article 323 is used to control the transport of the polishing fluid 316 (e.g., slurry) which interacts with the substrate 122 during the polishing process. For example, the surface topology of the advanced polishing article 323 may include raised surface texture (e.g., embossing) and optionally macro-features (e.g., macro-grooves, holes, channels or other protuberances), which may be disposed over, upon and within the advanced polishing article 323.

During processing, the advanced polishing article 323 and the carrier head 308 apply mechanical energy to the substrate 122, which in combination with the chemicals and abrasive components in the polishing fluid 316 cause the surface of the substrate 122 to become planarized.

FIG. 3B is a schematic cross-sectional view of a portion of the carrier head 308 and an advanced polishing article 123, 323. For clarity, the flexible diaphragm 311 and upper part of the carrier head 308 have been left out of FIG. 3B. During operation the flexible diaphragm 311 (FIG. 3A) is positioned to urge the substrate 122 against the advanced polishing article 123, 323, and a carrier head actuator (not shown) that is coupled to a mounting portion (not shown) of the carrier head 308 is configured to separately urge the carrier head 308 and the retaining ring 309 against the surface of the polishing article. As shown in FIG. 3B, the flexible diaphragm (not shown) is configured to apply a pressure to the backside of the substrate 122, which is illustrated by the applied force $F_2$, and the carrier head actuator is configured to apply a force $F_1$ to the retaining ring 309. In a conventional configuration, a substrate 122 is positioned within the carrier head 308 and over a portion of a conventional polishing article, which is positioned in place of the advanced polishing article 123, 323, during a polishing process. It has been found that CMP processes that use conventional polishing articles versus the advanced polishing article design disclosed herein provide significantly different substrate polishing process results if the same polishing process parameters are used during processing. The differing polishing results, which are caused by differences in the mechanical properties of the conventional polishing pad versus the advanced polishing article 123, 323, 400, 500, 600a, 600b, 600c, 600d, 600e, 600f's structure disclosed herein, can be used to solve some of the common problems plaguing conventional CMP processes, such as global planarization, planarization efficiency and dishing. In one example, the loading applied to a substrate 122 during polishing provides different edge effect results on the substrate 122 when a conventional polishing pad is used versus one or more of the implementations of the polishing article disclosed herein. In most CMP processes, to compensate for the edge effect during polishing, a force $F_1$ is applied to the retaining ring 309 to compensate for a larger inherent polishing non-uniformity commonly found at the edge of the substrate 122. As illustrated in FIG. 3B, in configurations where the polishing article includes a much thicker and/or compliant polishing article, a pad rebound or local pressure concentration ridge 307A is formed when the force $F_1$ is applied by the retaining ring 309 to the thicker polishing articles, such as conventional polishing pad stacked (e.g., hard pad and platen interface stack) and single layer designs. The formation of the local pressure concentration ridge 307A is generally related to the deformation 307B of the polishing article due to the applied force $F_1$, which causes the edge of the substrate to polish faster than the center of the substrate. The higher polishing rate at the edge of the substrate leads to a "global" CMP planarization non-uniformity (e.g., across the substrate non-uniformity). However, due to the thin nature of one or more of the implementations of a polishing article described herein, such as advanced polishing article 123, 323, is not able to form a significant local pressure concentration ridge 307A due to the decreased allowable deformation of the advanced polishing article 123, 323 due to its differing composite mechanical structure and performance of the advanced polishing article 123, 323 versus a conventional polishing article.

Figure 4A:
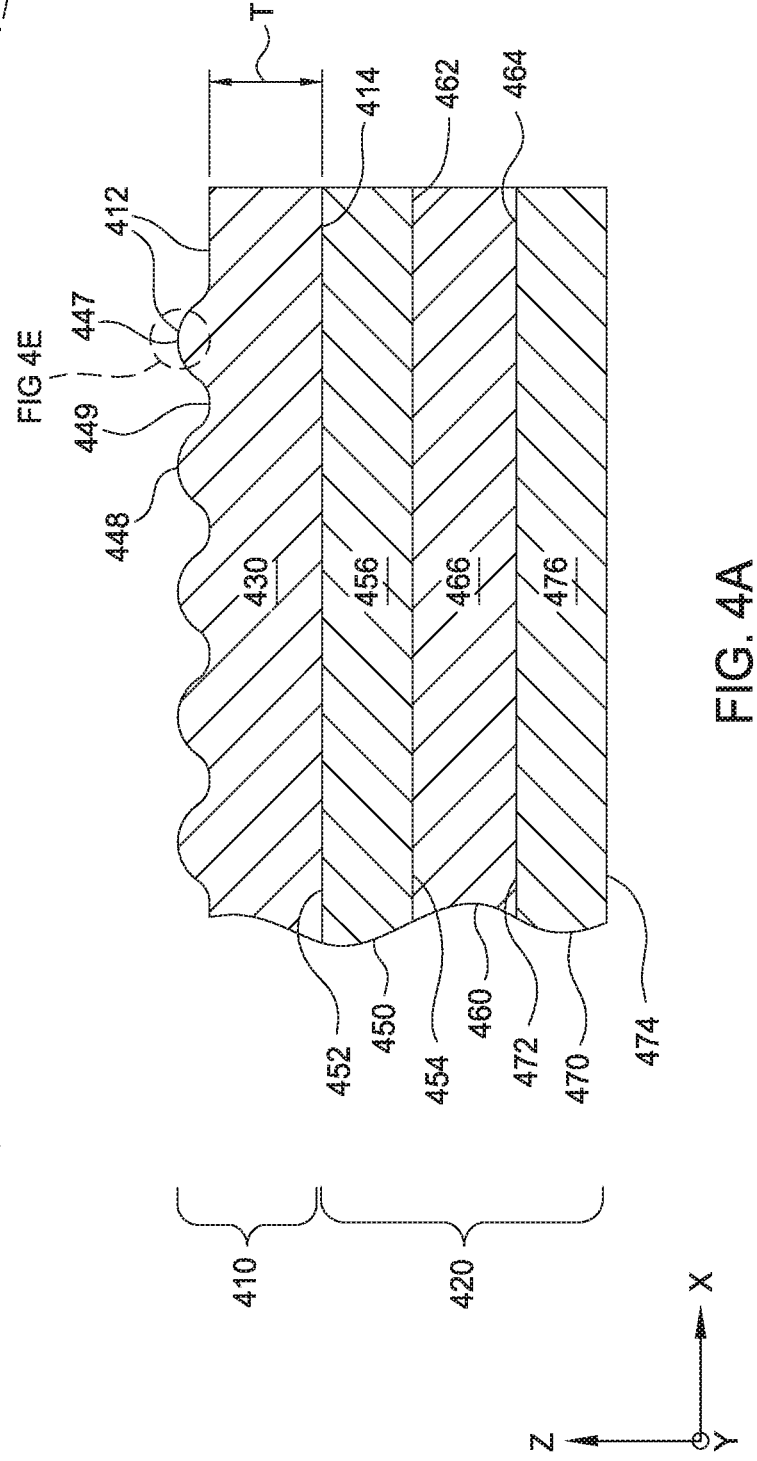
FIG. 4A is an enlarged schematic side view of one implementation of an advanced polishing article, according to one or more implementations described herein.

FIG. 4A is an enlarged schematic side view of one implementation of an advanced polishing article 400 having a raised surface texture formed on a pad body 430, according to one or more implementations described herein. In one implementation, the advanced polishing article 400 may form part of or be used as a substitute for either the advanced polishing article 123 or the advanced polishing article 323. The advanced polishing article 400 includes a top pad 410 having a pad body 430 that is disposed over a platen interface assembly 420 that is positioned below the top pad 410. The top pad 410 has a textured polishing surface 412 and the opposing bottom surface 414 that define at least part of the pad body 430. The platen interface assembly 420 may form at least part of or be used as a substitute for the platen interface element 240 described above. The platen interface assembly 420 is typically coupled to the surface of a platen assembly (e.g., platen 230 or platen 302) through the subplate 238. In one configuration of the platen assembly 132, the top pad 410 is free to slide relative to the platen interface assembly 420 in one or more directions disposed within the X-Y plane.

Figure 7A:
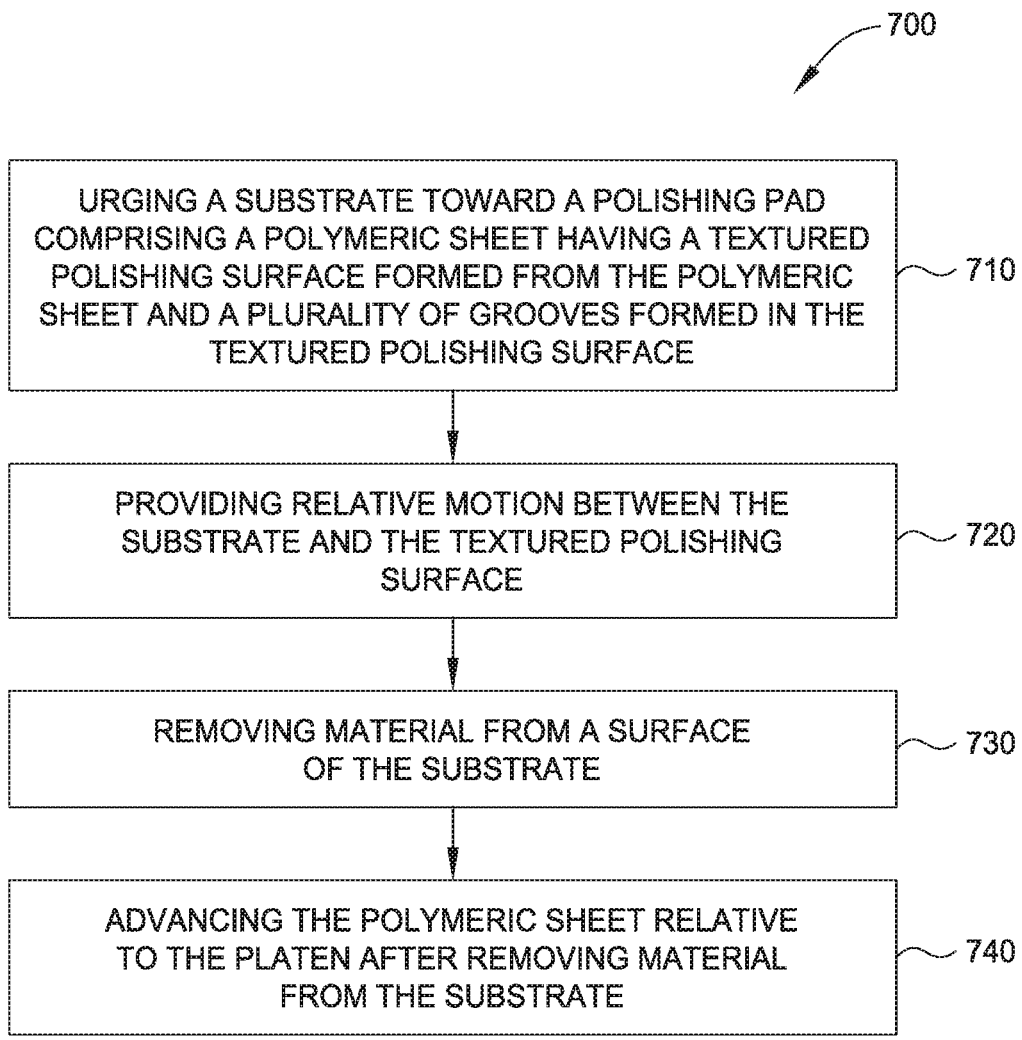
FIG. 7A is a flow chart depicting a method of polishing with an advanced polishing article according to one or more implementations described herein.
Figure 7B:
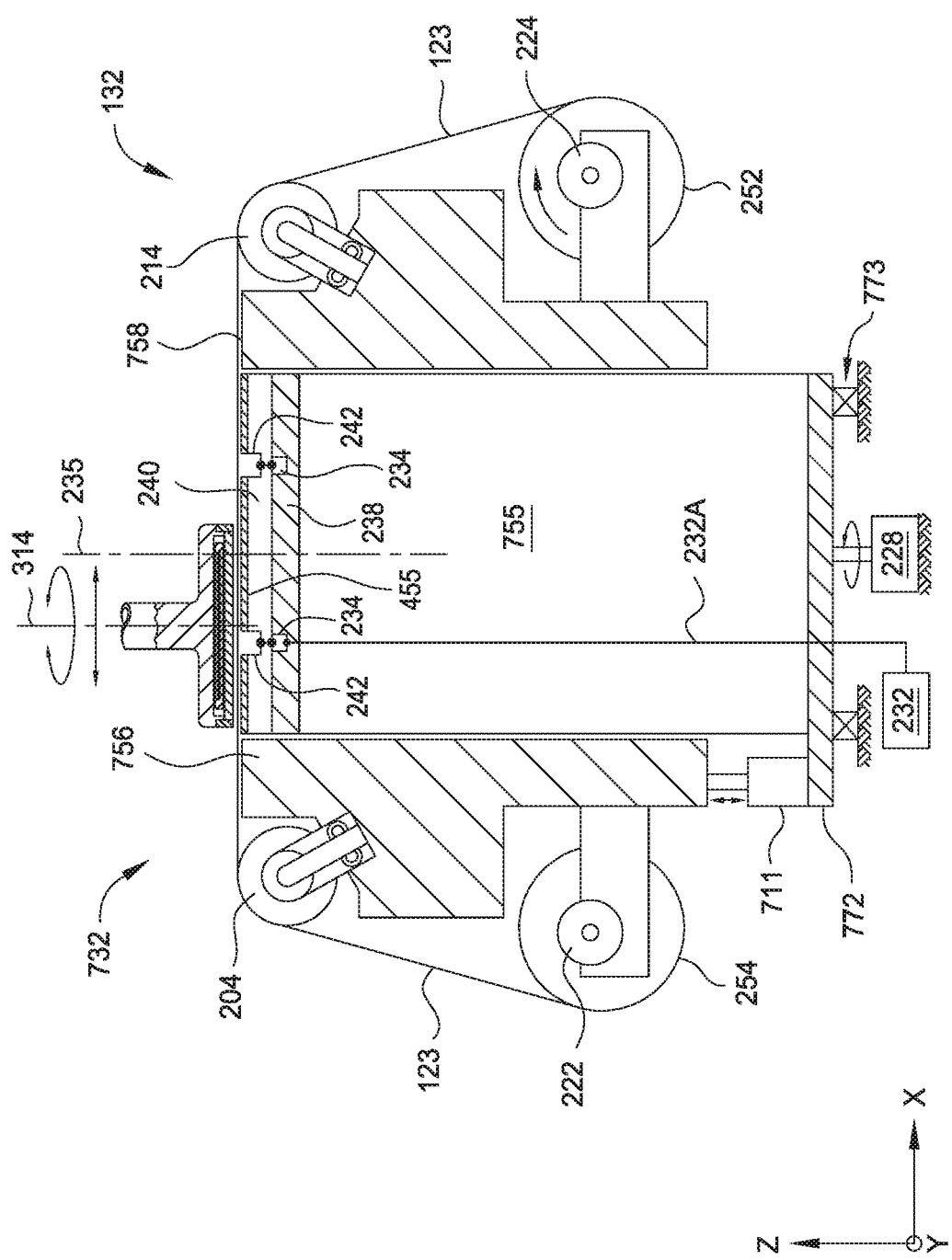
FIG. 7B is a schematic sectional view of an exemplary processing station of the module of FIG. 1 in a first configurational position, according to one or more implementations disclosed herein.
Figure 7C:
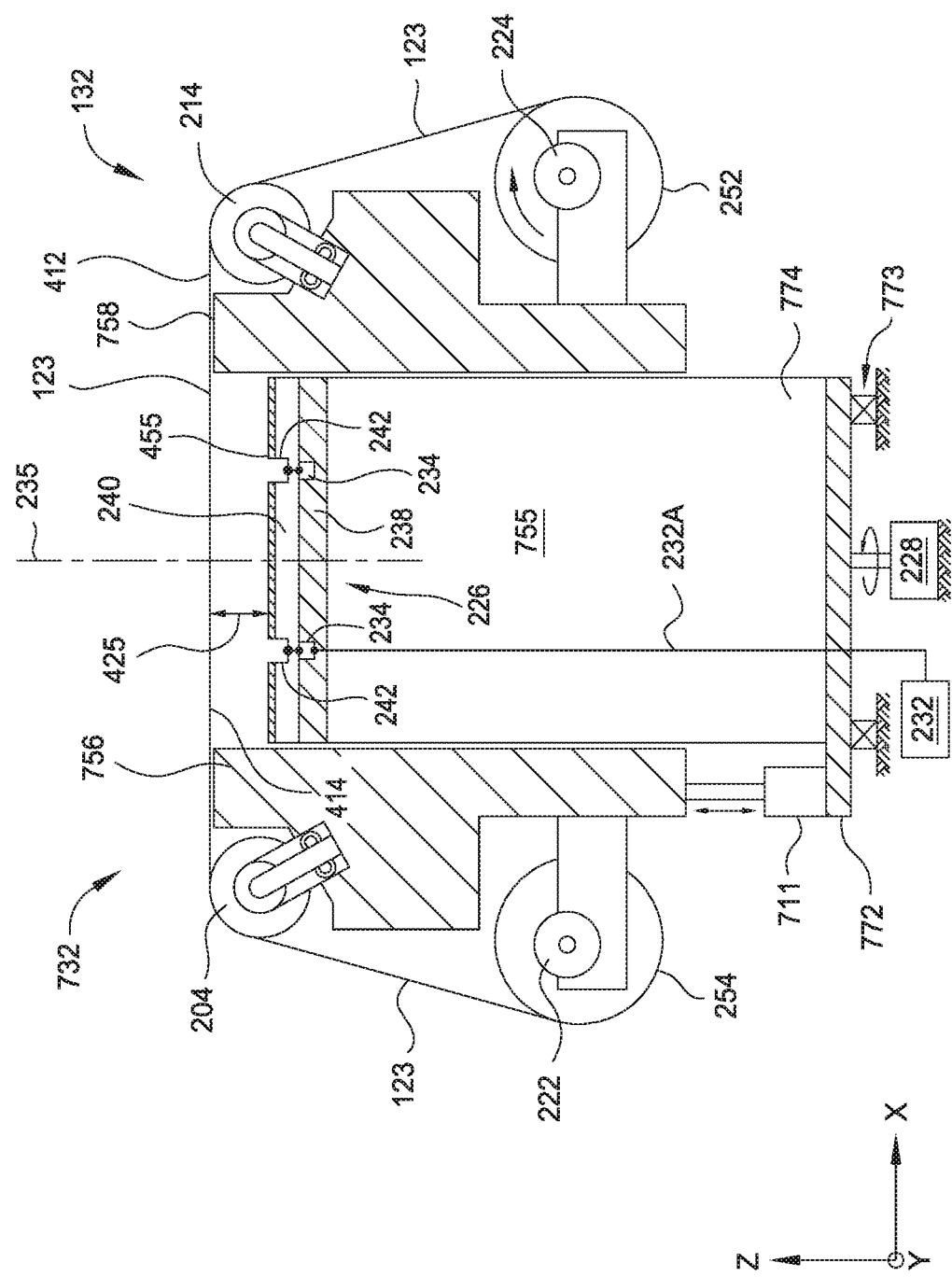
FIG. 7C is a schematic sectional view of an exemplary processing station of the module of FIG. 1 in a second configurational position, according to one or more implementations disclosed herein.

In one implementation, the platen interface assembly 420 includes at least one of a first platen interface 450, a second platen interface 460, and a third platen interface 470 that is coupled to supporting elements within the platen assembly, such as plate 236 in FIG. 2, platen 302 in FIG. 3 or platen support assembly 755 in FIGS. 7B-7C. As depicted in FIG. 4A, the platen interface assembly 420 is a multi-layer platen interface stack or "sandwich" stack. It should be understood that although depicted as a three layer platen interface stack, any number of platen interface layers, which achieve a desired compressibility and polishing properties, may be used. In one implementation, the platen interface assembly 420 includes at least one of a first platen interface 450, a second platen interface 460, and a third platen interface 470. In configurations where multiple platen interface layers are used, the platen interfaces may be adhered together to form a single platen interface assembly by any suitable attachment methods (e.g., laminating, thermal bonding, gluing, double-sided tape, pressure sensitive adhesives, etc.).

The first platen interface 450 includes a first surface 452 and an opposing second surface 454 that define a platen interface body 456. In one implementation, the first surface 452 of the first platen interface has a plurality of grooves (e.g., see item(s) 242 in FIG. 2) formed in the first surface 452. In another implementation, the first surface 452 of the first platen interface 450 has no grooving pattern. In one implementation, the first surface 452 is a microtextured surface. In one implementation, the microtexture is similar to the microtexture formed on the textured polishing surface 412.

In some implementations, such as non-roll-to-roll configurations, the top pad 410 is adhered to the platen interface assembly 420. In this configuration, the first surface 452 of the first platen interface 450 is fixedly attached to the bottom surface 414 of the top pad 410. The first surface 452 of the first platen interface 450 may be adhered to the bottom surface 414 of the top pad 410 by any suitable attachment methods (e.g., laminating, thermal bonding, gluing, double-sided tape, pressure sensitive adhesives, etc.).

The platen interface body 456 of the first platen interface 450 is typically made of a polymeric material. In one implementation, the platen interface body 456 is a polypropylene sheet. The platen interface body 456 can have a thickness (Z-direction) of about 0.001 inches to about 0.030 inches (e.g., between about 0.005 inches and about 0.025 inches, between about 0.010 inches and about 0.025 inches, or between about 0.010 inches and about 0.020 inches). The platen interface body 456 can be formed from a material that has a hardness of about 50-65 Shore D. In one implementation, the platen interface body 456 of the first platen interface 450 includes a fibrous containing mat material that is composed of a polymeric material, such as a spun and/or molded polypropylene fiber mat material.

In one implementation, the platen interface assembly 420 optionally includes the second platen interface 460 that includes a first surface 462 and an opposing second surface 464 that define a platen interface body 466. In this case, the first surface 462 is adhered to the second surface 454 of the first platen interface 450. In one implementation, the platen interface body 466 of the second platen interface 460 is a fibrous mat material that is composed of a polymeric material. In one implementation, the platen interface body 466 is a spun and/or molded polypropylene (PP), polyethylene (PE), or polyester fiber mat. In one implementation, the platen interface body 466 may have density, or basis weight, of between about 2 and about 8 ounces per square yard (OSY), such as a basis weight of between about 3.0 and about 4.0 OSY. In one implementation, the second platen interface 460 has a thickness (Z-direction) of about 0.005 inches to about 0.050 inches (e.g., between about 0.010 inches and about 0.040 inches, or between about 0.010 inches and about 0.030 inches). The second platen interface 460 generally has different physical and/or mechanical properties than the first platen interface 450. In one example, the platen interface body 456 includes a first platen interface body that comprises a polymer sheet and a second platen interface body that comprises a fiber mat. In one example, the platen interface body 456 includes a polypropylene sheet and the platen interface body 466 includes a spun and/or molded polypropylene fiber mat.

In another implementation, the platen interface assembly 420 optionally includes the third platen interface 470. The third platen interface includes a first surface 472 and an opposing second surface 474 that define a platen interface body 476. In one implementation, the first surface 472 is adhered to the second surface 464 of the second platen interface 460. The second surface 474 of the third platen interface 470 may be adhered to a platen or plate assembly. The platen interface body 476 of the third platen interface 470 is typically made of a polymeric material. In one implementation, the platen interface body 476 is a polypropylene sheet. In one implementation, the platen interface body 476 has a thickness (Z-direction) of about 0.005 inches to about 0.050 inches (e.g., between about 0.010 inches and about 0.040 inches, or between about 0.020 inches and about 0.030 inches). In one implementation, the first platen interface 450 and third platen interface 470 comprise the same polymeric material. The platen interface body 476 can be formed from a material that has a hardness of about 50-65

Shore D. In some implementations, the first platen interface 450 and the third platen interface 470 help keep the second platen interface 460 dry by sealing the second platen interface 460 away from water and polishing slurry. In one implementation, the first platen interface 450 and the third platen interface 470 are made of polypropylene that has a thickness of about 0.005 inches to about 0.040 inches and the second platen interface 460 is made of a spun polypropylene fiber mat having a basis weight of between 2.5 and 4.0 OSY and a thickness of about 0.010 inches to about 0.040 inches to provide desirable static and dynamic mechanical properties to a substrate that is being polished on the advance polishing pad.

In another implementation, the platen interface assembly 420 is a combination of a plurality of platen interfaces, wherein each platen interface has a different hardness than the other platen interfaces. In another implementation, the platen interface assembly 420 is a combination of a plurality of platen interfaces, wherein two or more of the platen interfaces in the plurality of platen interfaces have different mechanical properties (e.g., hardness, storage modulus E', loss modulus E", tan δ) than the other platen interfaces within the platen interface assembly 420. In one implementation, the first platen interface has a hardness less than 50 Shore D and the second platen interface has a hardness of greater than 50-65 Shore D. In one implementation, the platen interface is made of a first polymeric material that has a thickness of 0.5 to 2 mm (e.g., 1-2 mm), and a second platen interface is made of a second polymeric material that has a thickness of 0.5 to 2 mm (e.g., 1-2 mm). In some implementations, a single platen interface may be used, or a combination of the first platen interface and the second platen interface, and may include a hardness of about 60 Shore A to about 30 Shore D.

Figure 4B:
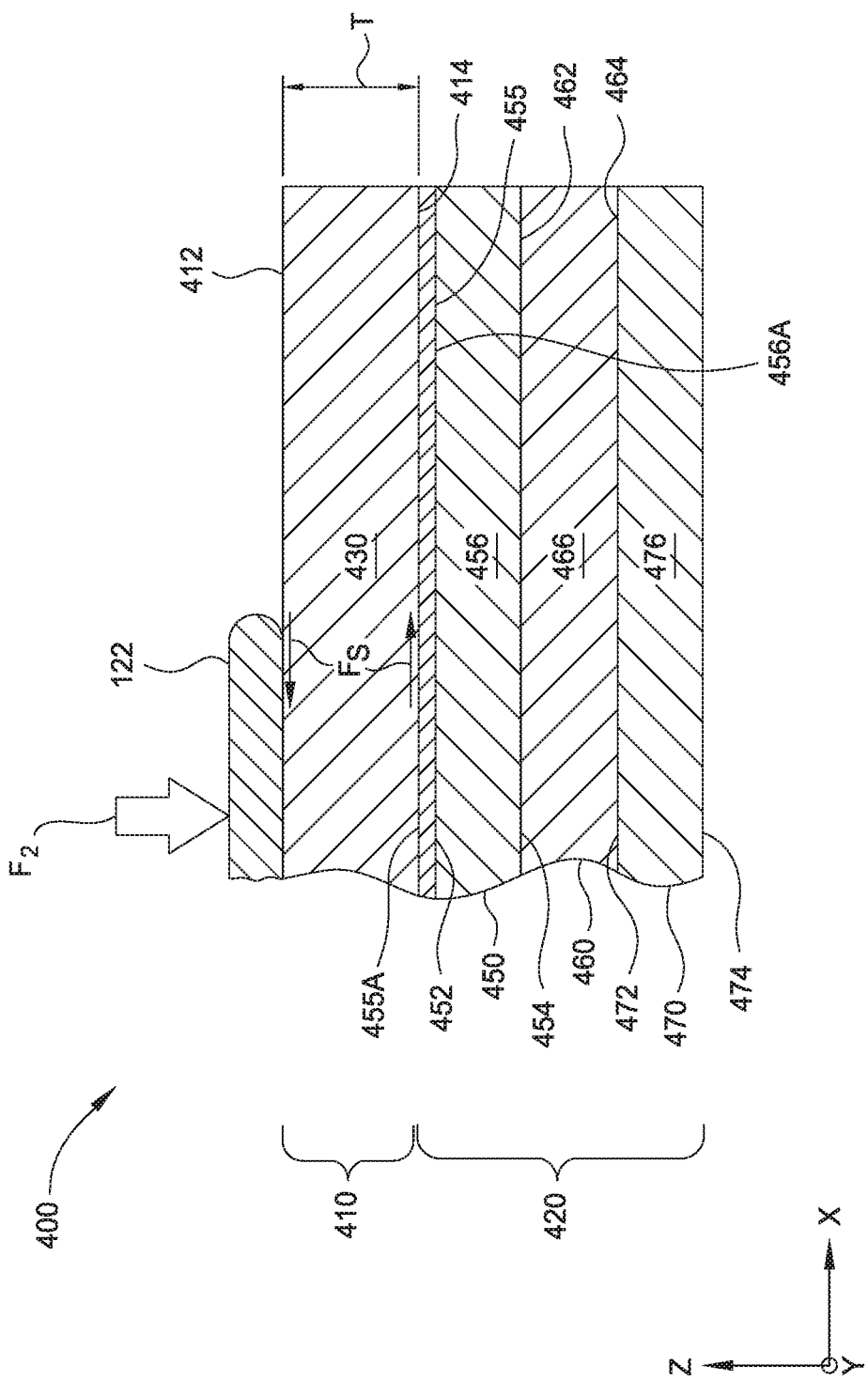
FIG. 4B is an enlarged schematic side view of one implementation of an advanced polishing article, according to one or more implementations described herein.

In some configurations, as illustrated in FIGS. 4B and 4C, the upper surface of the platen interface assembly 420 is releasably adhered to a bottom surface 414 of the top pad 410 by a releasable attachment layer, or also referred to herein as the releasable bonding layer 455. In this configuration, the platen interface assembly 420 is fixedly attached, bonded (e.g., adhesively bonded) or adhered to the surface of the platen assembly components (e.g., plate 236 and/or platen 230) disposed below the platen interface assembly 420 through the subplate 238. As illustrated in FIG. 4B, the top pad 410 is supported by a platen interface assembly 420 that includes the releasable bonding layer 455 that is in contact with the bottom surface 414 of the top pad 410, while a substrate 499 is being polished on the top surface (i.e., textured polishing surface 412) of the top pad 410, and the top surface of the platen interface body 456. The releasable bonding layer 455 is used to mechanically support and laterally retain the top pad 410 in a desired position on the platen interface assembly 420 during a polishing process. In some roll-to-roll implementations (FIGS. 2 and 7B-7C), where the advanced polishing article 400 is used in a web polishing system, the bottom surface 414 of the top pad 410 is configured to be separable from a top surface 455A of the releasable bonding layer 455 to allow the top pad 410 to be indexed relative to the platen interface assembly 420 in a direction A, as illustrated in FIG. 4C. As will be discussed further below, in some embodiments, the top pad 410 can be separated from the platen interface assembly 420 by use of gas provided to the interface of the top pad 410 and the platen interface assembly 420 and/or by use of an actuator 771 (FIG. 7B-7C) that is able to overcome a "releasable bonding" force (e.g., weak adhesive forces, molecular adhesion type of forces, etc.) formed between the bottom surface 414 of the top pad 410 and the top surface 455A of the releasable bonding layer 455 due to the surface properties (e.g., surface energy) of the top surface 455A. Once the top pad 410 is separated from the top surface of the releasable bonding layer 455 and the top pad 410 has been indexed a distance relative to the platen interface assembly 420, the top pad 410 and the platen interface assembly 420 can then be brought back into contact so that the surface properties of the releasable bonding layer 455 can be used to hold and support the top pad 410 during a subsequent polishing operation. During the indexing process, a gap 425 is formed between the top pad 410 and the platen interface assembly 420 to allow the top pad 410 to move freely relative to the platen interface assembly 420.

In one embodiment, as illustrated in FIG. 4D, the releasable bonding layer 455 includes an interface layer 457A, which includes the top surface 455A, and an adhesive layer 457B, which adhesively bonds the interface layer 457A to the platen interface body 456. In this configuration, the adhesive strength of the adhesive layer 457B to a surface of the interface layer 457A and the adhesive strength of the adhesive layer 457B to platen interface body 456 are both significantly higher than any releasable bond formed between the top surface 455A of the interface layer 457A and the bottom surface 414 of the top pad 410. In some embodiments, the adhesive layer 457B includes a pressure sensitive adhesive material, such as an acrylate polymer, rubber polymer, and/or synthetic thermoplastic elastomer. The significantly higher adhesive strength formed between the surfaces of the adhesive layer 457B and platen interface body 456 and the interface layer 457A are used to assure that the polishing process is consistent for all substrates that are processed in the polishing system. In this case, it is desirable for the adhesive strength of the adhesive layer 457B to the platen interface body 456 and the interface layer 457A to be greater than the releasable bond formed between the top pad 410 and the top surface 455A of the releasable bonding layer 455, such as by about two times, about five times, or even greater than about 10 times. The higher adhesive bond strength between the releasable bonding layer 455 to the underlying platen interface body 456 will prevent portions of the releasable bonding layer 455 (e.g., adhesive layer 457B and/or interface layer 457A) from preferably attaching to the top pad 410, and also detaching from the platen interface body 456, when the releasable bonding layer 455 and top pad 410 are separated from each other during the process of indexing the top pad 410. If portions of the releasable bonding layer 455 remain attached to the top pad 410 and other portions remain attached to the platen interface body 456, during one or more polishing processes and subsequent indexing steps, wafer-to-wafer processing results issues can arise due to a variation in the stack-up of layers in various localized regions of the platen interface assembly 420 as the portions of the releasable bonding layer 455 attached to the top pad 410 are incrementally indexed across the platen interface assembly 420. It has been found that the stack-up and/or variations in stack-up of the top pad 410 and the platen interface assembly 420 can have a substantial effect on the polishing process results (e.g., within wafer and wafer-to-wafer) and pad properties due to the thin nature of the top pad 410 of an advanced polishing article.

The preferential attachment of the releasable bonding layer 455 to the underlying platen interface body 456 versus to the surface 414 of the top pad 410 can also be controlled by the selection of the proper materials used to form both the platen interface body 456 and the top pad 410, adjusting the surface properties of the surface 414 of the top pad 410 and the surface properties of the first surface 452 of the platen interface body 456, and/or adjusting the properties of the surface of releasable bonding layer 455 that interfaces with the surface 414 of the top pad 410 and the first surface 452 of the platen interface body 456. The surface properties of the surface 414 of the top pad 410 and the first surface 452 of the platen interface body 456 can be adjusted by use of a chemical or mechanical treatment that adjusts the surface energy or physical topography of the desired surfaces.

In some configurations, to assure that the releasable bonding layer 455 is separable from the surface 414 of the top pad 410 and yet also able to retain the top pad 410 in position during polishing, the releasable bonding layer 455 is configured to form an adhesive bond strength at the interface between the surface 414 of the top pad 410 and the top surface 455A of the releasable bonding layer 455 that is equivalent to a bond strength of less than about 25 ounces per lateral inch when measured using an industry standard PSTC-1 testing method, such as a bond strength of between about 1 ounce/inch and 25 ounce/inches, or even a bond strength of between about 1 ounce/inch and 20 ounce/inches. In an effort to control the bond strength formed between the surface 414 of the top pad 410 and the top surface 455A of the releasable bonding layer 455, the surface properties of the top pad material at the surface 414 can be adjusted to achieve a desired bond strength. In one configuration, the surface roughness of surface 414 of the top pad 410 is controlled to achieve a desired bond strength between the surface 414 and the releasable bonding layer 455. In one configuration, surface 414 is purposely altered to achieve an arithmetical mean height (Sa) of between about 2 micro-inches and about 250 μ-in, such as an Sa surface roughness of from about 8 to about 200 μ-in, a surface roughness from about 85 to about 200 μ-in, or even a surface roughness from about 100 to about 180 μ-in, to achieve a desired bond strength. It has generally been found that the rougher the surface the lower the generated bond strength will tend to be between a surface of a solid PSA layer material and its mating contact surface (i.e., surface 414).

In some alternate embodiments of the platen interface assembly 420, the interface layer 457A is directly bonded to the material used to form platen interface body 456 by molecular scale mixing, chain entanglement and/or chemical bonding created at the interface of the interface layer 457A and platen interface body 456 during a process used to directly attach the interface layer 457A to the surface of the platen interface body 456. In some embodiments, the materials used to form the interface layer 457A and the platen interface body 456 are selected so that they are compatible with each other or have a similar monomer or polymer structure so that molecular scale mixing, chain entanglement and/or chemical bonding can occur between the materials used to form the interface layer 457A and the platen interface body 456.

In some implementations of the platen interface assembly 420, the interface layer 457A of the releasable bonding layer 455 includes a solid layer that may comprise a material such as silicone-based material, a natural rubber or a synthetic rubber. In one embodiment, the interface layer 457A includes a material selected from styrene butadiene (SBR), polyacrylics, polyvinyl acetate (PVA), or silicone. In one example, the interface layer 457A includes a silicone-based material that has a durometer of between 20-50 on the Shore A scale, such as a silicone material that has durometer of 40-50 on the Shore A scale. However, other suitable materials may be used in place of silicone to releasably couple the top surface 455A of platen interface assembly 420 with the top pad 410. It has been found that the hardness of the releasable bonding layer 455 can have a significant effect on the polishing process uniformity and global planarization due to its effect on the compressive static and dynamic mechanical properties of the stack-up of the top pad 410 and optional platen interface assembly 420. In some configurations, the releasable bonding layer 455 has a thickness that is less than or equal to the thickness of the top pad 410 so that the mechanical properties of the releasable bonding layer 455 will not dominate the properties of the top pad 410, releasable bonding layer 455 and other platen interface assembly 420 components stack-up. In one implementation, the releasable bonding layer 455 has a thickness that is less than or equal to 0.030 inches, such as less than or equal to about 0.010 inches. In some configurations, it is desirable for the releasable bonding layer 455 to have a thickness that is less than or equal to about 0.010 inches but is thick enough to completely cover the first surface 452 of the platen interface body 456 to assure that the polishing properties across the surface of the top pad 410 and platen interface assembly 420 stack-up is uniform.

It has been found that when a desirably configured advanced polishing article assembly, which includes a top pad 410, platen interface assembly 420 and releasable bonding layer 455, are placed in compression during polishing (e.g., forces $F_1$ and $F_2$ in FIGS. 3B and 4B), the surface properties (i.e., top surface 455A) of the releasable bonding layer 455 can be selected so as to generate a significant static friction force $F_s$ (See FIG. 4B (e.g., non-dynamic friction force)) which will prevent lateral movement or slip between the top pad 410 and platen interface assembly 420 during a polishing process. The static friction force $F_s = \mu_s \cdot N$, where $\mu_s$ is the static coefficient of friction and N is the normal force applied to the surfaces at which the friction force is being generated. It has also been found that by forming a large enough static friction force $F_s$ (i.e., reaction force $F_s$ (i.e., lower friction force $F_s$ in FIG. 4B)) between the top pad 410 and the platen interface assembly 420 local ridges or creases can be prevented from being formed in the thin top pad 410 due to a generated shear stress formed at the polishing surface of the top pad 410 due to the friction forces (i.e., upper friction force $F_s$ in FIG. 4B) created between the surface of the substrate and retaining ring and the top surface of the top pad 410 during a polishing process. The support supplied to the top pad 410 by the generated static friction force formed at the interface of the top pad 410 and the platen interface assembly 420 is an important factor in preventing damage to the polymer material(s) used to form the polishing surface 412 and pad body 430 of the top pad 410 due to the generated shear stress created by the movement of substrate and retaining ring against the top surface of the top pad 410 during a polishing process. Damage to the polymer materials can include yielding that can cause tearing or stretching of the material used to form the discrete extended elements 440 and pad body 430.

In some embodiments, it is desirable to select the material and surface properties of the top pad 410 at the surface 414 and the material and surface properties of the interface layer 457A at the top surface 455A so that a static friction coefficient (μs) value of between about 1.51 and about 1.65 is achieved by these materials when measured per the ASTM 1894-14 standard. However, it is generally desirable for the measured static friction coefficient to be greater than about 1.51, such greater than 1.58 or even greater than 1.65. The roughness of the surface 414 used to achieve these measured static coefficients of friction had an arithmetical mean height (Sa) value of about 200 micro-inches (μ-in). The top pad 410 used to perform the static friction coefficient measurements included a 0.010 inch thick polypropylene sheet of material that was at a temperature of about 20° C. when measured. Therefore, in one example, it is desirable to select the material and surface properties of the top pad 410 at the surface 414 and the material and surface properties of the interface layer 457A at the top surface 455A so that a static friction force of between about 2.9 Newtons (N) and about 3.2 N be achieved when measured using a 200 gram (g) load as per the ASTM 1894-14 measurement standard. Varying the roughness of the surface 414 that is placed in contact with the top surface 455A of the interface layer 457A will cause the measured coefficients of friction and measured frictional forces to vary. For example, it is believed that smoother surface finish on the surface 414 will cause the measured coefficients of friction and measured frictional forces to increase, likely due to the increase in contact area between the mating surfaces. However, it is believed that the methodology provided herein provides a method of quantifying whether the surface energy of the top surface 455A of the interface layer 457A and/or coefficient of friction created by use of the interface layer 457A is large enough to prevent sliding at the mating surfaces due to the frictional forces created or applied to the polishing surface 412 by the retaining ring and substrate during a normal polishing process. In other words, the frictional forces generated by the retaining ring and substrate during a normal polishing process will be less than the static friction forces that would be generated under the same load.

In one configuration, the surface roughness of surface 414 of the top pad 410 and/or the surface roughness of the surface 456A (FIG. 4B) of the platen interface body 456 are controlled to achieve a large enough static friction force $F_s$ between the surface 414 and the releasable bonding layer 455 to prevent lateral sliding movement between the surface 414 and the top surface 455A of the releasable bonding layer 455. The static friction force can be enhanced by controlling (e.g., increasing) the adhesive strength of the releasable bond formed between the surface of the top pad 410 and the releasable bonding layer 455. In one configuration, surface 456A is purposely altered to achieve an arithmetical mean height (Sa) surface roughness of between about 32 micro-inches and about 1000 μ-in, such as an arithmetical mean height (Sa) from about 64 to about 500 μ-in, an Sa surface roughness of from about 125 to about 500 μ-in or even a Sa surface roughness from about 250 μ-in to about 500 μ-in, to achieve a large enough static friction force between the surface 414 and the releasable bonding layer 455. In this configuration, the large roughness formed on the surface 456A can be used to control the contact area of the releasable bonding layer 455 and the surface 414 due to the non-smooth topography of the releasable bonding layer 455 due to formed roughness on the surface 456A, or protrusion of a portion of the roughness peaks through the releasable bonding layer 455.

It has been found that vacuum forces generated by applying a vacuum pressure to the backside of the top pad is not completely effective in preventing the formation of local ridges or creases in the top pad 410 due to the lateral deformation in the X and/or Y directions of the top pad 410 due to the generated friction forces (i.e., upper friction force $F_s$ in FIG. 4B) created during a polishing process. The unwanted lateral deformation of the top pad 410 during a substrate polishing process can cause damage to the textured polishing surface 412 of the top pad 410 and generate particles at the top pad 410/substrate interface and generate scratches on the surface of the substrate that is being polished. The vacuum generated force created by the fluid management system 232 will also cause the components within the platen interface assembly 420 to compress due to the vacuum generated load, and thus limit their effectiveness in the stack of supporting elements during polishing. The compressed state of the platen interface assembly 420 due to the vacuum generated load can affect the static and dynamic properties of the platen interface assembly 420 due its preloaded state.

While the discussion provided herein generally describes the releasable bonding layer 455 as being preferentially bonded to the platen interface body 456 and thus releasably attached to a lower surface of the top pad 410, this configuration is not intended to be limiting as to the scope of the disclosure provided herein since the releasable bonding layer 455 could alternately be bonded to the lower surface of the top pad 410 so that the releasable bonding layer 455 can alternately be releasably attached to the first surface 452 of the platen interface assembly 420 without limiting the scope of the disclosure provided herein. However, this alternate configuration of the advanced polishing article 123 can have a few drawbacks when it is used in a roll-to-roll configuration. For example, the exposed surface of the releasable bonding layer 455 will be exposed to the polishing environment prior to and after being placed in contact with the platen interface assembly 420 due to the unprotected length of the top pad 410 that extends between the supply and take-up rolls 254 and 252.

Advanced Polish Article Configuration Examples

Referring back to FIGS. 4A-4C, the advanced polishing article 400 includes a top pad 410 having a pad body 430 that is disposed over a platen interface assembly 420 during polishing. The top pad 410 has a textured polishing surface 412 and an opposing bottom surface 414 that define the pad body 430. FIG. 4E is an enlarged schematic side view of a region of the textured polishing surface 412 of the advanced polishing article 400 that is illustrated in FIG. 4A. The textured polishing surface 412 includes a plurality of microfeatures or discrete extended elements 440 extending from the textured polishing surface 412 of the advanced polishing article 400. In one implementation, the textured polishing surface 412 is formed by embossing, machining, additive manufacturing techniques, etching or other methods of forming a raised surface texture on a surface of the top pad 410. In one implementation, the discrete extended elements 440 of the textured polishing surface 412 have an average height "h" from about 1 micron to about 50 microns (e.g., from about 5 microns to about 30 microns, from about 10 microns to about 20 microns, or from about 5 microns to about 10 microns). In some implementations, the texture formed by the raised surface texture has a uniform height across a plane that is parallel to the polishing surface of the top pad 410. A uniform height of discrete extended elements 440 can be defined as substantially all of the discrete extended elements 440 falling within ±20% of an average reduced peak height (Spk), which is discussed further below. In one example, uniform discrete element heights will require substantially all of the discrete extended elements 440 to fall within a range of ±1.2 μm for a reduced peak height (Spk) of 6 μm. Additionally, in some implementations, the texture formed by the raised surface texture is spatially uniform or substantially spatially uniform in a plane that is parallel to the polishing surface of the top pad 410. In some implementations, the discrete extended elements 440 are spatially varied or substantially spatially varied relative to each other in a plane that is parallel to the polishing surface of the top pad 410.

In some implementations, the textured polishing surface has a reduced peak height (Spk) of between about 1 μm and about 30 μm (e.g., between about 1 μm and about 20 μm, between about 1 μm and about 10 μm, between about 4 μm and about 7 μm, between about 5 μm and about 7 μm, between about 4 μm and about 6 μm, or between about 5 μm and about 10 μm).

As illustrated in FIG. 4A, the textured polishing surface 412 may optionally further includes a plurality of macro-features 447 that each include a protruding region 448 that is at least partially surrounded by a recessed region 449. The optional macro-features 447 are significantly larger in height and lateral width than the discrete extended elements 440 formed on the polishing surface 412, such as about two, three or four orders of magnitude larger. The optional macro-features 447 may be formed to enhance the channeling of slurry material during polishing across the polishing surface 412 and between adjacent grooves (e.g., grooves 632, 642, 654, 664, 674, or 684 in FIG. 6A-6G) that are formed across the surface of an advanced polishing article. While FIG. 4A illustrates an advanced polishing article 400 that includes the macro-features 447 this configuration is not intended to limiting as to the disclosure provided herein since an advanced polishing article 400 need not contain the macro-features 447 and thus will have a generally planar polishing surface 412 that includes the plurality of discrete extended elements 440 formed thereon, as illustrated in FIGS. 4B-4C. One will note that the textured polishing surface 412 of the advanced polishing article 400 illustrated in FIGS. 4B-4C similarly includes the plurality of discrete extended elements 440 illustrated in the close-up view of the polishing surface 412 shown in FIG. 4E.

The top pad 410 is typically formed from synthetic materials. Non-limiting examples of suitable synthetic materials include films, such as polymeric or thermoplastic films, webs comprising sustainable polymers, and the like. Suitable precursor webs further include laminates or blends of these materials. In one implementation, the top pad 410 is a polymeric sheet or film. In some non-limiting implementations, the top pad 410 includes a non-porous polymeric material. Suitable polymeric films include thermoplastic films composed of polymeric materials such as polyethylene (PE), polypropylene (PP), polystyrene, polyethylene terephthalate (PET), polymethylmethacrylate (PMMA), polyvinyl alcohol (PVA), polytetrafluoroethylene (PTFE) (e.g., TEFLON), polyamides (e.g., nylon), polyurethane, or combinations thereof. Suitable polymeric films can include blends or mixtures of polymers. In one implementation, the top pad 410 is a polypropylene-based sheet. In one embodiment, the top pad 410 essentially comprises polypropylene (PP).

In some implementations, the advanced polishing article described herein may be formed from a polymeric material that is substantially transparent and thus is able to transmit at least about 25% (e.g., at least about 50%, at least about 80%, at least about 90%, or at least about 95%) light transmission over the wavelength range of the light beam used by the end point detection system's optical detector. Typical optical end point detection wavelength ranges include the visible spectrum (e.g., from about 400 nm to about 800 nm), the ultraviolet (UV) spectrum (e.g., from about 280 nm to about 400 nm), and/or the infrared spectrum (e.g., from about 800 nm to about 1550 nm). In one implementation, the advanced polishing article is formed from a polymeric material that has a transmittance of >35% at wavelengths between 280-800 nm. In one implementation, the advanced polishing article is formed from a polymeric material that has a transmittance of >35% at wavelengths between 280-399 nm, and a transmittance of >70% at wavelengths between 400-800 nm. In some implementations, the advanced polishing article is formed from a polymeric material that has a low refractive index that is about the same as that of the polishing slurry and has a high optical clarity to reduce reflections from the air/pad/water interface and improve transmission of the light through the advanced polishing article to and from the substrate. In some implementations, the advanced polishing article is formed from a polymeric material that that does not yellow or amber due to long term exposure to one or more wavelengths (e.g., UV wavelengths) of the optical inspection beam.

In some implementations, the thickness "T" of the pad body 430 of the top pad 410 will typically range from about 0.001 inches to about 0.035 inches. In some implementations, the thickness "T" of the pad body 430 will typically range from about 0.001 inches (0.0254 mm) to about 0.025 inches (0.635 mm) (e.g., from about 0.012 inches (0.305 mm) to about 0.025 inches, from about 0.015 inches (0.381 mm) to about 0.020 inches (0.508 mm), from about 0.003 inches (0.076 mm) to about 0.019 inches (0.483 mm), from about 0.006 inches (0.152 mm) to about 0.018 inches (0.460 mm), or from about 0.010 inches (0.254 mm) to about 0.017 inches (0.432 mm)). In other implementations, the thickness "T" of the pad body 430 is less than or equal to about 0.64 mm, less than or equal to about 0.51 mm, or less than or equal to about 0.48 mm, or even less than or equal to about 0.46 mm. Depending upon the desired properties of the top pad 410, other suitable thicknesses may be used.

In one implementation, the top pad 410 includes a single layer of material that is formed in a sheet. In another implementation, the top pad 410 includes a laminate of two or more materials, and can be a co-extruded laminated assembly. For example, the top pad 410 can include two or more layers, such as the top pad 410 can include three layers, wherein the innermost layer is referred to as a core layer and the two outermost layers are referred to as skin layers. In one implementation, the top pad 410 includes a two layer coextruded laminate having an overall thickness ranging from about 0.001 inches to about 0.035 inches. In some implementations, the top pad 410 includes a two layer coextruded laminate having an overall thickness ranging from about 0.001 inches to about 0.025 inches, or from about 0.003 inches to about 0.018 inches, or from about 0.006 inches to about 0.018 inches, or from about 0.010 inches to about 0.017 inches, or from about 0.012 inches to about 0.016 inches.

In one implementation, the layers of the laminate version of the top pad 410 can include polymer layers or sheets that each have different mechanical properties, such as stress-strain, elastic properties and/or dynamic mechanical properties. The top pad 410 can be made using conventional procedures for producing polymeric films. The textured polishing surface 412 and an opposing bottom surface 414 of top pad 410 can each be textured using one or more procedures used to form these features (e.g., discrete extended elements 440), such as etching or a mechanical process, such as embossing of the surface of the polymeric films.

The plurality of discrete extended elements 440 are formed as protruded extensions of the top pad 410, generally on the textured polishing surface 412 thereof. The number, size, and distribution of the plurality of discrete extended elements 440 on the textured polishing surface 412 can be predetermined based on the desired polishing characteristics of the top pad 410. For most polishing applications, it can be desired that the plurality of discrete extended elements 440 protrude only from one surface (e.g., the top surface) of the top pad 410. In some implementations, the top pad 410 includes a random, semi-random, or uniform (e.g., long range repeating) texture of micro-features (e.g., discrete extended elements 440) having substantially similar heights and a varying lateral spacing.

Referring to FIGS. 4A-4C and 4E, in some implementations, the plurality of discrete extended elements 440 can be described as protruding from the polishing surface 412 of the pad body 430. As such, the plurality of discrete extended elements 440 can be described as being integral with the pad body 430. In some implementations, the plurality of discrete extended elements 440 are formed by permanent local plastic deformation of the pad body 430. In some implementations, the plurality of discrete extended elements 440 are formed using molding manufacturing techniques. The plurality of discrete extended elements 440 can be described as having a sidewall(s) 442 defining an open proximal portion and an open or closed distal end 444. The discrete extended elements 440 each have a height "h" (FIG. 4E) measured from a minimum amplitude "$A_{min}$" between adjacent extended elements to a maximum amplitude "$A_{max}$" at the open or closed distal end 444. The plurality of discrete extended elements 440 can have a diameter "d," which for a generally cylindrical structure is the outside diameter at a lateral cross-section. By "lateral" is meant generally parallel to the plane (i.e., X-Y plane in FIG. 4A) of the polishing surface 412. For generally columnar discrete extended elements 440 having non-uniform lateral cross-sections, and/or non-cylindrical structures of discrete extended elements 440, diameter "d" may be measured as the average lateral cross-sectional dimension at ½ the height "h" of the discrete extended element. Thus, for each discrete extended element, an aspect ratio, defined as h/d, can be determined. The discrete extended element can have an aspect ratio h/d of at least about 0.2, at least about 0.3, at least about 0.5, at least about 0.75, at least about 1, at least about 1.5, at least about 2, at least about 2.5, or at least about 3. In one implementation, the plurality of discrete extended elements 440 will typically have a height "h" of within one order of magnitude of the features removed from the substrate during polishing. The plurality of discrete extended elements 440 will typically have a height "h" of at least about 1 micrometer to 100 micrometers (e.g., from about 5 micrometers to about 50 micrometers, from about 5 micrometers to about 30 micrometers, from about 5 micrometers to about 20 micrometers, from about 5 micrometers to about 10 micrometers, or from about 1 micrometer to about 10 micrometers). The discrete extended elements 440 will typically have a diameter "d" of about 1 micrometer to about 1,000 micrometers, about 5 micrometers to about 500 micrometers, about 5 micrometers to about 200 micrometers, about 65 micrometers to about 100 micrometers, or about 75 micrometers to about 100 micrometers.

In general, because the actual height "h" of any individual discrete extended element can be difficult to determine, and because the actual height may vary, an average height "$h_{avg}$" of a plurality of discrete extended elements 440 can be determined by determining an average minimum amplitude "$A_{min}$" and an average maximum amplitude "$A_{max}$" over a predetermined area of the textured polishing surface 412, where the dimensions are measured from a surface that is half of the average peak-to-peak (e.g., average peak-to-valley) variation of the surface. Such average height "$h_{avg}$" will typically fall within the ranges of heights described above. Likewise, for varying cross-sectional dimensions, an average diameter "$d_{avg}$" can be determined for a plurality of discrete extended elements 440. Such average diameter "$d_{avg}$" will typically fall within the ranges of diameters described above. Such amplitude and other dimensional measurements can be made by any method known in the art, such as by computer aided scanning microscopy and data processing. Therefore, an average aspect ratio "$AR_{avg}$" of the discrete extended elements 440 for a predetermined portion of the embossed top pad 410 can be expressed as $h_{avg}/d_{avg}$.

In one implementation, the diameter of a discrete extended element 440 is constant or decreases with increasing amplitude (amplitude increases to a maximum at closed or open distal end 444). The diameter, or average lateral cross-sectional dimension, of the discrete extended elements 440 can be a maximum at proximal portion and the lateral cross-sectional dimension steadily decreases to distal end 444. In another implementation, the diameter of the discrete extended elements 440 increases with increasing amplitude. For example, the discrete extended elements 440 can have a mushroom shape.

The "area density" of the discrete extended elements 440, which is the number of discrete extended elements 440 per unit area of the textured polishing surface 412, can be optimized. In one implementation, the textured polishing surface 412 includes about 4 to about 10,000, about 95 to about 10,000, about 240 to about 10,000, about 350 to about 10,000, about 500 to about 5,000, or about 700 to about 3,000 discrete extended elements 440 per square centimeter of the textured polishing surface 412. In general, the center-to-center spacing can be optimized for adequate retention of polishing slurry, while at the same time minimizing entrapment of particulates, such as materials removed from the polished substrate, between discrete extended elements 440. The center-to-center spacing between adjacent discrete extended elements 440 can be about 100 micrometers to about 1,000 micrometers, about 30 micrometers to about 800 micrometers, about 150 micrometers to about 600 micrometers, or about 180 micrometers to about 500 micrometers.

Techniques and systems for characterizing surface roughness are well known in the art. For example, a portion of the surface can be characterized by any suitable method (e.g., by electron microscope image analysis, by atomic force microscopy, by 3D microscopy, etc.). In one implementation, the roughness analysis can be performed using a VK-X Series 3D UV Laser Scanning Microscope with 0.5 nm Z-axis resolution, produced by KEYENCE Corporation of America, located in Elmwood Park, N.J., U.S.A. The following parameters were determined by means of a surface shape measurement microscope (e.g., an ultra-deep shape measurement apparatus, product of KEYENCE Corporation of America, located in Elmwood Park, N.J., U.S.A.).

Characteristics of some implementations of the advanced polishing article are further described in Table 1 below.

TABLE I

| Number | Description | Embossing area (Sdr) % | Embossing Span (μm) | Sa (μm) | Sp (μm) | Sv (μm) | Spk (μm) |
|---|---|---|---|---|---|---|---|
| 1. | New Pad | 61.9 | 20-40 | 6.73 | 50.4 | 72.4 | 5.75 |
| 2. | Used Pad | 64.7 | 20-40 | 4.95 | 30 | 34.3 | 5.2 |

Embossing area (%), or the Sdr (i.e., developed interfacial area ratio) value, is an indicator of film surface roughness as specified in ISO 25178. Sdr is expressed as the percentage of additional surface area contributed by the texture as compared to an ideal plane the size of the measurement region. For example, an interface having large surface area irregularities, within a defined measurement region, has a large Sdr value, whereas the Sdr value of a completely level surface, within a measurement region of the same size, is zero. The Sdr value was measured using a laser scanning confocal microscope (e.g., KEYENCE). In some implementations, the textured polishing surface has an Sdr of less than 70% (e.g., less than 60%, less than 50%, or less than 40%). In some implementations, the textured polishing surface has an Sdr of between about 5% to about 70%, such as between about 10% to about 65%, between about 20% to about 50%, between about 20% to about 40%, between about 60% to about 65%, between about 55% to about 60%, or between about 40% to about 50%. Not to be bound by theory but it is believed that when the Sdr is 70% or less, the textured polishing surface has a surface roughness, which satisfactorily retains polishing slurry while removing an amount of desirable material, whereas when the Sdr is more than 70%, slurry retention and polishing characteristics suffer. While the phrase "embossing area" is used to describe a property of the polishing surface of the polishing pad the use of this phrase is not intended to limit the characterized surfaced properties of the described features or texture formed on a polishing surface to only features or texture that are formed by an embossing process, and thus "embossing area" can be used to describe features or texture formed by any desirable feature or texture formation method.

In general, embossing span, which is also referred to herein as a "feature span," is a measure of the average distance between peaks of a roughened surface within a measurement area. In some implementations, the textured polishing surface has an "embossing span" of less than 90 μm, such as less than 80 μm, or less than 70 μm, or less than 60 μm. In some implementations, the textured polishing surface has an embossing span between about 5 μm and about 80 μm, such as between about 10 μm and about 70 μm, or between about 10 μm and about 60 μm, or between about 20 μm and about 40 μm. Not to be bound by theory but it is believed that when the embossing span is 80 μm or less, the textured polishing surface has an embossing span, which satisfactorily retains polishing slurry while removing an amount of desirable material, whereas when the embossing span is more than 90 μm, slurry retention and polishing characteristics suffer. As similarly discussed above, while the phrase "embossing span" or "feature span" is used to describe a property of the polishing surface of the polishing pad the use of this phrase is not intended to limit the characterized surfaced properties of the described features or texture formed on a polishing surface to only features or texture that are formed by an embossing process, and thus "embossing span" can be used to describe features or texture formed by any desirable feature or texture formation method.

The arithmetical mean height (Sa) is an indicator of film surface roughness as specified in ISO 25178. Sa is the extension of Ra (arithmetical mean height of a line) to a surface. Sa expresses, as an absolute value the difference in height of each point compared to the arithmetical mean of the surface. In some implementations, the textured polishing surface has an arithmetical mean height (Sa) of less than 30 μm (e.g., less than 20 μm, less than 10 μm, or less than 5 μm). In some implementations, the textured polishing surface has an arithmetical mean height (Sa) of between about 1 μm and about 30 μm (e.g., between about 1 μm and about 20 μm, between about 1 μm and about 10 μm, between about 2 μm and about 7 μm, between about 4 μm and about 7 μm, between about 5 μm and about 7 μm, between about 4 μm and about 6 μm, or between about 5 μm and about 10 μm). In some implementations, the textured polishing surface has an arithmetical mean height (Sa) of less than about 10 μm, such as less than about 7 μm, or even less than about 5 μm.

The maximum peak height (Sp) is an indicator of film surface roughness as specified in ISO 25178. Maximum peak height (Sp) indicates the highest peak within the defined area. In some implementations, the textured polishing surface has a maximum peak height (Sp) of less than 60 μm (e.g., less than 50 μm, less than 40 μm, or less than 30 μm). In some implementations, the textured polishing surface has a maximum peak height (Sp) of between about 5 μm and about 60 μm (e.g., between about 10 μm and about 50 μm, between about 20 μm and about 50 μm, between about 40 μm and about 50 μm, between about 40 μm and about 60 μm, between about 30 μm and about 50 μm, or between about 20 μm and about 40 μm).

The maximum pit height (Sv) is an indicator of film surface roughness as specified in ISO 25178. Maximum pit height (Sv) indicates the absolute value of the largest pit within a defined area. The maximum pit height (Sv) represents a depth of the deepest valley observed in a portion of the roughness profile curve corresponding to an evaluation length (L) along the mean line. The term "valley" means a dented portion observed in a depth profile under the mean line. In some implementations, the textured polishing surface has a maximum pit height (Sv) of less than 80 μm (e.g., less than 70 μm, less than 60 μm, less than 50 μm, less than 40 μm, or less than 30 μm). In some implementations, the textured polishing surface has a maximum pit height (Sv) of between about 20 μm and about 80 μm (e.g., between about 30 μm and about 80 μm, between about 70 μm and about 80 μm, between about 30 μm and about 70 μm, between about 30 μm and about 50 μm, or between about 40 μm and about 50 μm).

Grid height, or Spk (reduced peak height) is an indicator of film surface roughness as specified in ISO 25178. Reduced peak height (Spk) is a measure of the average height of a protruding peak above the mean peak-to-peak value. In some implementations, the textured polishing surface has a reduced peak height (Spk) of less than 30 μm (e.g., less than 20 μm, less than 10 μm, or less than 5 μm). In some implementations, the textured polishing surface has a reduced peak height (Spk) of between about 1 μm and about 30 µm (e.g., between about 1 µm and about 20 µm, between about 1 µm and about 10 µm, between about 4 µm and about 7 µm, between about 5 µm and about 7 µm, between about 4 µm and about 6 µm, or between about 5 µm and about 10 µm).

It has been found that the process results achieved by use of an advanced polishing article of the type described herein are dependent on assuring that the surface texture formed on the polishing surface has properties that fall within desired ranges of at least one or more of the measured values described above. However, it has been found that assuring that the surface texture has only one of the measured values described above within a desired range is generally not enough to adequately assure that good polishing process results can be achieved. One will appreciate that the surface properties of the advanced polishing article may need to be formed so that they fall within desired ranges of at least two or more of the parameters described above. Examples of combinations of measured values that can be used to provide desirable process results on dielectrics (e.g., oxides, nitrides, etc.) or metal (e.g., tungsten, copper, etc.) semiconductor wafers are outlined below.

In one implementation, the advanced polishing article has a rough polishing surface having at least one of: an embossing area of 45% to 65%, an embossing span of 20 µm to 40 µm, an average peak density of 30 to 35 per one millimeter, an arithmetical mean height (Sa) of 4 µm to 7 µm, a maximum peak height (Sp) of 30 µm to 50 µm, and a maximum pit height (Sv) of 30 µm to 80 µm.

In another implementation, the advanced polishing article has a rough polishing surface having an embossing span of 20 µm to 40 µm, an average peak density of 30 to 35 per one millimeter, and an arithmetical mean height (Sa) of 4 µm to 7 µm.

In yet another implementation, the advanced polishing article has a rough polishing surface having an embossing area of less than 70%, an embossing span less than 40 µm, an average peak density greater than 30 per one millimeter, and an arithmetical mean height (Sa) of less than 10 µm.

In yet another implementation, the advanced polishing article has a rough polishing surface having at least one of: an embossing area of 60% to 65%, an embossing span of 20 µm to 40 µm, an average peak density of 30 to 35 per one millimeter, an arithmetical mean height (Sa) of 5 µm to 7 µm, a maximum peak height (Sp) of 40 µm to 60 µm, and a maximum pit height (Sv) of 70 µm to 80 µm.

In yet another implementation, the advanced polishing article has a rough polishing surface having at least one of: an embossing area of 60% to 65%, an embossing span of 20 µm to 40 µm, an average peak density of 30 to 35 per one millimeter, an arithmetical mean height (Sa) of 4 µm to 6 µm, a maximum peak height (Sp) of 20 µm to 40 µm, and a maximum pit height (Sv) of 30 µm to 50 µm.

In yet another implementation, the advanced polishing article has a rough polishing surface having at least one of: an embossing area of 55% to 60%, an embossing span of 20 µm to 40 µm, an average peak density of 30 to 35 per one millimeter, an arithmetical mean height (Sa) of 5 µm to 7 µm, a maximum peak height (Sp) of 40 µm to 50 µm, and a maximum pit height (Sv) of 40 µm to 50 µm.

In yet another implementation, the advanced polishing article has a rough polishing surface having at least one of: an embossing area of 40% to 50%, an embossing span of 20 µm to 40 µm, an average peak density of 30 to 35 per one millimeter, an arithmetical mean height (Sa) of 4 µm to 6 µm, a maximum peak height (Sp) of 40 µm to 50 µm, and a maximum pit height (Sv) of 40 µm to 50 µm.

Alternate Top Pad Configuration Examples

According to implementations described herein, the top pad 410 is relatively thin and a platen interface, such as the integral interface layer 250 shown in FIG. 2, is utilized to increase the mechanical integrity of the polishing article 400 and/or provide the necessary compliance to improve and/or adjust the polishing performance of the polishing article 400. Additionally or alternatively, the hardness and/or structure of the integral interface layer 250 may provide additional compliance to the polishing article 400 during polishing.

In one alternate implementation, the integral interface layer 250 is disposed on the surface 414 of the top pad 410, which is disposed within the polishing article 400. In one implementation, the integral interface layer 250 is made of a polymeric material. In another implementation, the integral interface layer 250 is configured to include at least one layer that is similar to the first platen interface 450, the optional second platen interface 460, and the third platen interface 470, and thus the redundant platen interface assembly 420 components that would be disposed on the subplate 238 (FIG. 2) or platen assembly (not shown) need not be present. In one implementation, the platen interface is a multilayer platen interface. In one implementation, the platen interface has a thickness from about 0.005 inches to about 0.070 inches (e.g., from about 0.006 inches to about 0.060 inches, from about 0.010 inches to about 0.050 inches, or from about 0.030 inches to about 0.050 inches). In some implementations, the top pad 410 can subsequently be adhered to a portion of the platen interface assembly 420. In some implementations, the top pad 410 is separate from the platen interface assembly 420.

FIG. 5A is an enlarged schematic side view of another implementation of an advanced polishing article 500, according to one or more implementations described herein. In one implementation, the advanced polishing article 500 is used in place of either advanced polishing article 123 or advanced polishing article 323. The advanced polishing article 500 includes a top pad assembly 510 having a textured polishing surface 512 and optionally, the platen interface assembly 420 is positioned below the top pad assembly 510. The top pad assembly 510 includes a top pad layer 530 and a bottom pad layer 520. Although the platen interface assembly 420 is depicted as being adhered to a bottom surface 514 of the bottom pad layer 520, in some implementations where the advanced polishing article 500 is used in a web polishing system (e.g., roll-to-roll configuration shown in FIG. 2) the optional platen interface assembly 420 is separate from the top pad assembly 510, similar to the platen interface element 240 being separated from the advanced polishing article 123 depicted in FIG. 2.

In an alternate roll-to-roll implementation, the advanced polishing article 500 is formed so that the optional platen interface assembly 420 is made integral with the top pad assembly 510, similar to integral interface layer 250 being integral with the advanced polishing article 123 depicted in FIG. 2.

The advanced polishing article 500 is similar to the advanced polishing article 400 except that the advanced polishing article 500 has a two-layer top pad assembly 510. The top pad assembly 510 includes the top pad layer 530 and the bottom pad layer 520. The top pad layer 530 has a textured polishing surface 512 similar to textured polishing surface 412 and includes a plurality of macro-features and grooves 532 formed in the textured polishing surface 512. The bottom pad layer 520 is a contiguous layer. The top pad layer 530 and the bottom pad layer 520 may be adhered together by any suitable attachment methods (e.g., laminating, thermal bonding, gluing, double-sided tape, pressure sensitive adhesives, etc.). In some alternate implementations, the top pad layer 530 and the bottom pad layer 520 may be manufactured as a unitary pad that has the grooves 532 partially extending therethrough. The unitary pad can have a total thickness that is about 0.001 inches to about 0.025 inches, such as from about 0.010 inches to about 0.020 inches, or from about 0.010 inches to about 0.018 inches. In either case, the grooves 532 formed in the top pad layer 530 are at least partially defined by sidewalls 532A that extend from the polishing surface 512, and at least through a portion of the pad body 534. Edges 532B, which are formed on either side of a groove 532, are formed at the junction of the sidewalls 532A of the groove 532 and the polishing surface 512.

The grooves 532 formed in the top pad layer 530 can function as local reservoirs for the polishing slurry during a polishing process. The grooves 532 may be formed in the top pad layer 530 using any suitable groove forming methods (e.g., laser cutting, water jet cutting, die cutting, stamping, punch press, etc.). The contiguous bottom pad layer 520 prevents liquids such as polishing slurry or water from penetrating the bottom pad layer 520. In this configuration, the grooves 532 formed through the top pad layer 530 become local reservoirs for the polishing slurry, since the slurry is retained in the formed grooves and the polishing slurry will generally not penetrate the bottom pad layer 520. For multiple reasons including holding down the pad during polishing and polisher cleanliness, it is undesirable for the slurry to penetrate the top pad assembly 510 through grooves 532 in the top pad layer 530 and into the platen interface assembly 420 components.

As illustrated in FIG. 5A, the textured polishing surface 512 may also optionally further includes a plurality of macro-features 547 that each include a protruding region 548 that is at least partially surrounded by a recessed region 549. As with the macro-features 447 formed in the polishing surface 412, the optional macro-features 547 are significantly larger in height and lateral width than a plurality of discrete extended elements 540 formed on the polishing surface 512, such as about two, three or four orders of magnitude larger. While FIG. 5A illustrates an advanced polishing article 500 that includes the macro-features 547 this configuration is not intended to limiting as to the disclosure provided herein since an advanced polishing article 500 need not contain the macro-features 547 and thus will have a generally planar polishing surface 512 that includes the plurality of discrete elements 540 formed thereon.

FIG. 5B is an enlarged schematic side view of a region of the textured polishing surface 512 of the top pad layer 530 of the advanced polishing article 500 that is illustrated in FIG. 5A. The top pad layer 530 has the textured polishing surface 512 and an opposing bottom surface 536 that define a pad body 534. Similar to textured polishing surface 412, the textured polishing surface 512 includes a plurality of micro-features, or discrete extended elements 540, that define the textured polishing surface 512 of the advanced polishing article 500. The plurality of discrete extended elements 540 can be described as having a sidewall(s) 542 defining an open proximal portion and an open or closed distal end 544. In one implementation, the discrete extended elements 540 of the textured polishing surface 512 have an average height "h" from about 1 micron to about 50 microns (e.g., from about 1 micron to about 30 microns, from about 5 microns to about 30 microns, from about 10 microns to about 20 microns, or from about 5 microns to about 10 microns). In one implementation, the raised surface texture is formed using an embossing process. In one implementation, the texture formed by the raised surface texture is uniform or substantially uniform.

The top pad layer 530 typically includes synthetic materials. Non-limiting examples of suitable synthetic materials include films, such as polymeric or thermoplastic films, webs comprising sustainable polymers, and the like. Suitable precursor webs further include laminates or blends of these materials. In one implementation, the top pad layer 530 is a polymeric sheet or film. Suitable polymeric films include thermoplastic films formed from materials such as polyethylene (PE), polypropylene (PP), polystyrene, polyethylene terephthalate (PET), polymethylmethacrylate (PMMA), polyvinyl alcohol (PVA), polyamides (e.g., nylon), polytetrafluoroethylene (PTFE) (e.g., TEFLON), polyam ides, polyurethane, or combinations thereof. Suitable polymeric films can include blends or mixtures of polymers. In one implementation, the top pad layer 530 is a polypropylene-based sheet. In one embodiment, the top pad layer 530 essentially comprises polypropylene (PP).

According to one or more embodiments of the disclosure, the pad body 430 or pad body 534 and/or bottom pad body 524 of the top pad 410 or top pad 510, respectively, can be formed by an additive manufacturing process, such as a three-dimensional (3D) printing process. Embodiments of the present disclosure provide an advanced polishing article that has discrete features and geometries, formed from one or more materials that are formed from precursors, or resin precursor compositions, that contain "resin precursor components" that include, but are not restricted to functional polymers, functional oligomers, monomers, reactive diluents, flow additives, curing agents, photoinitiators, and cure synergists. The resin precursor components may also include chemically active materials and/or compounds such as functional polymers, functional oligomers, monomers, and reactive diluents that may be at least monofunctional, and may undergo polymerization when exposed to free radicals, Lewis acids, and/or electromagnetic radiation. As one example, an advanced polishing article may be formed from a plurality of polymeric layers, by the automated sequential deposition of at least one resin precursor composition followed by at least one curing step, wherein each layer may represent at least one polymer composition, and/or regions of different compositions. In some embodiments, the layers and/or regions of the advanced polishing pad may include a composite material structure, such as a radiation cured polymer that contains at least one filler, such as metals, semimetal oxides, carbides, nitrides and/or polymer particles. In some embodiments, the layers and/or regions of the advanced polishing pad may include a composite material structure that includes a material selected from a group consisting of polyethylene (PE), polypropylene (PP), polystyrene, polyethylene terephthalate (PET), polymethylmethacrylate (PMMA), polyvinyl alcohol (PVA), polytetrafluoroethylene (PTFE), polyamides (e.g., nylon) and polyurethane. In one embodiment, the advanced polishing pad includes a polymeric material that comprises greater than 50% polypropylene (PP), such as greater than 70% polypropylene (PP), or greater than 90% polypropylene (PP), or greater than 99% polypropylene (PP). In one embodiment, the advanced polishing pad essentially comprises polypropylene (PP).

The top pad layer 530 of the top pad assembly 510 prior to texturing will typically have a thickness "$T_{TL}$" in a range from about 0.001 inches to about 0.025 inches (e.g., from about 0.012 inches to about 0.025 inches, from about 0.015 inches to about 0.025 inches, from about 0.003 inches to about 0.017 inches, from about 0.006 inches to about 0.017 inches, or from about 0.010 inches to about 0.015 inches). Depending upon the desired properties of the top pad assembly 510, other suitable thicknesses may be used.

In some implementations, the plurality of grooves 532 pass, preferably transversely or nearly transversely, entirely through the thickness "$T_{TL}$" of the pad body 534 of the top pad layer 530 of the top pad assembly 510. However, the top pad layer 530 may employ grooves, which do not pass all of the way through the thickness "$T_{TL}$" of the top pad layer 530 but extend into the top pad layer 530 from the textured polishing surface 512 to a desired distance into the pad body 534 of the top pad layer 530. In one implementation, the groove 532 has a depth of between about 0.003 inches to about 0.025 inches, for example, about 0.010 inches. In some implementations, a bottom surface of the grooves 532 extends from the polishing surface 512 to a depth that is less than the thickness of the pad body 534. In some implementations, where the plurality of grooves 532 extend entirely through the thickness "$T_{TL}$" of the pad body 534 a top surface 522 of the bottom pad layer 520 defines the bottom of the grooves 532. In one implementation, the groove 532 extends through the top pad assembly 510, such as from the textured polishing surface 512 to the bottom surface 514.

In one implementation, the groove 532 has a width between about 0.05 inches and about 0.50 inches (e.g., between about 0.10 inches to about 0.40 inches, between about 0.15 inches to about 0.30 inches, between about 0.15 inches to about 0.20 inches, or between about 0.18 inches to about 0.20 inches). In one implementation, the spacing between adjacent grooves 532 is between about 0.5 inches and about 2.5 inches (e.g., between about 1 inch to about 2 inches, between about 1 inch to about 2 inches, or between about 1 inch to about 1.5 inches).

The bottom pad layer 520 has a top surface 522 and the opposing bottom surface 514 that define a bottom pad body 524. In some implementations, the top surface 522 is textured. The texture of the top surface 522 may be similar to the texture of textured polishing surface 412 and textured polishing surface 512. In some implementations, where the bottom of the grooves 532 are defined by the top surface 522 of bottom pad layer 520. In some configurations, the top surface 522 is textured such that at least the exposed portion of the bottom pad body 524 at the bottom surface of the grooves 532 is textured. Not to be bound by theory but it is believed that texturing the region of the exposed portion of the bottom pad body 524 at the bottom surface of the grooves 532 helps retain polishing slurry in the grooves since the exposed textured portion will tend to act as an impediment to the fluid like motion of the slurry during processing, and thus "grip" the slurry.

The bottom pad layer 520 of the top pad assembly 510 will typically have a thickness "$T_{TL}$" in a range from about 0.001 inches to about 0.025 inches (e.g., from about 0.003 inches to about 0.017 inches, from about 0.006 inches to about 0.017 inches, or from about 0.010 inches to about 0.015 inches). Depending upon the desired properties of the top pad assembly 510, other suitable thicknesses may be used.

The bottom pad layer 520 typically includes synthetic materials. Non-limiting examples of suitable synthetic materials include films, such as polymeric or thermoplastic films, webs comprising sustainable polymers, and the like. Suitable precursor webs further include laminates or blends of these materials. In one implementation, the bottom pad layer 520 is a polymeric sheet or film. Suitable polymeric films include thermoplastic films composed of materials such as polyethylene (PE), polypropylene (PP), polystyrene, polyethylene terephthalate (PET), polymethylmethacrylate (PMMA), polyvinyl alcohol (PVA), polytetrafluoroethylene (PTFE) (e.g., TEFLON), polyamides (e.g., nylon), polyurethane, or combinations thereof. Suitable polymeric films can include blends or mixtures of polymers. In one implementation, the bottom pad layer 520 is a polypropylene-based sheet.

In some implementations, the top pad layer 530 is adhered to the bottom pad layer 520 by any suitable attachment methods (e.g., laminating, gluing, double-sided tape, pressure sensitive adhesives, etc.). For example, the top surface 522 of the bottom pad layer 520 may be adhered to the bottom surface 536 of the top pad layer 530.

In some implementations, the top pad assembly 510 is adhered to the platen interface assembly 420 by any suitable attachment methods (e.g., laminating, gluing, double-sided tape, pressure sensitive adhesives, etc.). For example, the first surface 452 of the first platen interface 450 may be adhered to the bottom surface 514 of the bottom pad layer 520.

In some implementations, a layer of silicone on the first surface 452 of the first platen interface 450 couples the platen interface assembly 420 with the top pad assembly 510 during polishing but with the benefit of allowing the platen interface assembly 420 and the top pad assembly 510 to release from each other when not under polishing load thereby allowing the polishing pad to advance between wafers. In some implementations, the silicone is 40-50 durometer Shore A silicone, which when placed under compression, offers extremely high lateral friction effectively coupling the platen interface assembly 420 and bottom surface 514 of the top pad assembly 510 together as if they were a single article.

In some implementations, the first surface 452 of the first platen interface 450 is releasably adhered to the bottom surface 514 of the top pad assembly 510 by a releasable attachment layer similar to the releasable bonding layer 455 (FIGS. 4B-4C) as is discussed herein. In this configuration, the platen interface assembly 420 is fixedly attached, bonder or adhered to the surface of the platen assembly (not shown) disposed below the platen interface assembly 420.

FIG. 6A is a schematic top view of an advanced polishing article 600a having a textured polishing surface 612 with grooves 632 formed therein. In one implementation, the advanced polishing article 600a may form part of or be used in place of the advanced polishing article 123, the advanced polishing article 323, the advanced polishing article 400 or the advanced polishing article 500. The textured polishing surface 612 may be similar to the texture of textured polishing surface 412 and textured polishing surface 512, as illustrated in FIGS. 4E and 5B. The grooves 632 may have similar physical dimensions and properties as the grooves 532 of advanced polishing article 500, as is discussed above. The pattern of grooves 632 of the advanced polishing article 600a includes 2-directional grooves (e.g., grooves extending in both the x-direction and the y-direction). Although an X-Y groove pattern is depicted in FIG. 6A, the implementations described herein contemplate other groove patterns including sinusoidal, sawtooth, spiral, hexagonal, circular, and any other groove pattern that allows for the "venting" of polishing slurry trapped under the substrate 122 being polished during a polishing process. In addition, although the edges of each of the grooves 632 are depicted as straight edges, it should be understood that the implementations described herein contemplate other edge designs including one or more curved edges, circular edges, sinusoidal edges, and any other non-straight edges. Configuring the shape of the edges of the groove is beneficial to prevent the edges of the polishing article (e.g., substrate or wafer) that is being moved relative to the pad surface during polishing from colliding with an edge of a groove (e.g., trailing edge of the groove) as the article is pressed against the pad surface and is moved in a direction that is transverse (e.g., non-parallel direction) to the groove and groove edges. Not to be bound by theory but it is believed that the grooves should communicate with an area not under the substrate being polished such that excess polishing slurry under the substrate can be pushed out from under the substrate during the polishing process.

In some implementations, it is desirable to assure that the horizontal groove length 621 (e.g., length within the X-Y plane), the groove orientation relative to the axis of movement 625 of the substrate during polishing, the groove orientation relative to the axis (i.e., index axis 626 in FIG. 6C) that the advanced polishing article is indexed in a roll-to-roll pad configuration, and the groove pattern of a large percentage of grooves formed in the advanced polishing article is configured to provide a path for slurry trapped under a substrate that is being polished to escape. It is believed that providing an escape path for the slurry trapped under the moving substrate will allow the substrate to more uniformly contact the peaks of the texture formed on the surface of the advanced polishing article, since the incompressible nature of most aqueous slurry materials tends to cause the substrate to "hydroplane" across the advanced polishing article surface if an escape path for the slurry is not provided. Therefore, in some implementations, the advanced polishing article includes at least one groove that is longer than the major dimension D (FIG. 6C) of the substrate (e.g., diameter of a round semiconductor substrate), and in some cases the outer diameter of the retaining ring 309 that surrounds the substrate 122 during processing. In some implementations, the advanced polishing article includes two or more grooves that are oriented relative to each other so that at least a portion of each groove extends past an edge of the substrate at all times while the substrate is moved relative to the advanced polishing article. In one implementation, two or more grooves are oriented relative to each other so that the two or more grooves each extend past the edge of the substrate in opposing directions as the substrate is moved relative to the advanced polishing article during processing.

FIG. 6B is a schematic top view of an advanced polishing article 600b having a textured polishing surface 622 with grooves 642 formed therein. In one implementation, the advanced polishing article 600b may form part of or be used in place of the advanced polishing article 123, the advanced polishing article 323, the advanced polishing article 400, or the advanced polishing article 500. The textured polishing surface 622 may be similar to the texture of textured polishing surface 412 of advanced polishing article 400 and textured polishing surface 512 of advanced polishing article 500. The grooves 642 are similar to grooves 532 of advanced polishing article 500. The grooves 642 of the advanced polishing article 600b form a sawtooth pattern of grooves 642.

FIG. 6C is a schematic top view of a portion of a roll-to-roll type of an advanced polishing article 600c having a textured polishing surface 652 that includes an array of grooves 654 formed therein. In one implementation, the advanced polishing article 600c may form part of or be used in place of the advanced polishing article 123, the advanced polishing article 323, the advanced polishing article 400, or the advanced polishing article 500. The textured polishing surface 652 may be similar to the texture of textured polishing surface 412 of advanced polishing article 400 and textured polishing surface 512 of advanced polishing article 500. The grooves 654 are similar to grooves 532 of advanced polishing article 500. The grooves 654 of the advanced polishing article 600c form a sawtooth pattern of grooves 654 that are aligned perpendicular to the index axis 626 (e.g., perpendicular to the advanced polishing article 600c's length direction) and/or parallel to the axis of movement 625. The grooves 654 extend along the width direction of the advanced polishing article 600d, and are spaced apart in the index axis 626 direction. In one implementation, the grooves 654 have a groove spacing (measured center to center of adjacent grooves) greater than a width of each individual groove. In one implementation, the grooves 654 of the groove pattern have a width of between about 0.030 inches and about 0.190 inches, and a groove spacing or groove pitch (center to center of adjacent grooves) of between about 0.5 inches and about 2.5 inches. In another implementation, the width of each individual groove 654 is greater than the groove spacing between adjacent grooves.

As discussed above, in some implementations, it is desirable to assure that the horizontal groove length 621 (e.g., direction within the X-Y plane), the groove orientation relative to the axis of movement 625 of the substrate during polishing, the groove orientation relative to the axis that the advanced polishing article is indexed in a roll-to-roll pad configuration, and the groove pattern of a large percentage of grooves formed in the advanced polishing article is configured to provide a path for slurry trapped under a substrate that is being polished to escape. In some implementations of an advanced polishing article that is used in a roll-to-roll configuration, it is desirable to assure that the groove pattern and groove orientation relative to the axis of movement 625 of the array of formed grooves (e.g., sawtooth pattern of grooves 654) is such that each substrate that is processed on different portions of the roll of the advanced polishing article will see substantially the same polishing surface and number of grooves even though the polishing pad is incremented a desired distance during polishing.

Figure 6D:
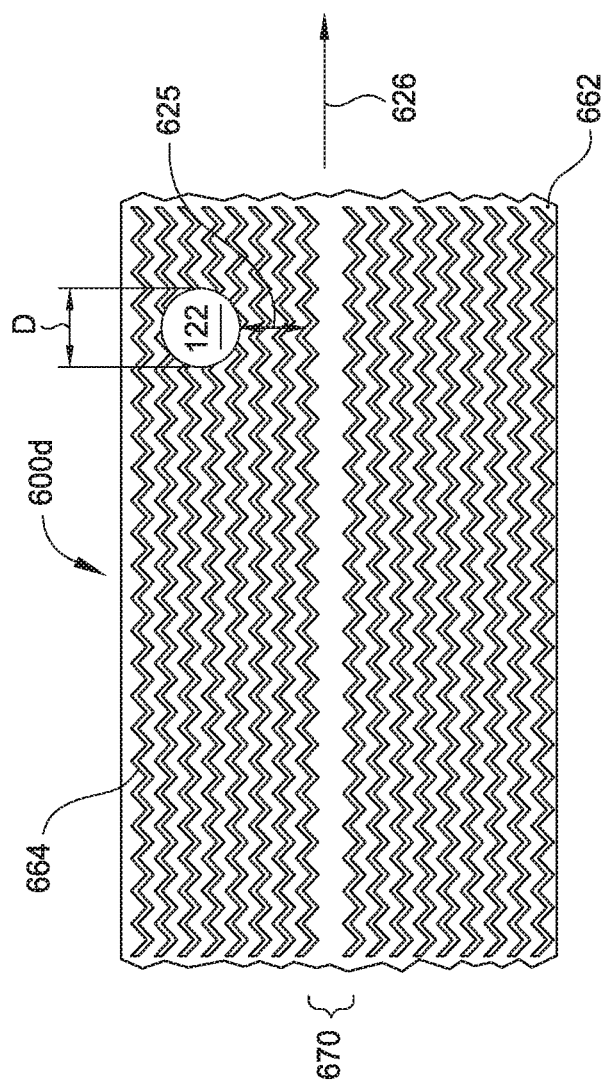
FIG. 6D is schematic top view of a polishing article design having textured surfaces that has grooves formed therein which are aligned relative to a desired direction according to one or more implementations described herein.

FIG. 6D is a schematic top view of a portion of a roll-to-roll type of an advanced polishing article 600d having a textured polishing surface 662 that includes an array of grooves 664 formed therein. In one implementation, the advanced polishing article 600d may form part of or be used in place of the advanced polishing article 123, the advanced polishing article 323, the advanced polishing article 400, or the advanced polishing article 500. The textured polishing surface 662 may be similar to the texture of textured polishing surface 412 of advanced polishing article 400 and textured polishing surface 512 of advanced polishing article 500. The grooves 664 are similar to grooves 532 of advanced polishing article 500. The array of grooves 664 of the advanced polishing article 600d include a sawtooth pattern of grooves 654 that are oriented parallel to the index axis 626 and perpendicular to the axis of movement 625. The grooves 654 extend along the length direction of the advanced polishing article 600d (e.g., parallel to the direction of travel). In one implementation, the grooves 664 have a groove spacing (measured center to center of adjacent grooves) greater than a width of each individual groove. The groove spacing of the grooves 664 is aligned in the width direction. In one implementation, the grooves 664 of the groove pattern have a width of about 0.060 inches and a groove spacing (center to center of adjacent grooves) of about 0.5 inches. In another implementation, the width of each individual groove 664 is greater than the groove spacing between adjacent grooves.

In some implementations of the advanced polishing article 600*d*, one or more rows of grooves 664 that are aligned along the index axis 626 are spaced apart to provide a path 670 that is parallel to the index axis 626. In one example, as shown in FIG. 6D, the path 670 is positioned at the center of the advanced polishing article 600*d* such that no grooves are positioned at the center of the advanced polishing article 600*d*. The path 670 provides an optical pathway for the optical sensing device 220 to view the substrate 122 without obstructions from features within the advanced polishing article 600*d* (e.g., grooves, surface topography). In some implementations, this path 670 has a width that allows the inspection beam, which is provided by the optical end point detector, to only pass through a portion of the path 670, and thus not pass through a portion of a groove, as the advanced polishing article 600*d* is incrementally indexed along the index axis 626. In one example, this path 670 has a width of between about 1 mm to about 5 mm. In some implementations, where optical pathway is not present in the advanced polishing article, the groove spacing may be consistent across the surface of the advanced polishing article 600*d*. In this case, where the optical inspection beam provided by the optical end point detector passes through regions of the advanced polishing article 600*d* and also through one or more portions of a groove as the advanced polishing article is incrementally indexed during the different phases of a polishing sequence, the controller may be programmed to index the pad a variable distance such that the inspection beam always passes through a region of the advanced polishing article 600*d* when a substrate is being polished to avoid variations in the intensity of the inspection beam due to, for example, variations in the material stack-up introduced by the presence or lack of presence of a groove.

Figure 6E:
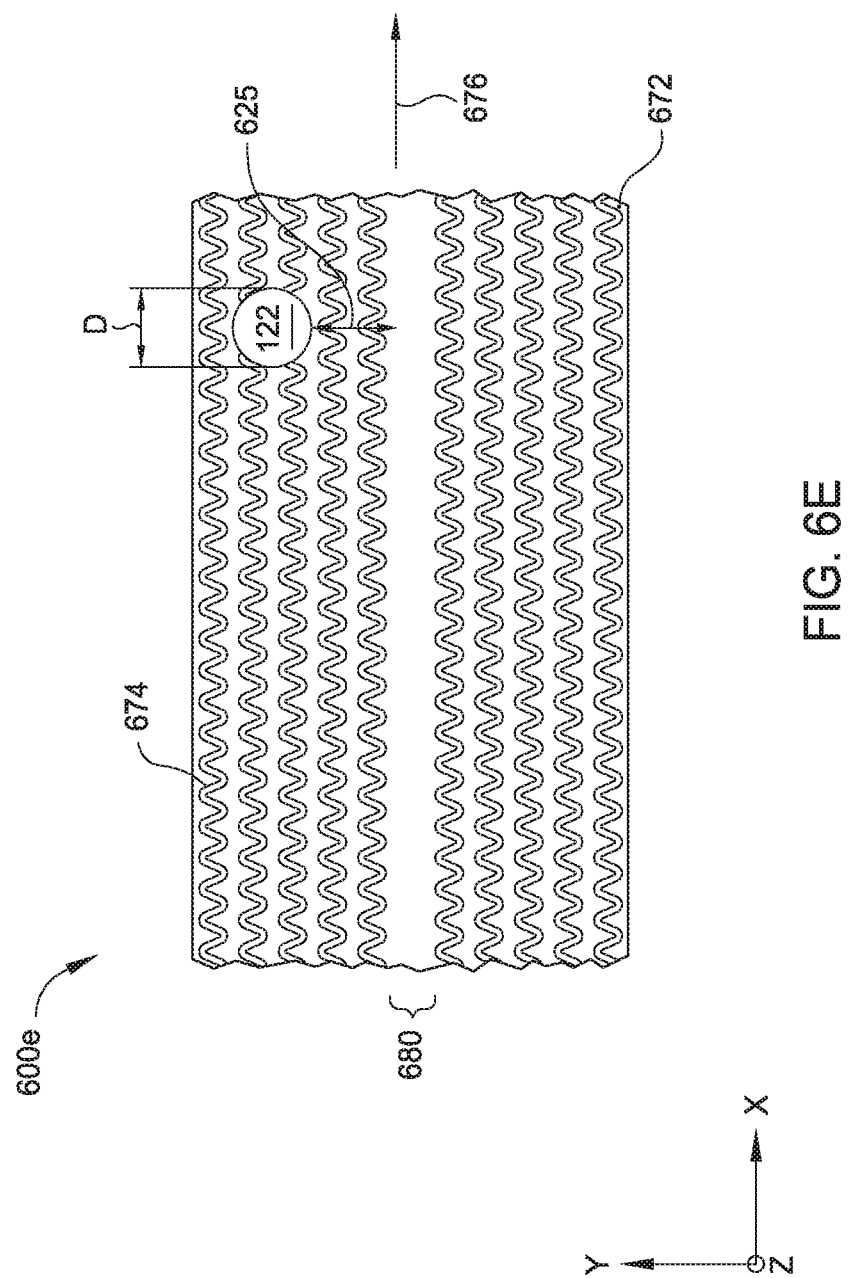
FIG. 6E is schematic top view of a polishing article design having textured surfaces that has grooves formed therein which are aligned relative to a desired direction according to one or more implementations described herein.

FIG. 6E is a schematic top view of a portion of a roll-to-roll type of an advanced polishing article 600*e* having a textured polishing surface 672 that includes an array of grooves 664 formed therein. In one implementation, the advanced polishing article 600*e* may form part of or be used in place of the advanced polishing article 123, the advanced polishing article 323, the advanced polishing article 400, or the advanced polishing article 500. The textured polishing surface 672 may be similar to the texture of textured polishing surface 412 of advanced polishing article 400 and textured polishing surface 512 of advanced polishing article 500. The grooves 674 are similar to grooves 532 of advanced polishing article 500. The array of grooves 674 of the advanced polishing article 600*e* form a sinusoidal pattern of grooves 674 that extend parallel to the index axis 676 and parallel to the length direction of the advanced polishing article 600*e*. In some implementations, a period of the sinusoid is one to 5 times the amplitude of the sinusoid. The grooves 674 extend along the length of the advanced polishing article 600*e* (e.g., parallel to the direction of travel (e.g., direction A in FIG. 4C)). In one implementation, the grooves 674 have a groove spacing (measured center to center of adjacent grooves) greater than a width of each individual groove. In one implementation, the grooves 674 of the groove pattern have a width of about 0.060 inches and a groove spacing (center to center of adjacent grooves) of about 0.5 inches. In another implementation, the width of each individual groove 674 is greater than the groove spacing between adjacent grooves. In some implementations, the rows of grooves at the centerline along the index axis 676 are spaced apart to have a path 680 down the center of the advanced polishing article 600*e* with no grooves. In some implementations, this path 680 has a width of between about 1 mm to about 5 mm. This path 680 provides an optical pathway for the optical sensing device 220 to view the substrate 122. In some implementations, where optical endpoint is not used, groove spacing may be consistent across the surface of the advanced polishing article 600*e*.

Figure 6F:
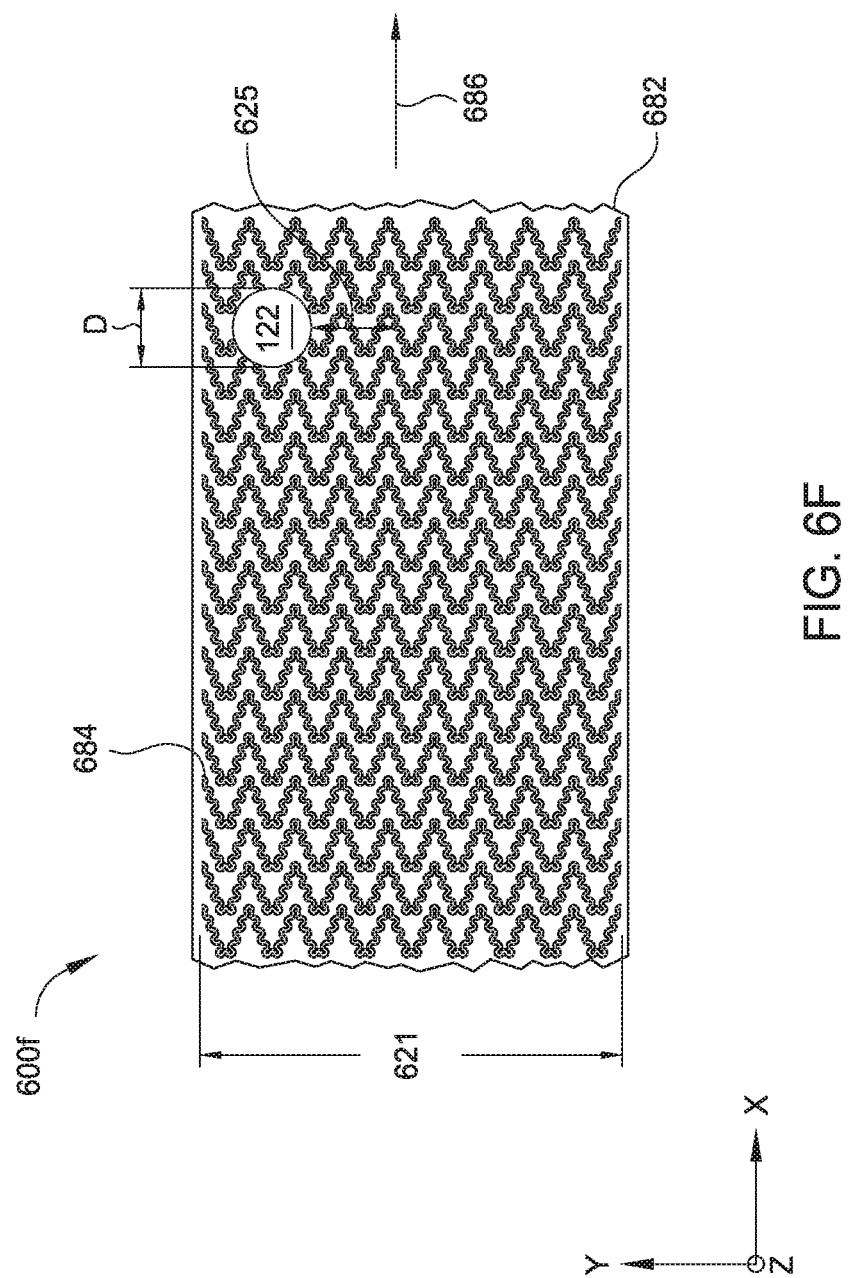
FIG. 6F is schematic top view of a polishing article design having textured surfaces that has grooves formed therein which are aligned relative to a desired direction according to one or more implementations described herein.
Figure 6G:
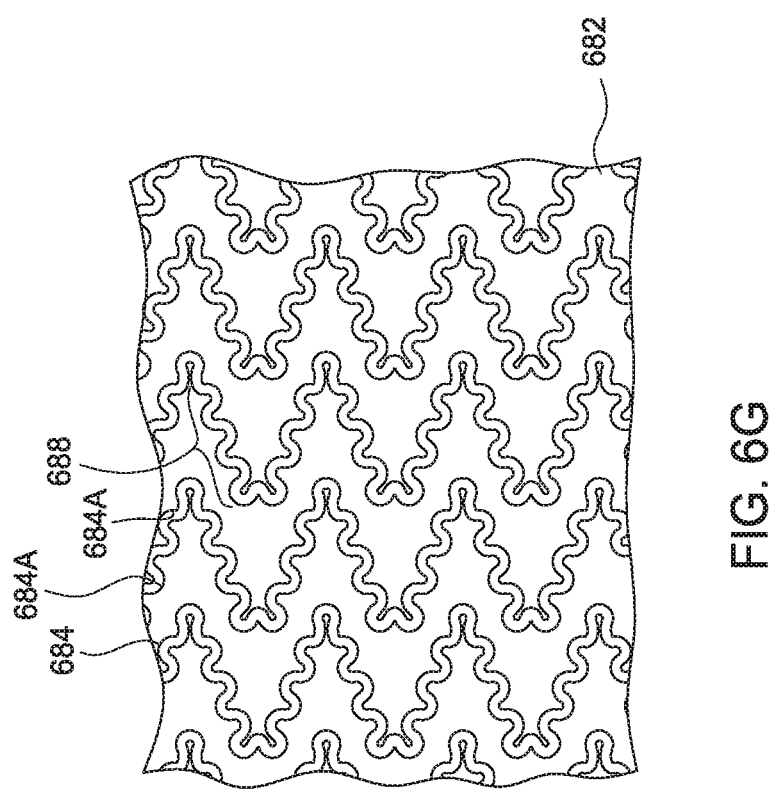
FIG. 6G is an exploded schematic top view of a portion of the polishing article of FIG. 6F according to one or more implementations described herein.

FIG. 6F is a schematic top view of a portion of a roll-to-roll type of an advanced polishing article 600*f* having a textured polishing surface 682 that includes an array of grooves 684 formed therein. FIG. 6G is an exploded schematic top view of a portion of the advanced polishing article 600*f* of FIG. 6F according to one or more implementations described herein. In one implementation, the advanced polishing article 600*f* may form part of or be used in place of the advanced polishing article 123, the advanced polishing article 323, the advanced polishing article 400, or the advanced polishing article 500. The textured polishing surface 682 may be similar to the texture of textured polishing surface 412 of advanced polishing article 400 and textured polishing surface 512 of advanced polishing article 500. The grooves 684 of the advanced polishing article 600*f* form a sawtooth pattern of grooves 684 that extend perpendicular to the index axis 686 and length direction. However, unlike the grooves 654 of the advanced polishing article 600*c*, each edge 688 of each of the grooves 684 does not have any flat or straight edges but rather the edges 688 has one or more curved shapes. The grooves 684 are at least partially defined by sidewalls 684A that extend from the polishing surface 682, which are typically arranged perpendicular to the polishing surface 682 as illustrated in FIG. 6G. The edges 688, which are formed on either side of a groove 684, are formed at the junction of the sidewalls 684A of the groove 684 and the polishing surface 682. In one configuration, the grooves 684 comprise sidewall 684A that are each positioned adjacent to and extend from the polishing surface 682 and have a length that extends within a plane (e.g., X-Y plane FIG. 6F) that is parallel to the polishing surface 682, wherein the sidewalls are non-straight and thus are curved. In some implementations, each edge 288 is described as having a sinusoidal design that is superimposed on the sawtooth pattern of grooves 654. It has been found by the inventors that the leading edge of a substrate, which is being polished, will collide with the edge of a transversely oriented groove that have flat or straight edges, which disrupts the polishing process and can generate particles or scratches on the substrate. However, the grooves 684 that include the curved surfaces, or edges that when interpolated into an edge of the grooves appears to be curved to the edge of the substrate, will include portions of the groove that act as a "lead-in" for the leading edge of the moving substrate, and thus will prevent the leading edge of the substrate from colliding with an edge of the groove (e.g., trailing edge of the groove relative the direction of motion of the substrate during polishing) during processing.

In some embodiments, the grooves 684 extend along the width direction of the advanced polishing article 600*f* (e.g., perpendicular to the direction of travel). In one implementation, the grooves 684 have a groove spacing (measured center to center of adjacent grooves) greater than a width of each individual groove. In one implementation, the grooves 684 of the groove pattern have a width of about 0.060 inches and a groove spacing (center to center of adjacent grooves) of about 0.5 inches. In another implementation, the width of each individual groove 684 is greater than the groove spacing between adjacent grooves. In some implementations, the rows of grooves at the centerline along the index axis 686 are spaced apart to have a path (not shown), similar to path 680, down the center of the advanced polishing article 600*f* with no grooves. In another embodiment, the grooves 684 are oriented so that the sawtooth pattern of grooves extends along a direction that is parallel to the index axis 686.

FIG. 7A is a flow chart depicting a method 700 of polishing using an advanced polishing article, according to one or more implementations described herein. The advanced polishing article may be any of the advanced polishing articles described herein (e.g., advanced polishing article 123, advanced polishing article 323, advanced polishing article 400, or advanced polishing article 500). The method may be performed with any of the polishing modules depicted in FIGS. 1-3 using any of the aforementioned advanced polishing articles. However, for clarity of discussion FIGS. 7B-7C illustrate a roll-to-roll configuration that can be used to perform one or more of the process steps illustrated in FIG. 7A.

FIGS. 7B-7C are schematic sectional views of a version of a platen assembly 132 of the polishing process module of FIG. 1 in different configurational positions. The modified version of the platen assembly 132 shown in FIGS. 7B and 7C, which is referred to herein as platen assembly 732, is similar to the platen assembly 132 shown in FIG. 2 and thus like components which are described above have similar reference numerals and thus will not be re-described herein. The platen assembly 732 generally includes a platen support assembly 755 and a polishing article control assembly 756 that is used to perform a polishing process on a substrate that is urged against the textured polishing surface 412 of the advanced polishing article 123 by use of a carrier head 308. The platen support assembly 755 generally includes a platen interface support 774, a mounting plate 772 and rotational supporting elements 773 that are used to support the platen interface element 240 and the subplate 238 of the platen interface assembly 226. The platen interface support 774 and mounting plate 772 are similar to the subplate 238 described above, and thus are structural elements that include similar features and fluid providing elements that are coupled to the fluid management system 232. The rotational supporting elements 773 generally include one or more bearings or similar devices that are able to support the load(s) applied by the carrier head 308 (FIG. 7B) to the platen support assembly 755 while allowing the platen support assembly 755 and polishing article control assembly 756 components to be rotated about a rotational axis 235 by the rotary actuator 228.

The polishing article control assembly 756 generally includes a pad supporting element 758 that is configured to structurally support and retain the supply roll 254, motor 222, upper guide members 204 and 214, take-up roll 252, motor 224 and the length of the advanced polishing article 123 that is positioned in each of the rolls 252, 254 and that extends therebetween. As shown in FIGS. 7B and 7C the actuator 771 is configured to raise and lower the pad supporting element 758, and the components that it supports, relative to the mounting plate 772. The actuator 771 will cause the advanced polishing article 123 to then be separated from the upper surface of the platen interface element 240 to allow the advanced polishing article 123 to be indexed a desired distance by the motors 222 and 224. As discussed above, in some configurations, the actuator 771 is configured to apply a load that is at least as large as the force required to break the adhesive bond formed between a releasable bonding layer 455 within the platen interface element 240 and a surface of the top pad (e.g., top pad 410 or top pad assembly 510) of the advanced polishing article 123 to allow a gap 425 to be formed. The motors 222 and 224 are each sized to generate a holding force that will prevent the advanced polishing article 123 from being unwound from the take-up roll 252 and supply roll 254 when the actuator 771 separates the top pad of the advanced polishing article 123 from the platen interface element 240 during operation 740, which is discussed further below.

Referring back to FIG. 7A, at operation 710 a substrate 122 is urged toward an advanced polishing article 123. The polishing article 123 includes a polymeric sheet having a textured polishing surface (e.g., textured polishing surface 412 or 512) including, a microtexture (e.g., plurality of discrete elements) formed from the polymeric sheet and extending upward from the polishing surface. In one implementation, the microtexture is formed by a desirable formation technique (e.g., embossing). In some implementations, the polymeric sheet further includes a plurality of macro-features (e.g., grooves) formed in the polishing surface. In one implementation, as shown in FIG. 7B, the polymeric sheet is disposed between a supply roll and a take-up roll (e.g., supply assembly 156 and take-up assembly 158 of platen assembly 132) and the substrate is urged toward the advanced polishing article 123 by the carrier head 308 (FIG. 7B). In one implementation, the polymeric sheet is disposed on a supply roll. In one implementation, the polymeric sheet comprises a length of about 20 feet to about 100 feet.

The substrate 122 may be a silicon-based material or any suitable insulating materials or conductive materials as needed. In one implementation, the substrate 122 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 122 may have various dimensions, such as 200 mm, 300 mm, 450 mm or other diameter wafers, as well as, rectangular or square panels. Unless otherwise noted, implementations and examples described herein are conducted on substrates with a 200 mm diameter, a 300 mm diameter, or a 450 mm diameter substrate.

A polishing slurry is delivered to the textured polishing surface. Any suitable polishing slurry compatible with the materials polished may be used. In one implementation, the polishing slurry includes at least one of oxidizers, passivation agents, pH buffers, metal complexing agents, surfactants and abrasives. In one implementation, the polishing slurry is delivered to the textured polishing surface via a fluid nozzle (e.g., fluid nozzle 154). In some implementations, the substrate 122 contacts the textured polishing surface after delivery of the polishing slurry. In some implementations, the substrate 122 contacts the textured polishing surface prior to delivery of the polishing slurry. In some implementations, the substrate 122 contacts the textured polishing surface during delivery of the polishing slurry.

The substrate 122 may be urged against the textured polishing surface with a force of less than about 10 pounds per square inch (psig) (e.g., less than about 9 psig, less than about 7 psig, less than about 5 psig, or less than about 2.5 psig). In one implementation, the force is between about 1 psig and 6 psig, for example, about 1.8 psig.

Next, at operation 720, relative motion is provided between the substrate 122 and the textured polishing surface. In one implementation, the carrier head 308 is rotated at between about 50-100 revolutions per minute, for example, between about 30-60 revolutions per minute, while the textured polishing surface is rotated by use of the rotary actuator 228 at between about 50-100 revolutions per minute, for example, between about 7-35 revolutions per minute. In some implementations, where a linear polisher is used, the platen, the supply roll and the take-up roll are rotated relative to the substrate 122 about a Z-axis.

At operation 730, material is removed from the surface of the substrate 122 by applying a pressure to a surface of the substrate 122, such that the substrate 122 is urged against the surface of the polymeric sheet. The material may be a conductive material (e.g., copper), a dielectric material (e.g., oxide or nitride containing), or both a conductive material and dielectric material. The advanced polishing articles described herein have demonstrated little impact on polishing performance when slurry flow rates are below 100 ml/min, versus conventional polyurethane polishing articles that typically have slurry flow rates that range from 100-300 ml/min with 150 ml/min being very common value.

At operation 740, in some implementations where a linear polishing process is used, the polymeric sheet is advanced relative to the platen interface assembly 420 before, during and/or after removing material from the substrate 122 by use of an actuator coupled to the supply roll and/or an actuator coupled to the take-up roll. In one implementation, the advancing comprises advancing the polymeric sheet an incremental difference between about 1 mm and about 5 mm relative to the platen interface assembly 420.

In one embodiment of method 700, at operation 740 the polymeric sheet is only advanced (e.g., indexed) relative to the platen before and/or after removing material from one or more substrates 122. This version of operation 740 is generally required in cases where a releasable bonding layer 455 is disposed between and in contact with the rear surface of the polymeric sheet (e.g., top pad 410) and a surface of the platen interface assembly 420 due to the high shear force that is required to overcome the adhesion and/or weak adhesive properties of the materials at the interface between the surface of releasable bonding layer 455 and the polymeric sheet. Even at moderate to low adhesive bond strengths the force required to cause movement between the polymeric sheet and the platen interface assembly 420 during a polishing process, and/or while the polymeric sheet is in contact with the releasable bonding layer 455, will either cause the thin advanced polishing article 123 to yield and/or tear and also greatly increase the size and cost of the motors 222 and 224 required to index the polymeric sheet. Therefore, during operation 740, after the material removal process of operations 710-730 are completed the substrate 122 and carrier head 308 are removed from the surface of the polymeric sheet of the advanced polishing article 123 and then transferred to another processing station within the polishing module 106 (FIG. 1). The portion of the polymeric sheet that is in contact with the top surface of the platen interface assembly 420 is then separated from the top surface of the platen interface assembly 420 to form a gap 425, as illustrated in FIG. 7C. The gap 425 is formed by causing the pad supporting element 758 to move relative to the surface of platen interface assembly 420 by use of the actuator 771. The polymeric sheet is then advanced an incremental distance relative to the platen interface assembly 420 by use of the actuator coupled to the supply roll and/or the actuator coupled to the take-up roll. The polymeric sheet is then brought back into contact with the platen interface assembly 420 by causing the actuator 771 to reposition the pad supporting element 758, and thus remove the gap 425. The material removal processes of operations 710-730 are then completed on at least one additional substrate 122 before operation 740 is completed again.

In some embodiments, the fluid management system 232 is configured to at least assist in the separation of the polymeric sheet (e.g., top pad 410) from the releasable bonding layer 455 by delivering a gas (e.g., nitrogen) at a positive pressure to the interface of the releasable bonding layer 455 and the polymeric sheet by use of the openings 242 and channels 234 formed in the platen interface assembly 420. In some embodiments, the fluid management system 232 is configured to cause the separation of the polymeric sheet from the releasable bonding layer 455 during operation 740, due to the delivery of a gas to the interface of the releasable bonding layer 455 and the polymeric sheet. One will note that a failure to completely separate the polymeric sheet from the releasable bonding layer 455 will inhibit the ability of the system to index the polymeric sheet.

The configuration of the pad supporting element 758 and rolls 252, 254 of the platen assembly 732 illustrated in FIGS. 7B-7C have an advantage over other configurations that require the advanced polishing article 123 to be lifted or repositioned relative to the platen interface assembly 420 and also the take-up roll 252 and the supply roll 254 to generate the gap 425, since the configuration illustrated in FIGS. 7B-7C does not require the advanced polishing article to be unwound from the take-up roll 252 and/or supply roll 254 and then rewound on the take-up roll 252 and/or supply roll 254 during operation 740. The process of unwinding a portion of the advanced polishing article 123 from the take-up roll 252 and/or supply roll 254 and then rewinding the advanced polishing article 123 onto the take-up roll 252 and/or supply roll 254 during operation 740 can create uncertainty in the desired relative position of the used and unused portions of the advanced polishing article 123 relative to a desired or previously known lateral position or point on the platen interface element 240, in the X-direction, when the polymeric sheet is brought back into contact with the platen interface assembly 420 to perform a subsequent polishing step.

Figure 7D:
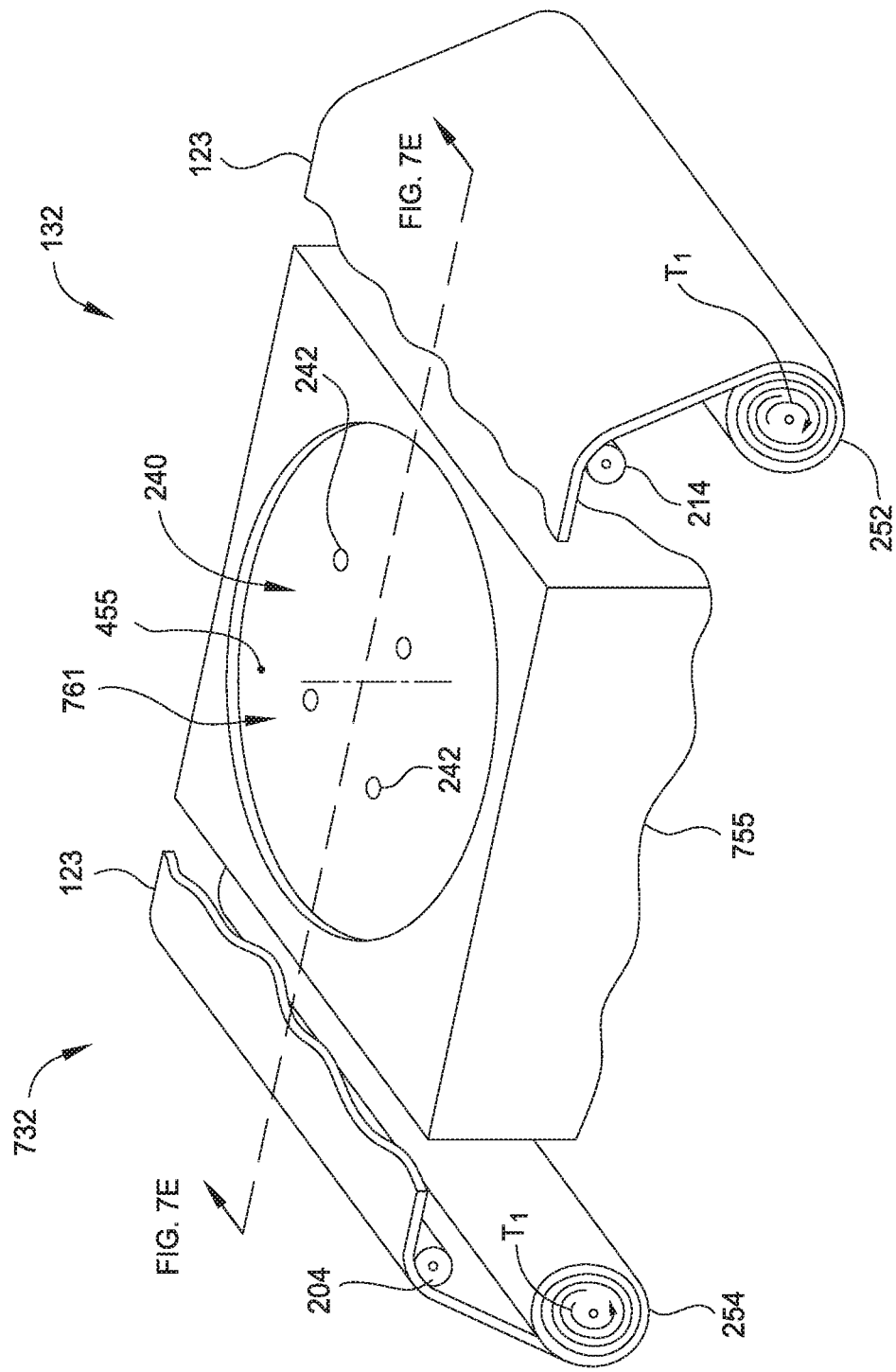
FIG. 7D is a schematic isometric view of a configuration of the processing station of the module of FIG. 1, according to one or more implementations disclosed herein.

FIG. 7D illustrates an alternate or further modified version of the platen assembly 732 described above, according to one or more implementations disclosed herein. In this configuration, the platen interface element 240 is recessed within the platen support assembly 755 to form and/or at least partially define a recessed region 761 over which the advanced polishing article 123 is disposed. FIGS. 7E and 7F are schematic side cross-sectional views of the processing station illustrated in FIG. 7D in two different configurational positions, according to one or more implementations disclosed herein. FIG. 7E illustrates a configuration of the platen assembly 732 in which the act of causing the carrier head 308 to urge the substrate 122 against the polishing surface 412 of the advanced polishing article 123 during operations 720 and 730 causes a portion of the advanced polishing article 123 to be positioned within the recessed region 765 and against the upper surface of the platen interface element 240. Therefore, in one embodiment of the platen interface element 240, when the substrate 122 is pressed against the polishing surface 412, the rear surface 414 of the advanced polishing article 123 is pressed against at least a portion of the top surface 455A of the releasable bonding layer 455 that defines a surface of the recessed region 765. The distance 762 that the top surface 455A of the releasable bonding layer 455 is recessed below the top surface 763 of the platen support assembly 755 can be equal to about 0.010 inches to about 0.25 inches. In some implementations, the distance 762 is sized to be between about the thickness "T" of the pad body 430 and about ten times the thickness "T" of the pad body 430.

In another embodiment of method 700, at operation 740 the polymeric sheet can be advanced (e.g., indexed) relative to the alternate or modified version of the platen assembly 732 before and/or after removing material from one or more substrates 122 by use of the motors 224 and 222 attached to the take-up roll 252 and supply roll 254, respectively. As shown in FIG. 7F, by applying a torque to the take-up roll 252 and the supply roll 254 in opposing directions a tensile force $F_3$ is supplied to the advanced polishing article 123 which causes the rear surface 414 of the advanced polishing article 123 to be separated from the top surface 455A of the releasable bonding layer 455 as the "slack" in the advanced polishing article 123 is removed, and thus allow the gap 425 to be formed. Once the advanced polishing article 123 is separated from the top surface 455A of the releasable bonding layer 455 the advanced polishing article 123 can then be advanced a desired distance. In some embodiments, the fluid management system 232 is configured to at least assist in the separation of the polymeric sheet (e.g., top pad 410) from the releasable bonding layer 455 by delivering a gas (e.g., nitrogen) at a positive pressure to the interface of the releasable bonding layer 455 and the polymeric sheet by use of an array of openings 242 (FIG. 7D) formed in the recessed platen interface assembly 420. In some configurations, as shown in FIG. 7G, a compliant elastomeric seal 759 is disposed at or near an edge 764 of the recessed region 761 of the platen support assembly 755 to allow a seal to be formed between the platen support assembly 755 and the rear surface 414 of the advanced polishing article 123. The seal formed between the platen support assembly 755 and the rear surface 414 of the advanced polishing article 123 will allow a controllable separating pressure to be formed between the rear surface 414 of the advanced polishing article and the upper top surface 455A of the releasable bonding layer 455 when a gas is provided to the interface of the releasable bonding layer 455 and the polymeric sheet during operation 740.

Figure 8:
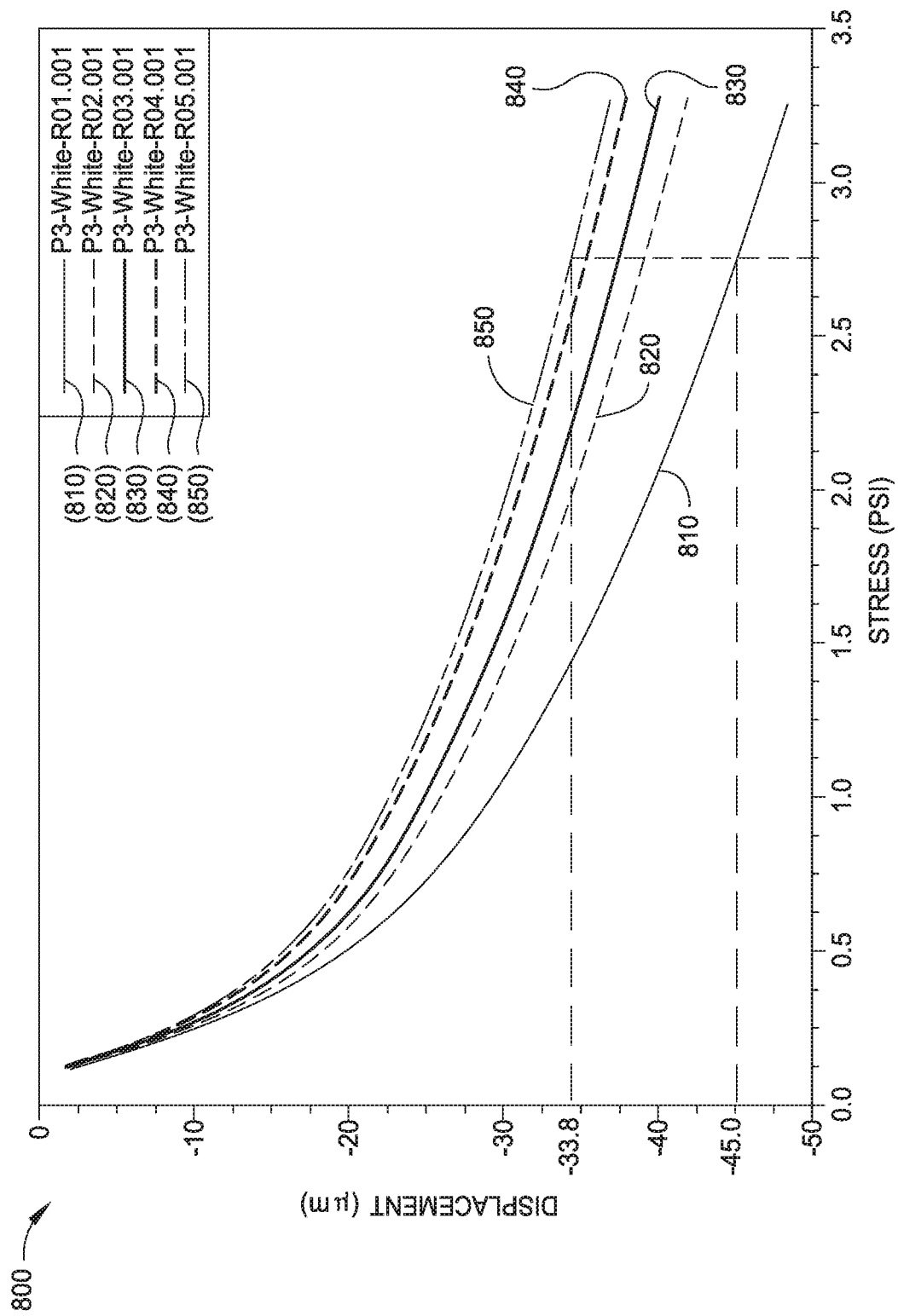
FIG. 8 illustrates a plot of displacement versus stress for materials that can be used in the advanced polishing article, according to one or more implementations described herein.

FIG. 8 illustrates a plot 800 of displacement versus stress for platen interface materials that can be used in the advanced polishing article, which is measured over a number of stress cycles, according to one or more implementations described herein. The plot 800 illustrates a plurality of displacement versus stress curves 810-850 that were measured over a period of time for a platen interface (e.g., the white fiber component) used with an advanced polishing article. Curve 810 illustrates the displacement versus stress measured by applying a constant force from 0.2 psi to 4.5 psi, when the polishing article is new. One will note that curve 810 has a higher displacement versus stress across the testing load range from about 0.2 psi to 3.5 psi than the same pad after multiple use cycles. Curve 820, 830, 840, and finally curve 850 illustrates the displacement versus stress measured by applying the same constant force as applied to form curve 810 using the platen interface materials, as an increased number of stress cycles are performed. In this example, one can see that as the number of cycles increases the change in the displacement versus stress measured in the platen interface material decreases. It is believed that the small relative change in the displacement versus stress curve over time found when using the platen interface material described herein can provide a significant advantage over conventional polishing articles and platen interfaces in the form of a higher process repeatability and/or reduced process drift. The example illustrated in FIG. 8, which includes a white fiber platen interface having a thickness of about 0.014 inches, will only include about a 33% change in deflection versus stress at an application stress of about 2.75 psi over the life of the platen interface material. It is believed that this will be a significant difference for platen interfaces used in conventional polishing articles (e.g., Dow® IC1010™ pad) that may have orders of magnitude difference in the percent change over the life of conventional polishing articles.

Figure 9:
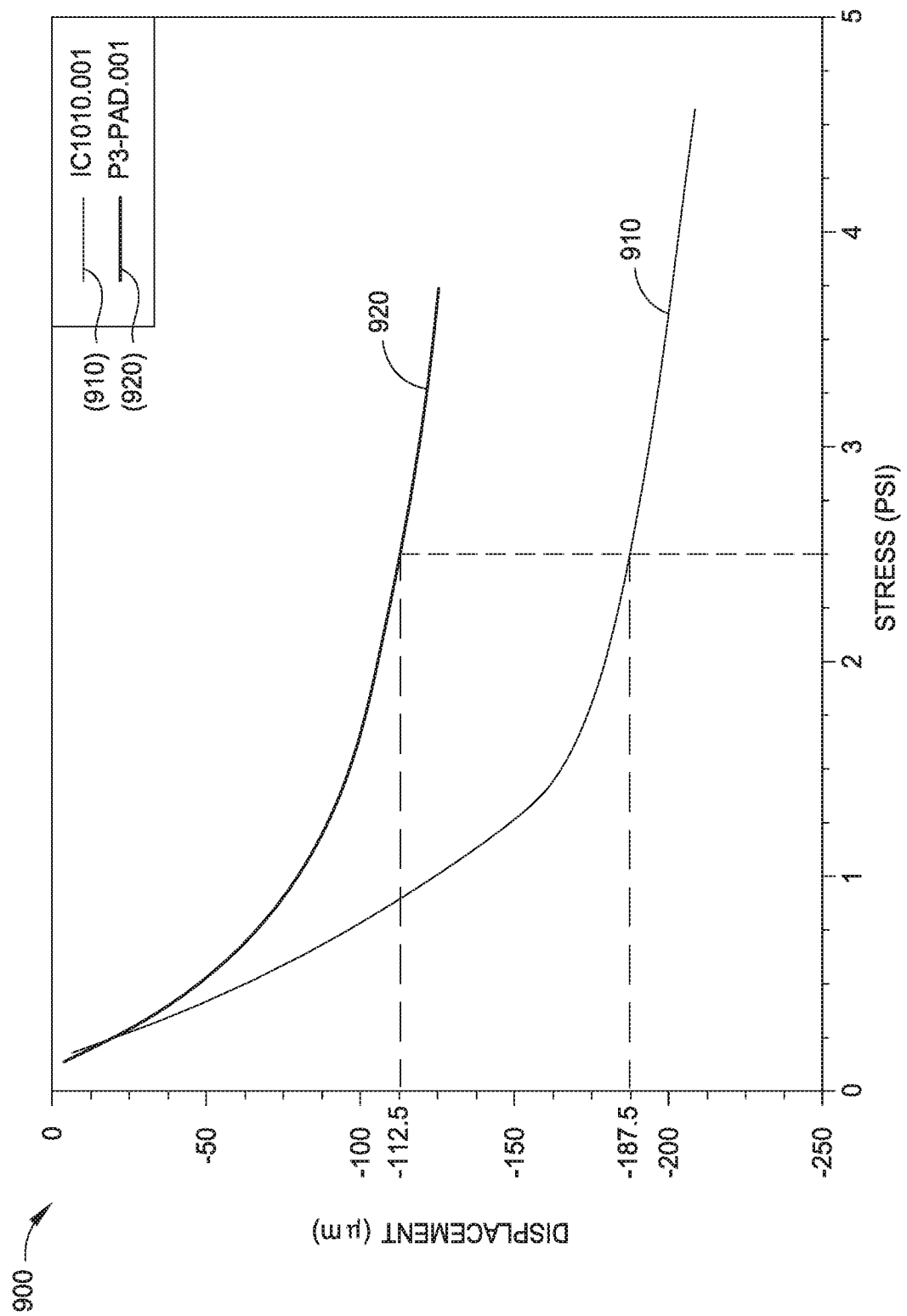
FIG. 9 illustrates another plot of displacement versus stress for a material that can be used in the advanced polishing article according to one or more implementations described herein versus a material used in currently available polishing articles.

FIG. 9 illustrates another plot 900 of displacement versus stress for a platen interface material that can be used in the advanced polishing article according to one or more implementations described herein versus a material used in currently available conventional polishing articles. Trace 910 represents displacement as a function of stress for a material used in a commercially available polishing article. Trace 920 represents displacement as a function of stress of a white fiber platen interface that can be used with the advanced polishing articles described herein. The deflection of the polishing article stack of IC1010 with a foam containing platen interface deflects about 187.5 microns at about 2.75 psi and the advanced polishing article deflects about 112.5 microns, or about a 186% change in deflection at the loading condition. It is believed that the reduced deflection versus stress is a significant difference from a conventional polishing articles (e.g., Dow® IC1010™ pad), and may help improve the stability of the overall CMP polishing process. The CMP polishing process results when using the "stiffer" advanced polishing article is unexpected since it goes against conventional theories that try to make the polishing article laterally compliant to resolve dishing and long order planarity issues commonly found when polishing oxide and metal layers formed on semiconductor substrates today.

Therefore, some of the benefits of the present disclosure include a reduction in defects measured on wafers post CMP. The defects measured on wafers post CMP are negatively impacted by pad conditioning debris and possibly by material from the diamond disk (less frequently). The advanced polishing articles described herein do not require abrasive diamond disk conditioning yielding a corresponding reduction in wafer defects. In addition, use of the advanced polishing articles described herein lead to a reduction in the amount of polishing slurry used during the polishing process. On typical polyurethane polishing articles, concentric rings are cut into the polishing article surface on an approximately 3 millimeter pitch. These grooves retain slurry and capture pad debris from pad conditioning. When the conventional polishing pad is rinsed, the rinse water flushes the debris from the pad grooves. However, some water remains in the grooves, which may contribute to an initial dilution of the polishing slurry as the next wafer polishing step initiates. In one implementation described herein, the advanced polishing article is a single layer polymeric sheet that has no grooves and thus no pad debris and no potential for slurry dilution from residual water. In another implementation, the advanced polishing article is formed from at least one or more polymeric sheets that have one or more grooves, an overall thickness between about 0.001 inches to about 0.020 inches, and a polishing surface texture that has an average height "h" from about 1 micron to about 50 microns, such as about 5 to 10 microns. In one implementation described herein, the advanced polishing article has a double layer top pad having holes in the top layer of the double layer pad.

Additional benefits of some implementations of the present disclosure include improved endpoint detection. In some polishing processes, endpoint detection is used to measure properties based on changes in the surface of the substrate during polishing. Currently, these endpoint techniques use complex optical endpoint concepts for process control. Since current stacked polyurethane polishing articles are inherently opaque, these endpoint techniques typically monitor the surface of the substrate during polishing through a transparent window or windows installed in the polyurethane polishing article surface. In some implementations of the present disclosure, the polymeric material of the advanced polishing article is optically transparent allowing optical monitoring of the surface of the substrate during polishing using current endpoint hardware. In some implementations, the surface of the polymeric sheet has embossed regions and non-embossed regions specifically for the optical endpoint hardware to monitor the surface of the substrate during polishing.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present invention, other and further implementations of the invention may be devised without departing from the basic scope thereof, and the scope thereof is determined by the claims that follow.

The invention claimed is:

1. A polishing article, comprising a polymeric sheet that comprises:
   a thickness that is defined between a polishing surface and an opposing bottom surface;
   a length that extends in a first direction that is substantially parallel to the polishing surface;
   a width that extends in a second direction, which is substantially parallel to the polishing surface and is perpendicular to the first direction, wherein the width is at least two times smaller than the length;
   a solid polymeric material that is substantially pore free;
   a plurality of discrete elements that are formed on the polishing surface; and
   an array of grooves that are formed in the polishing surface,
     wherein the array of grooves are aligned relative to the first direction or the second direction,
     wherein the discrete elements have:
       a feature span of less than 40 μm; and
       an arithmetical mean height (Sa) from 2 to 7 μm, and
     wherein the opposing bottom surface includes a surface roughness that has an arithmetical mean height (Sa) from 2 micro-inches (0.05 micrometers) to 200 micro-inches (5.08 micrometers).

2. The polishing article of claim 1, wherein each of the grooves in the array of grooves extend from the polishing surface to a depth below the polishing surface, and the thickness is less than or equal to about 0.48 mm.

3. The polishing article of claim 1, wherein the polymeric sheet comprises a material selected from a group consisting of polypropylene and polytetrafluoroethylene (PTFE).

4. The polishing article of claim 1, further comprising a releasable bonding layer that is disposed on the opposing bottom surface, and the releasable bonding layer has an interface surface that is on a side of the releasable bonding layer that is opposite to the opposing bottom surface, wherein the interface surface has a static friction coefficient of greater than 1.51, and wherein the static friction coefficient is measured by urging a surface of an object that has an arithmetical mean height (Sa) of 200 micro-inches (5.08 micrometers) against the interface surface.

5. The polishing article of claim 1, wherein the array of grooves extend from the polishing surface toward the opposing bottom surface, and the grooves define a repeating groove pattern in the polishing surface.

6. The polishing article of claim 1, wherein the array of grooves extend from the polishing surface toward the opposing bottom surface, and the grooves comprise a first sidewall and a second sidewall that are each positioned adjacent to and extend from the polishing surface, and have a length that extends within a plane that is parallel to the polishing surface, wherein the first sidewall and the second sidewall are curved.

7. The polishing article of claim 1, wherein the discrete elements formed in the polishing surface further comprise:
   an interfacial area ratio of 45% to 65%;
   an average peak density of 30 to 35 per one millimeter;
   a maximum peak height (Sp) of 30 to 50 μm; and
   a maximum pit height (Sv) of 30 to 80 μm.

8. The polishing article of claim 1, wherein the discrete elements formed in the polishing surface further comprise:
   an average peak density of 30 to 35 per one millimeter.

9. A polishing article, comprising:
   a polymeric sheet having a pad body that comprises:
   a solid polymeric material that is substantially pore free;
   a thickness that is defined between a polishing surface and
     an opposing bottom surface, and the thickness is less than about 0.46 mm; and
   a plurality of discrete elements that are formed in the polishing surface, wherein the discrete elements formed in the polishing surface have:
     a feature span of less than 40 μm; and
     an arithmetical mean height (Sa) from 2 to 7 μm, wherein the opposing bottom surface includes a surface roughness that has an arithmetical mean height (Sa) from 2 micro-inches (0.05 micrometers) to 200 micro-inches (5.08 micrometers).

10. The polishing article of claim 9, wherein the pad body comprises a material selected from a group consisting of polypropylene and polytetrafluoroethylene (PTFE).

11. The polishing article of claim 9, further comprising a releasable bonding layer that is disposed on the opposing bottom surface, and the releasable bonding layer has an interface surface that is on a side of the releasable bonding layer that is opposite to the opposing bottom surface, wherein the interface surface has a static friction coefficient of greater than 1.51, and wherein the static friction coefficient is measured by urging a surface of an object that has an arithmetical mean height (Sa) of 200 micro-inches (5.08 micrometers) against the interface surface.

12. The polishing article of claim 9, wherein the polymeric sheet further comprises a plurality of grooves that extend from the polishing surface to a depth within the pad body, and the grooves define a repeating groove pattern in the polishing surface.

13. The polishing article of claim 9, wherein the polymeric sheet further comprises a plurality of grooves extending from the polishing surface toward the opposing bottom surface, and the grooves comprise a first sidewall and a second sidewall that are each positioned adjacent to and extend from the polishing surface, and have a length that extends within a plane that is parallel to the polishing surface, wherein the first sidewall and the second sidewall are curved.

14. The polishing article of claim 9, wherein the discrete elements formed in the polishing surface further comprise:
an interfacial area ratio of 45% to 65%;
an average peak density of 30 to 35 per one millimeter;
a maximum peak height (Sp) of 30 to 50 µm; and
a maximum pit height (Sv) of 30 to 80 µm.

15. The polishing article of claim 9, wherein the discrete elements formed in the polishing surface further comprise:
an average peak density of 30 to 35 per one millimeter.

16. A polishing article, comprising:
a polymeric sheet that comprises:
- a thickness that is defined between a polishing surface and an opposing bottom surface;
- a length that extends in a first direction that is substantially parallel to the polishing surface;
- a width that extends in a second direction, which is substantially parallel to the polishing surface and is perpendicular to the first direction, wherein the width is at least two times smaller than the length;
- a solid polymeric material that is substantially pore free;
- a plurality of discrete elements that are formed on the polishing surface;
- an array of grooves that are formed in the polishing surface, wherein the array of grooves are aligned relative to the first direction or the second direction; and
- a releasable bonding layer that is disposed on the opposing bottom surface, and the releasable bonding layer has an interface surface that is on a side of the releasable bonding layer that is opposite to the opposing bottom surface, wherein the interface surface has a static friction coefficient of greater than 1.51, and wherein the static friction coefficient is measured by urging a surface of an object that has an arithmetical mean height (Sa) of 200 micro-inches (5.08 micrometers) against the interface surface.

17. The polishing article of claim 16, wherein each of the grooves in the array of grooves extend from the polishing surface to a depth below the polishing surface, and the thickness is less than or equal to about 0.48 mm.

18. The polishing article of claim 16, wherein the polymeric sheet comprises a material selected from a group consisting of polypropylene and polytetrafluoroethylene (PTFE).

19. The polishing article of claim 16, wherein the discrete elements formed in the polishing surface further comprise:
an interfacial area ratio of 45% to 65%;
an average peak density of 30 to 35 per one millimeter;
a maximum peak height (Sp) of 30 to 50 µm; and
a maximum pit height (Sv) of 30 to 80 µm.

20. The polishing article of claim 16, wherein the discrete elements formed in the polishing surface further comprise:
a feature span of 20 to 40 µm; and
an average peak density of 30 to 35 per one millimeter.

* * * * *